(12) United States Patent
Sugizaki

(10) Patent No.: US 11,387,272 B2
(45) Date of Patent: Jul. 12, 2022

(54) SEMICONDUCTOR DEVICE AND ELECTRONIC APPARATUS

(71) Applicant: SONY SEMICONDUCTOR SOLUTIONS CORPORATION, Kanagawa (JP)

(72) Inventor: Taro Sugizaki, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 170 days.

(21) Appl. No.: 16/960,540

(22) PCT Filed: Jan. 8, 2019

(86) PCT No.: PCT/JP2019/000130
§ 371 (c)(1),
(2) Date: Jul. 7, 2020

(87) PCT Pub. No.: WO2019/142687
PCT Pub. Date: Jul. 25, 2019

(65) Prior Publication Data
US 2021/0066356 A1    Mar. 4, 2021

(30) Foreign Application Priority Data

Jan. 22, 2018 (JP) ............................... JP2018-008111

(51) Int. Cl.
*H01L 27/146* (2006.01)

(52) U.S. Cl.
CPC ...... *H01L 27/1462* (2013.01); *H01L 27/1464* (2013.01); *H01L 27/14621* (2013.01);
(Continued)

(58) Field of Classification Search
CPC .......... H01L 27/1462; H01L 27/14621; H01L 27/14623; H01L 27/14645;
(Continued)

(56) References Cited

U.S. PATENT DOCUMENTS

| 2012/0057055 A1* | 3/2012 | Yokogawa | ........ H01L 27/14623 348/E9.002 |
| 2014/0084404 A1 | 3/2014 | Fukunaga | |

(Continued)

FOREIGN PATENT DOCUMENTS

| CN | 102403326 A | 4/2012 |
| CN | 106847839 A | 6/2017 |

(Continued)

OTHER PUBLICATIONS

International Search Report and Written Opinion of PCT Application No. PCT/JP2019/000130, dated Apr. 16, 2019, 08 pages of ISRWO.

*Primary Examiner* — Dao H Nguyen
(74) *Attorney, Agent, or Firm* — Chip Law Group

(57) ABSTRACT

The present technology relates to a semiconductor device and an electronic apparatus that are capable of improving the characteristics of a semiconductor device or an electronic apparatus that includes a pixel having a metallic filter and a pixel not having the metallic filter. A semiconductor device includes: a pixel unit in which a first pixel including a metallic filter and a second pixel not including the metallic filter are disposed adjacent to each other; and a reflected light reduction unit that reduces reflected light on a sidewall of the metallic filter at a boundary portion between the first pixel and the second pixel. The present technology can be applied to an image sensor that includes a narrowband pixel including a plasmon filter and a normal pixel including a color filter, for example.

18 Claims, 74 Drawing Sheets

(52) U.S. Cl.
CPC .. *H01L 27/14623* (2013.01); *H01L 27/14627* (2013.01); *H01L 27/14636* (2013.01); *H01L 27/14645* (2013.01)

(58) Field of Classification Search
CPC ........... H01L 27/14627; H01L 27/1464; H01L 27/1463; H01L 27/14607; H01L 27/14605; H01L 27/14643; G02B 5/20
USPC ........................................ 257/432
See application file for complete search history.

(56) References Cited

U.S. PATENT DOCUMENTS

| | | | | |
|---|---|---|---|---|
| 2014/0146207 A1* | 5/2014 | Yokogawa | ............. | H04N 5/378 257/432 |
| 2015/0144770 A1* | 5/2015 | Choi | ...................... | G02B 5/201 250/208.1 |
| 2016/0276394 A1* | 9/2016 | Chou | ................. | H01L 27/14636 |
| 2016/0284745 A1* | 9/2016 | Park | .................. | H01L 27/14627 |
| 2017/0160133 A1 | 6/2017 | Lin et al. | | |

FOREIGN PATENT DOCUMENTS

| | | |
|---|---|---|
| EP | 2428993 A2 | 3/2012 |
| JP | 2005-347708 A | 12/2005 |
| JP | 2008-210904 A | 9/2008 |
| JP | 2010-062417 A | 3/2010 |
| JP | 2012-059865 A | 3/2012 |
| JP | 2014-064196 A | 4/2014 |
| JP | 2016-164956 A | 9/2016 |
| JP | 2017-103445 A | 6/2017 |
| KR | 10-2012-0025973 A | 3/2012 |
| TW | 201225270 A | 6/2012 |
| TW | 201732242 A | 9/2017 |

\* cited by examiner

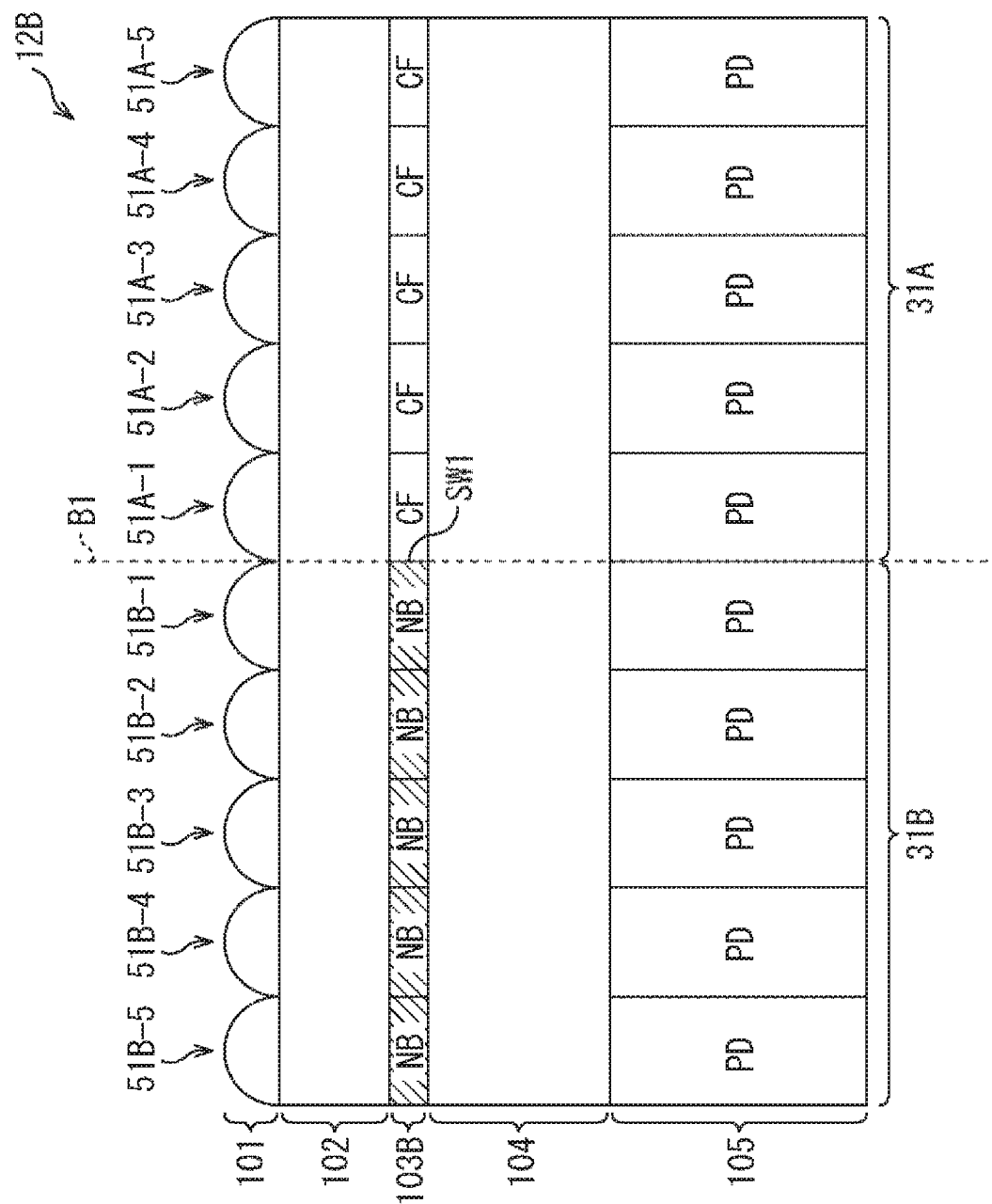

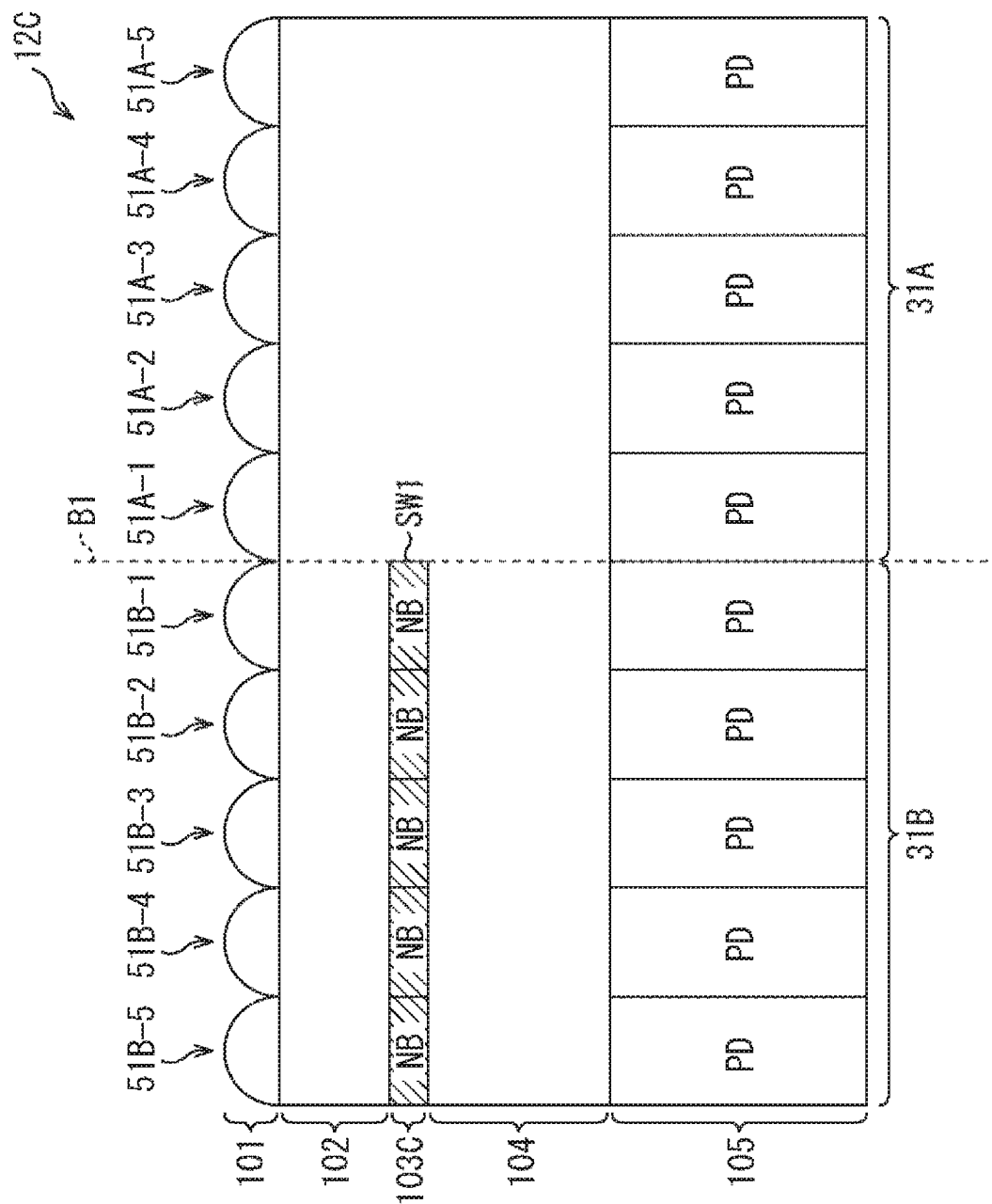

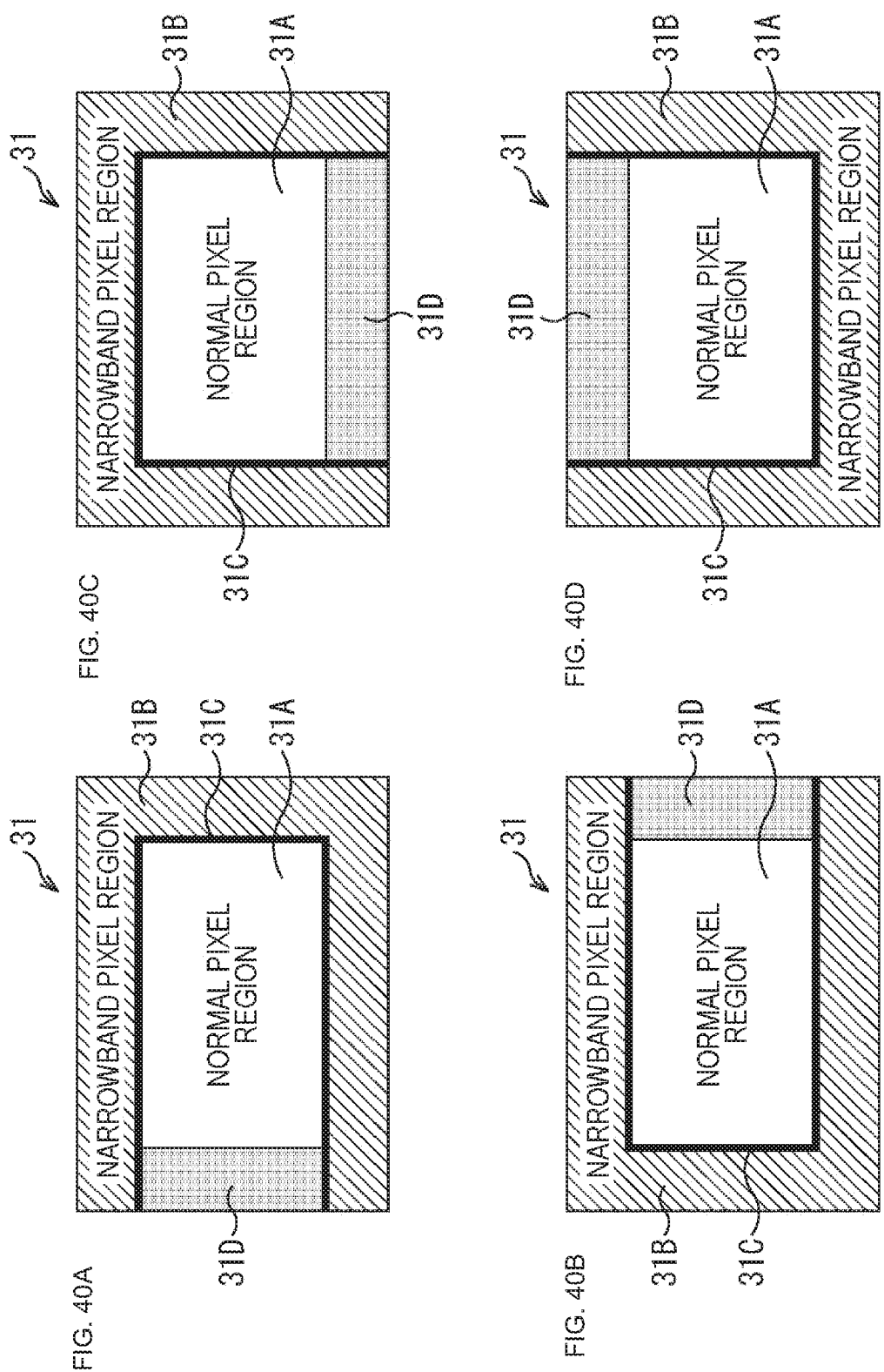

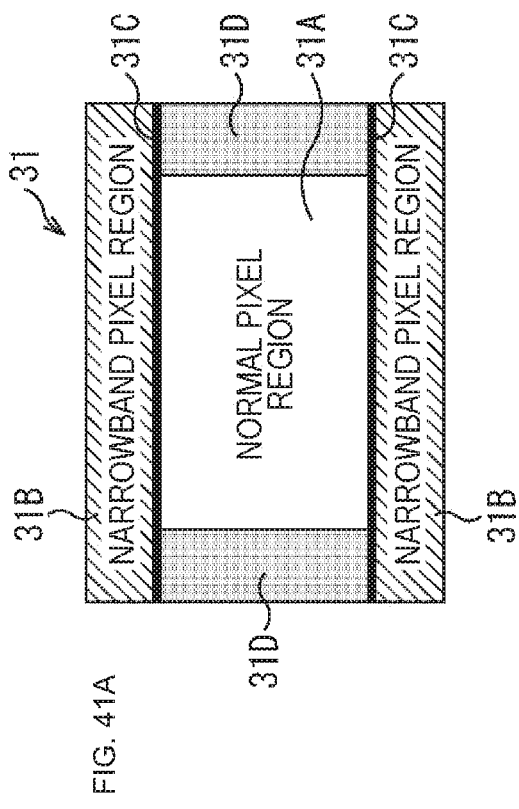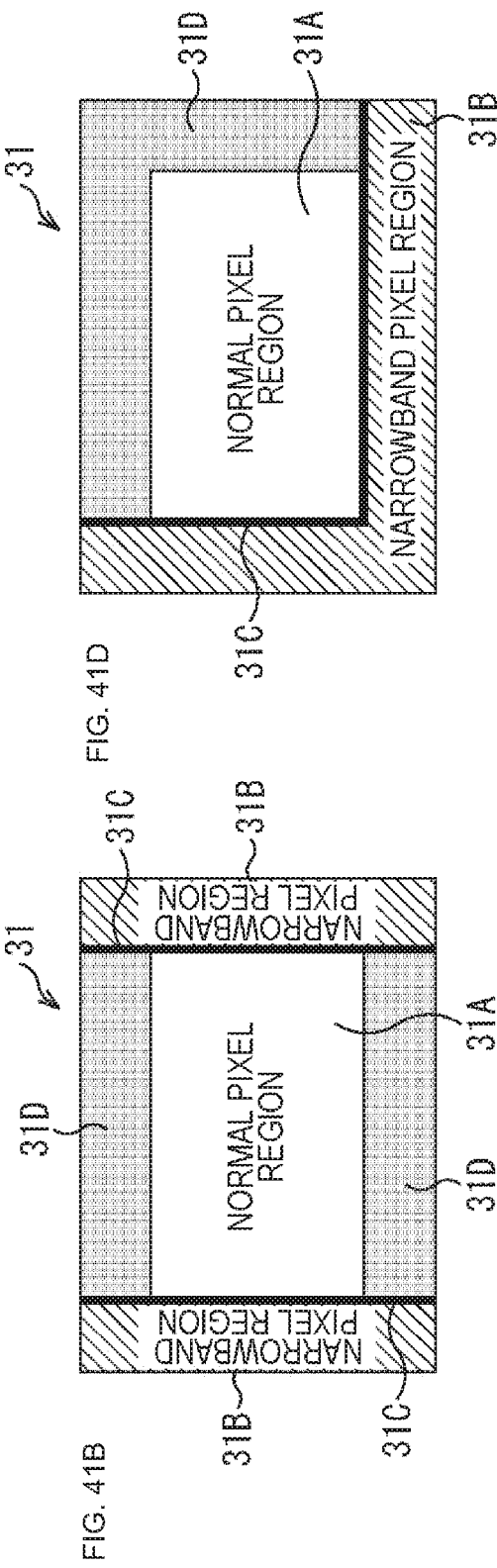

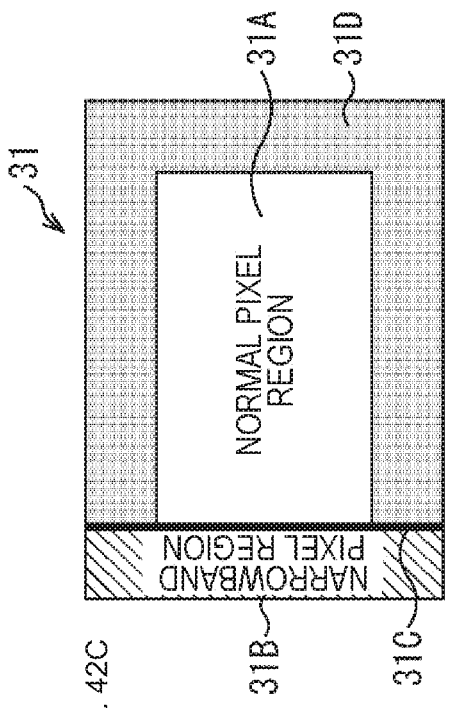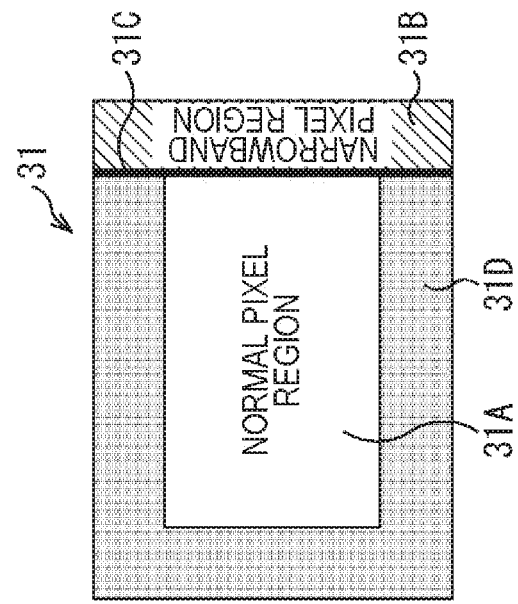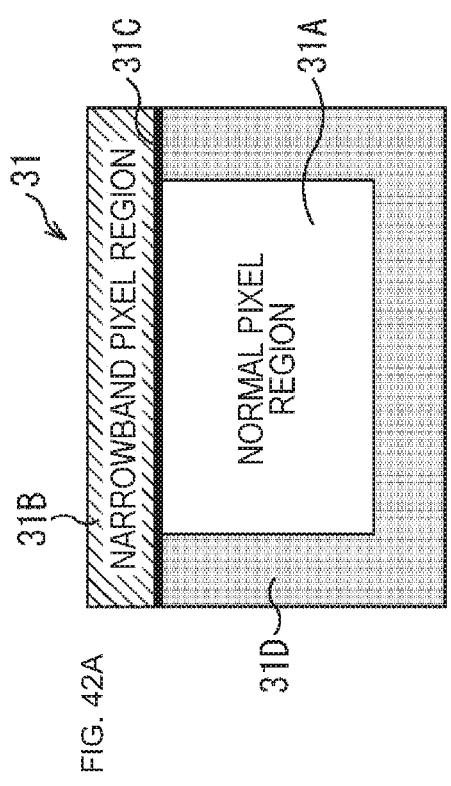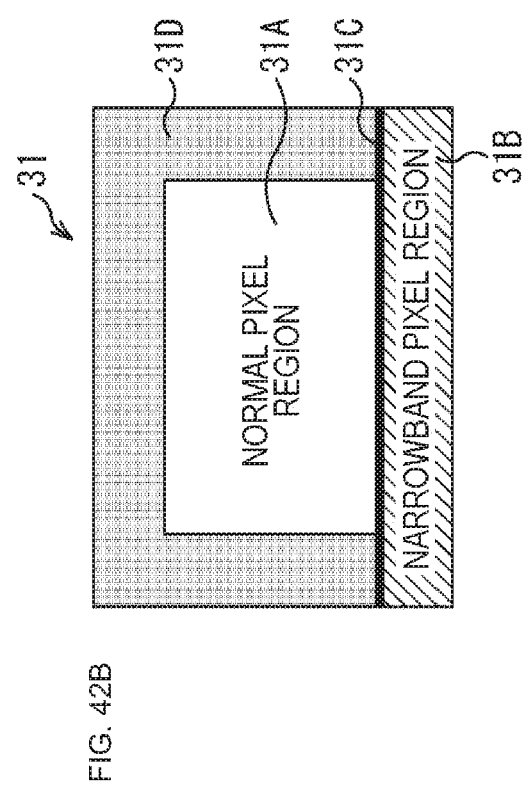

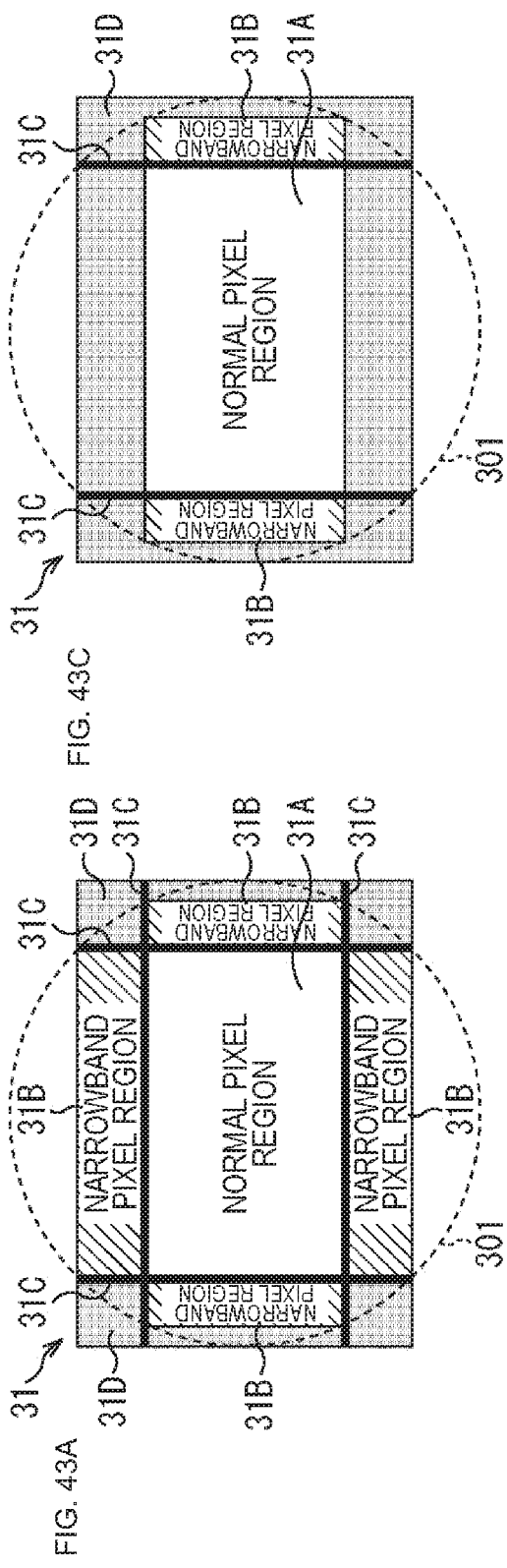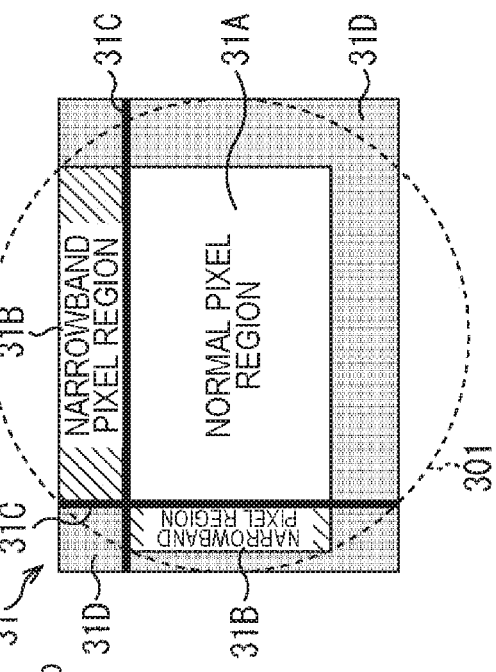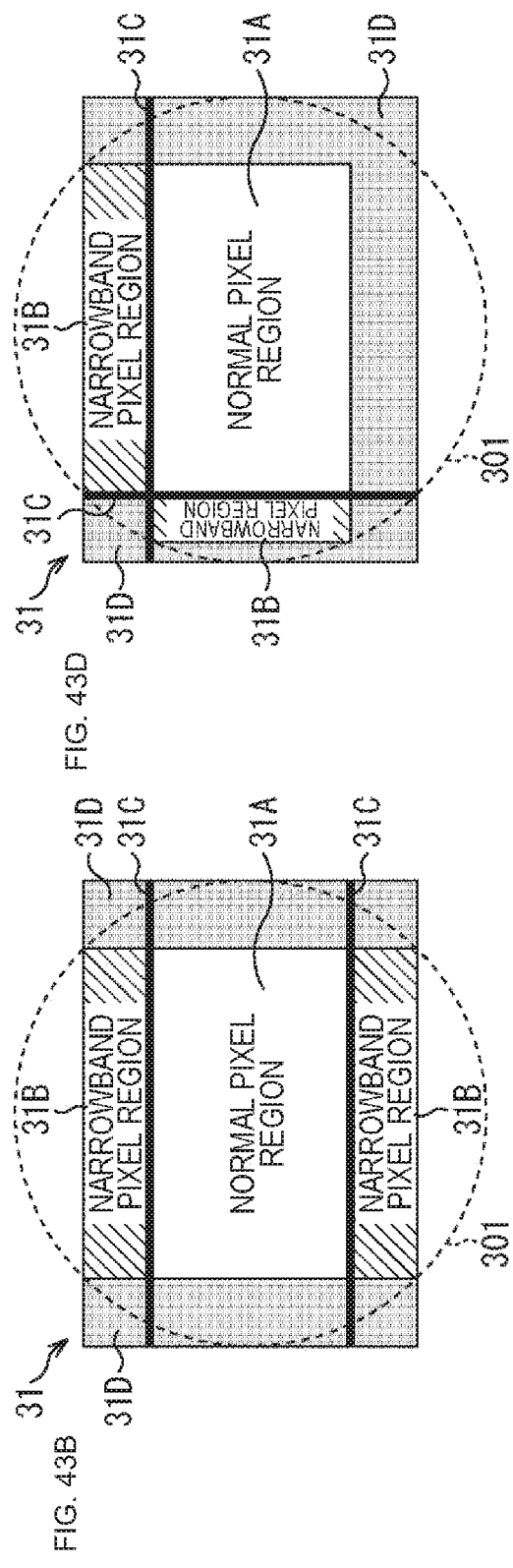

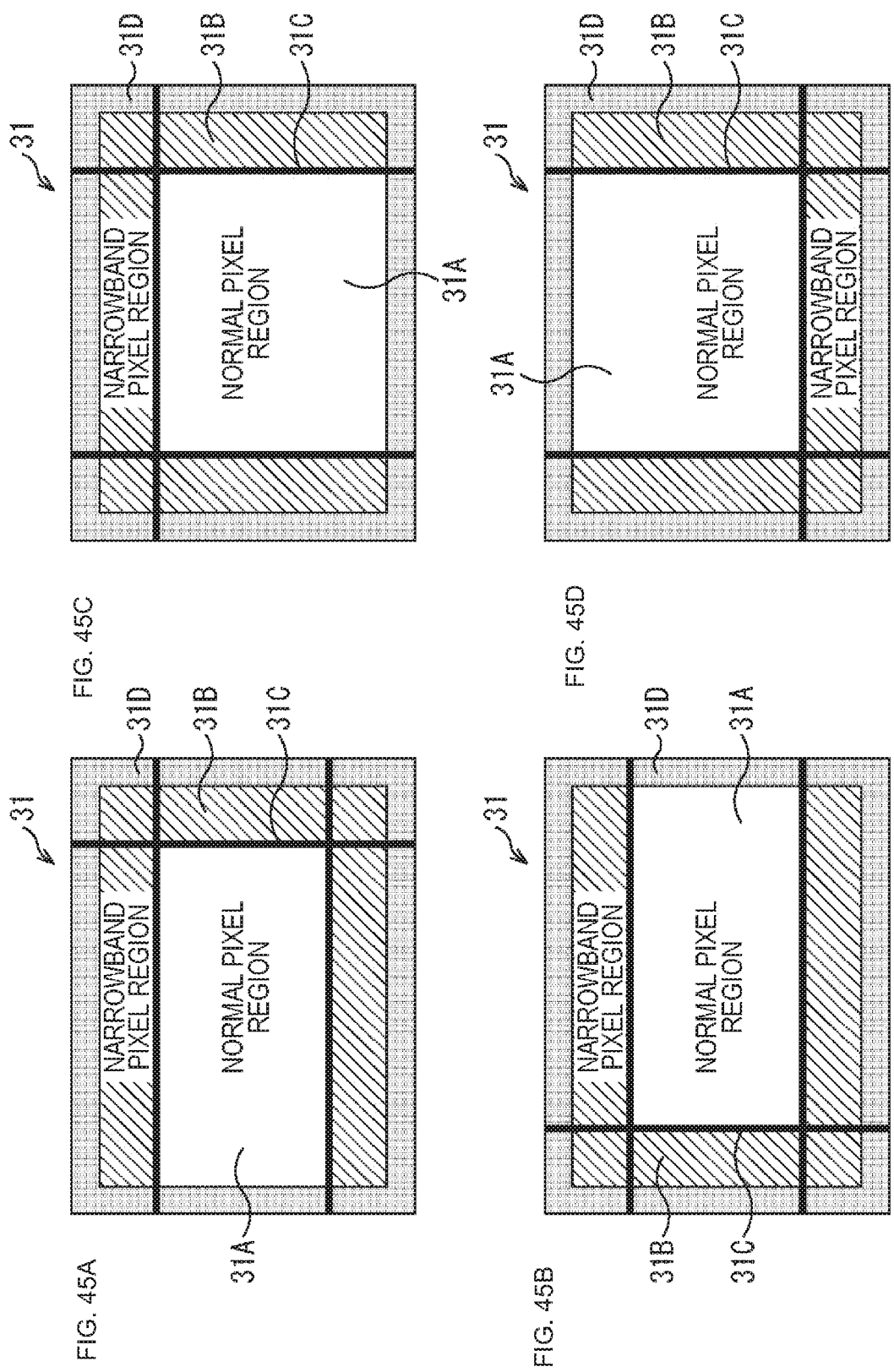

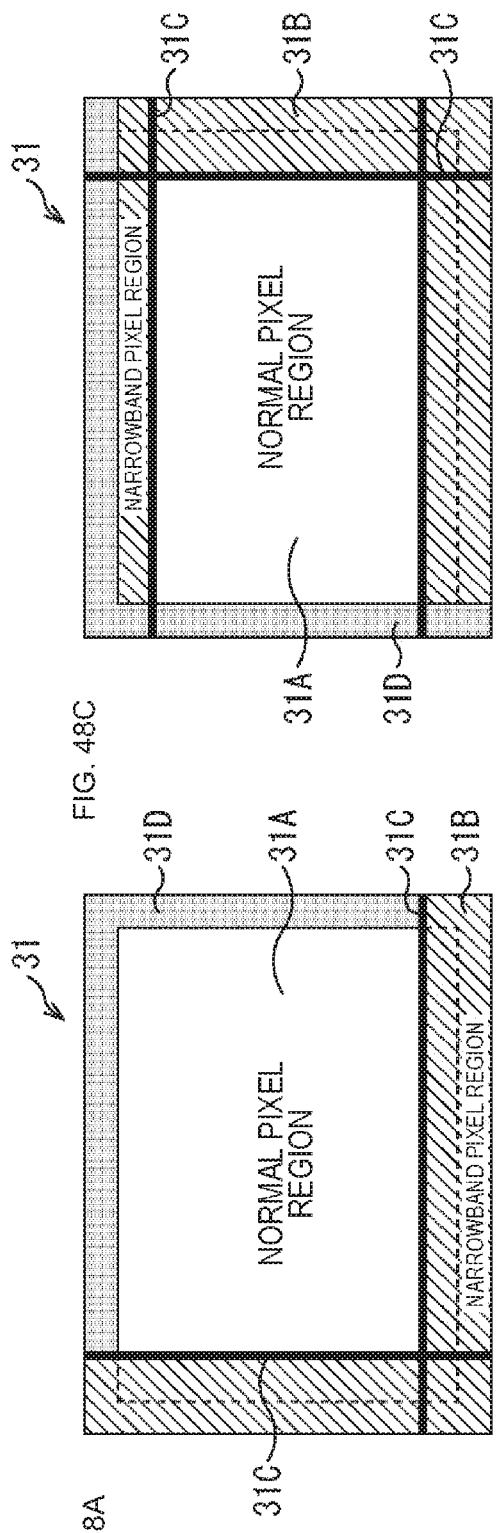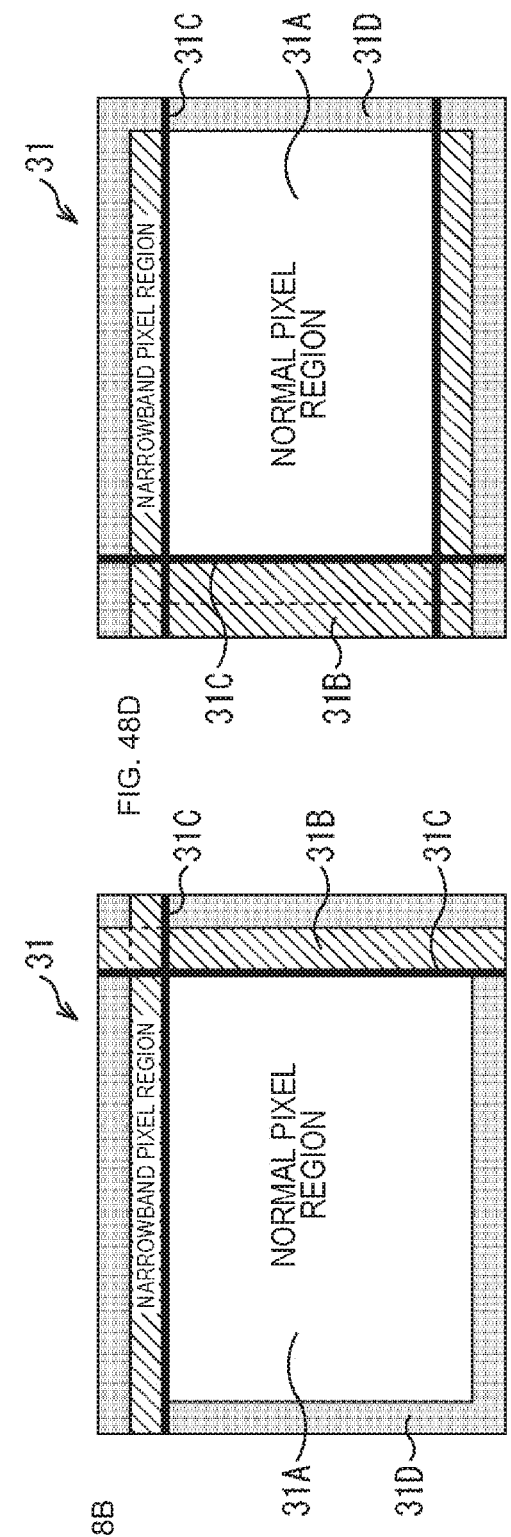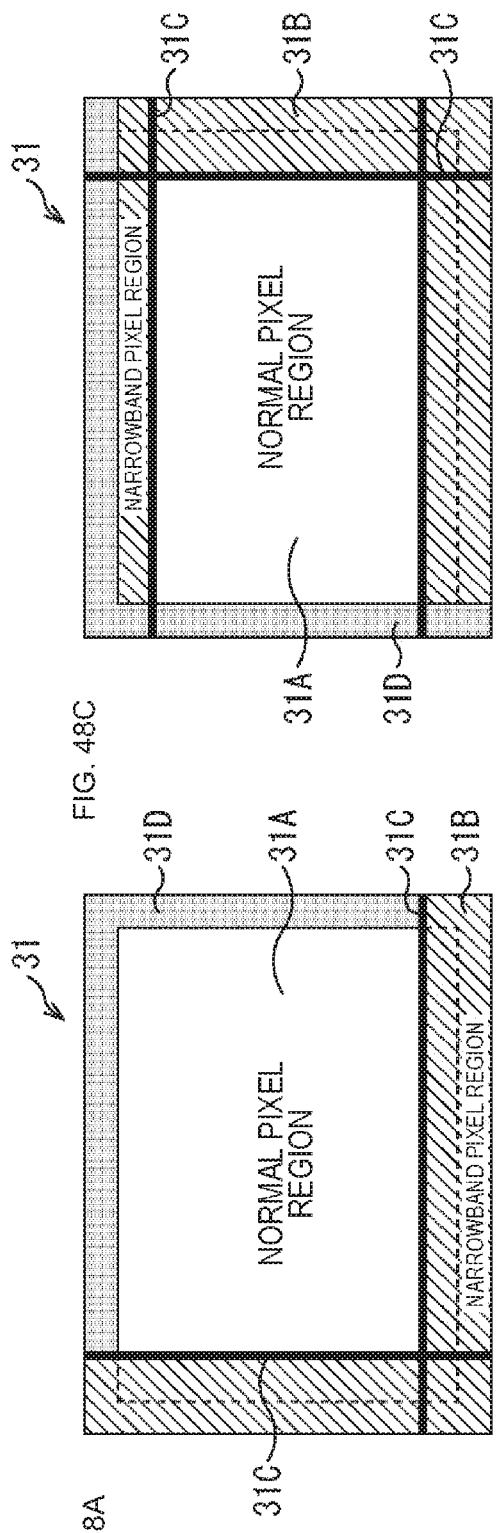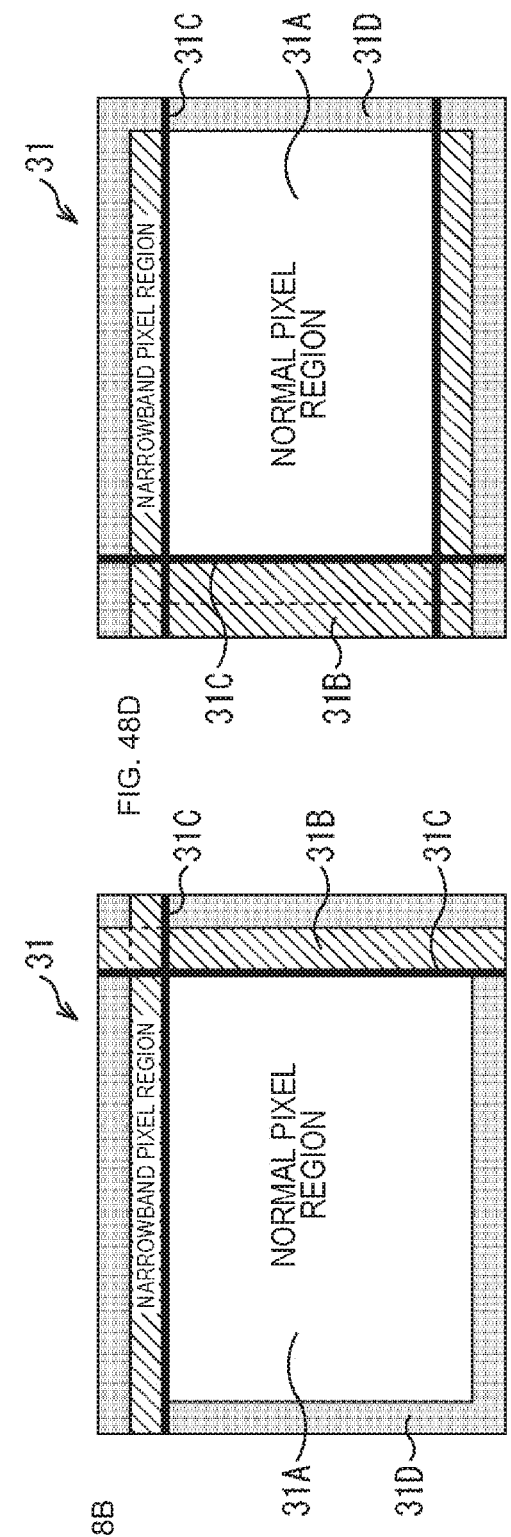

FIG. 60

| DETECTION TARGET | ITEM TO BE DETECTED | PEAK WAVELENGTH | HALF WIDTH |
|---|---|---|---|
| MYOGLOBIN | FLAVOR COMPONENT | 580-630nm | 30-50nm |
| OLEIC ACID | FRESHNESS | 970nm | 50-100nm |
| CHLOROPHYLL | FRESHNESS | 650-700nm | 50-100nm |

FIG. 61

| FRUIT | DETECTION TARGET | ITEM TO BE DETECTED | PEAK WAVELENGTH | HALF WIDTH |
|---|---|---|---|---|
| MELON, RAIDEN | SUGAR CONTENT | FLESH LIGHT PATH LENGTH | 880nm | 20-30nm |
| | | SUCROSE | 910nm | 40-50nm |
| MELON, RAIDEN RED | SUGAR CONTENT | SUCROSE | 915nm | 40-50nm |
| | | WATER CONTENT | 955nm | 20-30nm |
| APPLE | SUGAR CONTENT | SUCROSE | 912nm | 40-50nm |
| | WATER CONTENT | WATER | 844nm | 30nm |
| ORANGE | SUGAR CONTENT | SUCROSE | 914nm | 40-50nm |

FIG. 62

| DETECTION TARGET | PEAK WAVELENGTH | HALF WIDTH |
|---|---|---|
| PET | 1669nm | 30-50nm |
| PS | 1688nm | 30-50nm |
| PE | 1735nm | 30-50nm |
| PVC | 1716-1726nm | 30-50nm |
| PP | 1716-1735nm | 30-50nm |

SEMICONDUCTOR DEVICE AND ELECTRONIC APPARATUS

CROSS REFERENCE TO RELATED APPLICATIONS

This application is a U.S. National Phase of International Patent Application No. PCT/JP2019/000130 filed on Jan. 8, 2019, which claims priority benefit of Japanese Patent Application No. JP 2018-008111 filed in the Japan Patent Office on Jan. 22, 2018. Each of the above-referenced applications is hereby incorporated herein by reference in its entirety.

TECHNICAL FIELD

The technology according to the present disclosure (the technology will be hereinafter also referred to as the present technology) relates to a semiconductor device and an electronic apparatus, and more particularly, to a semiconductor device and an electronic apparatus that include a pixel having a metallic filter and a pixel not having the metallic filter.

BACKGROUND ART

There is a suggested imaging device in which the imaging region to be used for acquiring an image and the spectral region to be used for acquiring a color spectrum are formed in the same pixel region (see Patent Document 1, for example).

CITATION LIST

Patent Document

Patent Document 1: Japanese Patent Application Laid-Open No. 2012-59865

SUMMARY OF THE INVENTION

Problems to be Solved by the Invention

In the imaging device disclosed in Patent Document 1, color filters of a non-metallic organic material are used for the pixels in the imaging region, and plasmon filters made of a metal such as aluminum are used for the pixels in the spectral region, for example. Therefore, at a boundary portion between the imaging region and the spectral region, light reflected irregularly by a sidewall of a plasmon filter enters the imaging region, and as a result, the characteristics of the imaging device are degraded.

The present technology has been made in view of such circumstances, and is to improve the characteristics of a semiconductor device or an electronic apparatus that includes a pixel having a metallic filter and a pixel not having the metallic filter.

Solutions to Problems

A semiconductor device according to a first aspect of the present technology includes: a pixel unit in which a first pixel including a metallic filter and a second pixel not including the metallic filter are disposed adjacent to each other; and a reflected light reduction unit that reduces reflected light on a sidewall of the metallic filter at a boundary portion between the first pixel and the second pixel.

An electronic apparatus according to a second aspect of the present technology includes: a semiconductor device; and a signal processing unit that processes a signal output from the semiconductor device. In the electronic apparatus, the semiconductor device includes: a pixel unit in which a first pixel including a metallic filter and a second pixel not including the metallic filter are disposed adjacent to each other; and a reflected light reduction unit that reduces reflected light on a sidewall of the metallic filter at a boundary portion between the first pixel and the second pixel.

In the first aspect or the second aspect of the present technology, reflected light on the sidewall of the metallic filter at the boundary portion between the first pixel including the metallic filter and the second pixel not including the metallic filter is reduced.

Effects of the Invention

According to the first aspect of the present technology, it is possible to improve the characteristics of a semiconductor device that includes a pixel having a metallic filter and a pixel not having the metallic filter.

According to the second aspect of the present technology, it is possible to improve the characteristics of an electronic apparatus that includes a pixel having a metallic filter and a pixel not having the metallic filter.

Note that effects of the present technology are not limited to the effects described herein, and may include any of the effects described in the present disclosure.

BRIEF DESCRIPTION OF DRAWINGS

FIG. 21 is a cross-sectional view schematically showing a second embodiment of the filter layer of an imaging device.

FIG. 23 is a cross-sectional view schematically showing a third embodiment of the filter layer of an imaging device.

FIGS. 40A, 40B, 40C, and 40D are diagrams showing example layouts in the pixel array of an imaging device.

FIGS. 41A, 41B, 41C, and 41D are diagrams showing example layouts in the pixel array of an imaging device.

FIGS. 42A, 42B, 42C, and 42D are diagrams showing example layouts in the pixel array of an imaging device.

FIGS. 43A, 43B, 43C, and 43D are diagrams showing example layouts in the pixel array of an imaging device.

FIGS. 45A, 45B, 45C, and 45D are diagrams showing example layouts in the pixel array of an imaging device.

FIGS. 48A, 48B, 48C, and 48D are diagrams showing example layouts in the pixel array of an imaging device.

FIG. 60 is a table showing examples of the detection band in a case where the flavor and the degree of freshness of food are detected.

FIG. 61 is a table showing examples of the detection band in a case where the sugar content and the water content of a fruit are detected.

FIG. 62 is a table showing examples of the detection band in a case where plastics are separated.

MODES FOR CARRYING OUT THE INVENTION

Figure 1:
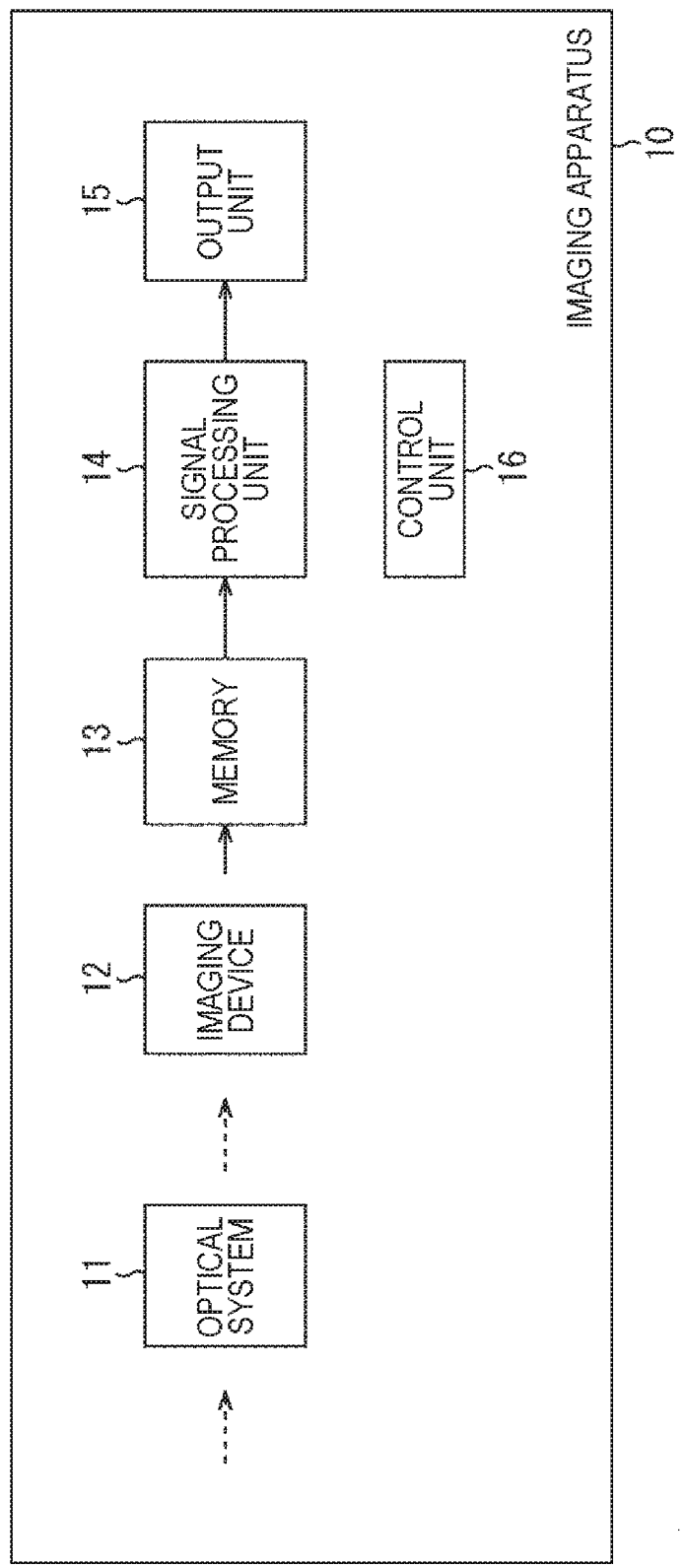
FIG. 1 is a block diagram showing an embodiment of an imaging apparatus to which the present technology is applied.

The following is a detailed description of modes for carrying out the invention (these modes will be hereinafter referred to as "embodiments"), with reference to the accompanying drawings. Note that explanation will be made in the following order.

1. Example configuration of an imaging apparatus
2. First embodiment (an example in which a light absorber is disposed at a higher location than narrowband filters)
3. Second embodiment (an example in which a sidewall of a narrowband filter is covered with a light absorber)
4. Third embodiment (an example in which a sidewall of a narrowband filter is covered with a low-reflection film)
5. Fourth embodiment (an example in which a sidewall of a narrowband filter is inclined)
6. Example positions of a reflected light reduction unit in a pixel array
7. Fifth embodiment (an example in which an antireflective film is provided on the light incident surface of each narrowband filter)
8. Modifications of the filters of normal pixels and narrowband pixels
9. Image processing in an imaging apparatus
10. Example applications
11. Modifications

1. Example Configuration of an Imaging Apparatus

First, an example configuration of an imaging apparatus to which the present technology is applied is described, with reference to FIGS. 1, 2, 3, 4, 5, 6, 7, 8, 10, 11A, 11B, 12, 13A, 13B, 14, 15, 16, 17, 18A, and 18B.

<Example Configuration of an Imaging Apparatus 10>

FIG. 1 is a block diagram showing an example configuration of an imaging apparatus 10 that is an electronic apparatus to which the present technology is applied.

The imaging apparatus 10 is formed with a digital camera that is capable of capturing both still images and moving images, for example. The imaging apparatus 10 is capable of detecting (multispectral) light of four or more wavelength bands (at least four bands) that are more than the conventional three wavelength bands (three bands) of R (red), G (green), and B (blue), or Y (yellow), M (magenta), and C (cyan) based on the three primary colors or the color-matching functions.

The imaging apparatus 10 includes an optical system 11, an imaging device 12, a memory 13, a signal processing unit 14, an output unit 15, and a control unit 16.

The optical system 11 includes a zoom lens, a focus lens, a diaphragm, and the like (not shown), for example, and causes light from outside to enter the imaging device 12. The optical system 11 also includes various kinds of filters such as a polarization filter as needed.

The imaging device 12 is formed with a complementary metal oxide semiconductor (CMOS) image sensor, for example. The imaging device 12 receives the incident light from the optical system 11, performs photoelectric conversion, and outputs the image data corresponding to the incident light.

The memory 13 temporarily stores the image data the imaging device 12 has output.

The signal processing unit 14 performs signal processing (processing such as denoising and white balance adjustment, for example) using the image data stored in the memory 13, and supplies the resultant image data to the output unit 15.

The output unit 15 outputs the image data supplied from the signal processing unit 14. For example, the output unit 15 includes a display (not shown) formed with liquid crystal or the like, and displays the spectrum (image) corresponding to the image data supplied from the signal processing unit 14 as a so-called through-lens image. The output unit 15 includes a driver (not shown) for driving a recording medium such as a semiconductor memory, a magnetic disk, or an optical disk, for example, and records the image data supplied from the signal processing unit 14 on the recording medium. For example, the output unit 15 functions as a communication interface that communicates with an external device (not shown), and transmits the image data from the signal processing unit 14 to the external device in a wireless or wired manner.

The control unit 16 controls the respective components of the imaging apparatus 10, in accordance with a user operation or the like.

Note that image data will be hereinafter also referred to simply as an image.

<Example Circuit Configuration of the Imaging Device>

Figure 2:
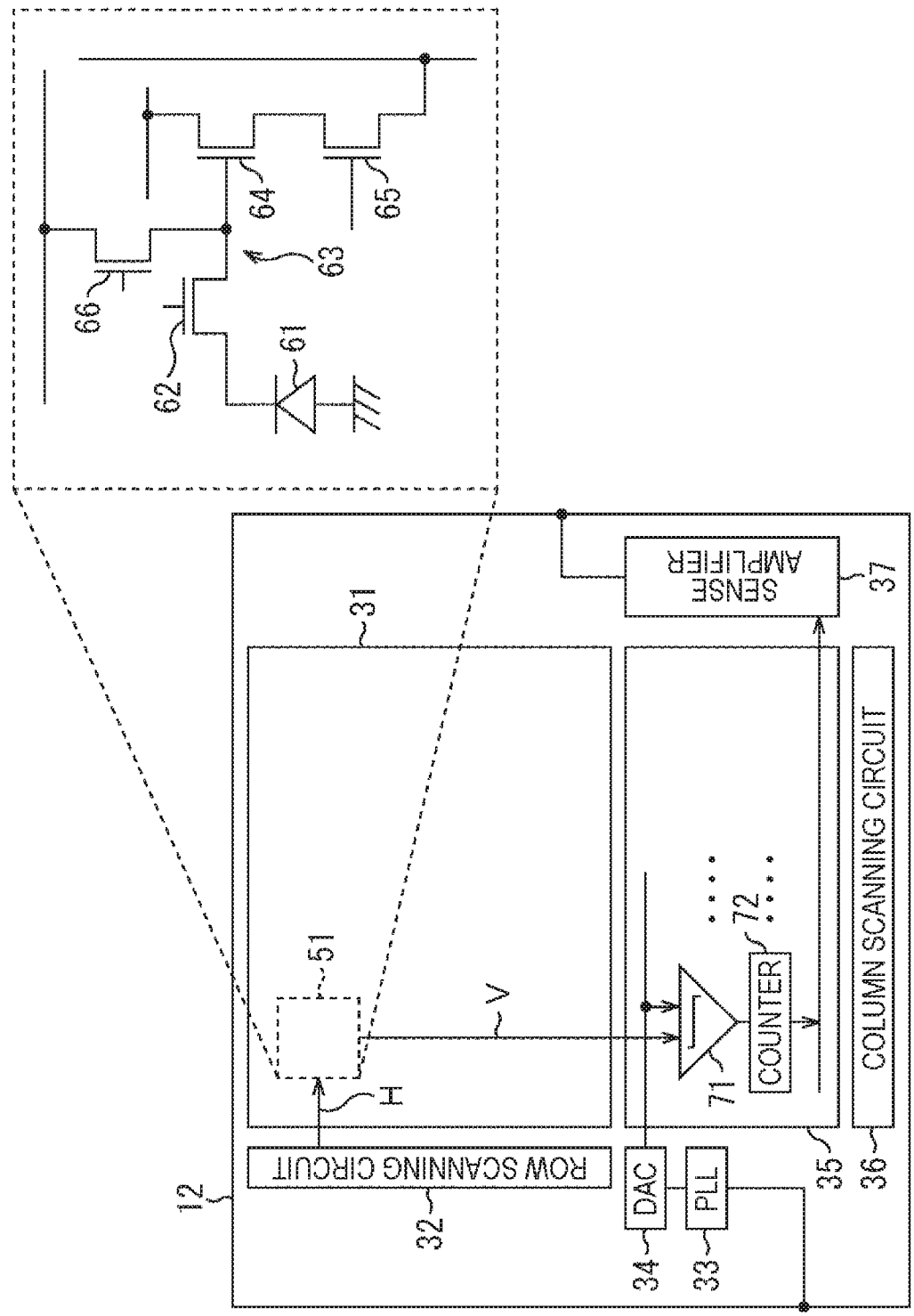
FIG. 2 is a block diagram showing an example circuit configuration of an imaging device.

FIG. 2 is a block diagram showing an example circuit configuration of the imaging device 12 shown in FIG. 1.

The imaging device 12 includes a pixel array 31, a row scanning circuit 32, a phase locked loop (PLL) 33, a digital-analog converter (DAC) 34, a column analog-digital converter (ADC) circuit 35, a column scanning circuit 36, and a sense amplifier 37.

The pixel array 31 is a pixel unit in which a plurality of pixels 51 is two-dimensionally arranged.

Each pixel 51 is disposed at a point where a horizontal signal line H connected to the row scanning circuit 32 and a vertical signal line V connected to the column ADC circuit 35 intersect, and includes a photodiode 61 that performs photoelectric conversion, and several kinds of transistors for reading stored signals. That is, each pixel 51 includes a photodiode 61, a transfer transistor 62, a floating diffusion 63, an amplification transistor 64, a selection transistor 65, and a reset transistor 66, as shown in an enlarged view on the right side in FIG. 2.

The electric charges stored in the photodiode 61 are transferred to the floating diffusion 63 via the transfer transistor 62. The floating diffusion 63 is connected to the gate of the amplification transistor 64. When a pixel 51 becomes the target from which a signal is to be read out, the selection transistor 65 is turned on by the row scanning circuit 32 via the horizontal signal line H, and the amplification transistor 64 is driven by source follower driving, so that the signal of the selected pixel 51 is read out as the pixel signal corresponding to the amount of the electric charges stored in the photodiode 61 into the vertical signal line V. Further, the reset transistor 66 is turned on, to reset the pixel signal.

The row scanning circuit 32 sequentially outputs drive signals for driving (transferring, selecting, resetting, and the like, for example) the pixels 51 of the pixel array 31 row by row.

The PLL 33 generates and outputs a clock signal of a predetermined frequency required for driving the respective components of the imaging device 12, on the basis of a clock signal supplied from the outside.

The DAC 34 generates and outputs a ramp signal having a shape (almost a sawtooth shape) that returns to a predetermined voltage value after the voltage drops at a predetermined gradient from a predetermined voltage value.

The column ADC circuit 35 includes comparators 71 and counters 72 that correspond in number to the columns of the pixels 51 of the pixel array 31. The column ADC circuit 35 extracts signal levels from pixel signals output from the pixels 51 by performing a correlated double sampling (CDS) operation, and then outputs pixel data. That is, the comparators 71 compare the ramp signal supplied from the DAC 34 with the pixel signals (luminance values) output from the pixels 51, and supply the resultant comparison result signals to the counters 72. In accordance with the comparison result signals output from the comparators 71, the counters 72 then count the counter clock signals of a predetermined frequency, so that the pixel signals are subjected to A/D conversion.

The column scanning circuit 36 supplies the counters 72 of the column ADC circuit 35 sequentially with signals for outputting the pixel data at predetermined timings.

The sense amplifier 37 amplifies the pixel data supplied from the column ADC circuit 35, and outputs the amplified pixel data to the outside of the imaging device 12.

<Example Configuration of the Imaging Device>

Figure 3:
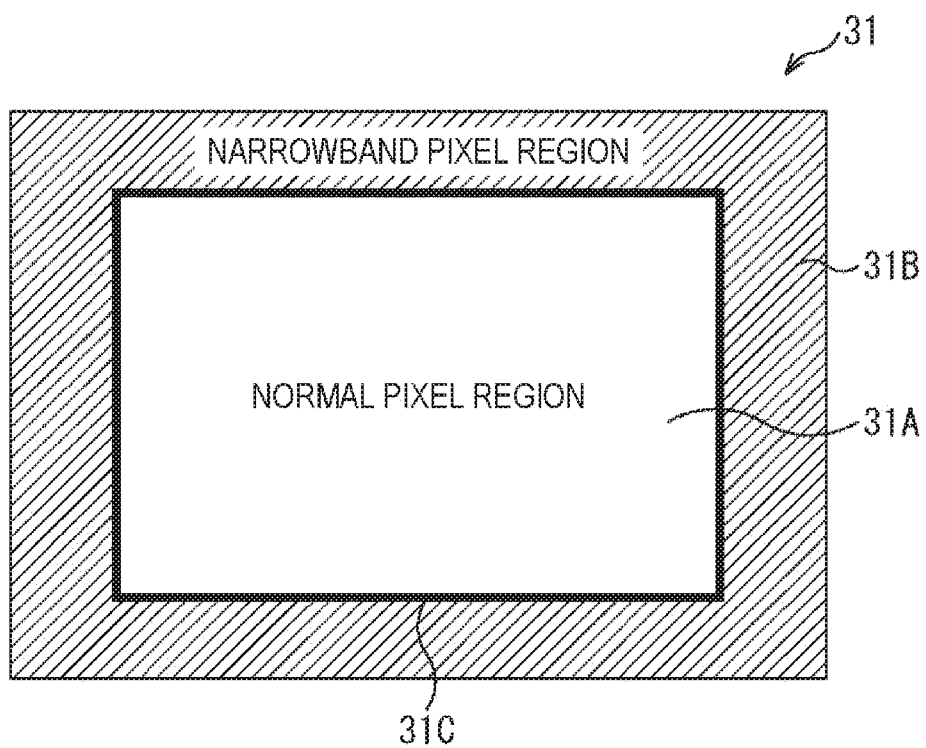
FIG. 3 is a diagram showing an example configuration of the pixel array of the imaging device.

FIG. 3 shows an example configuration of the pixel array 31 of the imaging device 12 shown in FIG. 2.

In this example, the periphery of a normal pixel region 31A is surrounded by a narrowband pixel region 31B.

The normal pixel region 31A is used primarily for imaging an object. For example, pixels 51 each including a color filter that is a filter made of a non-metallic material (a non-metallic filter) are disposed in the normal pixel region 31A.

Note that a color filter may be either of an organic material type or of an inorganic material type. For example, organic color filters include dyed/colored filters using a synthetic resin or a natural protein, and dye-containing filters using pigment dyestuff or coloring dyestuff. Further, a material such as TiO2, ZnS, SiN, MgF2, SiO2, or a Low-k material is used for inorganic color filters, for example. Furthermore, a technique such as vapor deposition, sputtering, or chemical vapor deposition (CVD) film formation is used to form inorganic color filters, for example.

A color filter transmission band (color) is set for each pixel 51, and the types and the layout of the colors are selected as appropriate. For example, the color filters include filters of three colors: R (red), G (green), and B (blue), or Y (yellow), M (magenta), and C (cyan).

Note that color filters are not necessarily used in the normal pixel region 31A. In this case, the normal pixel region 31A is used for capturing monochrome images.

The narrowband pixel region 31B is used primarily for measuring the spectral characteristics of the object. In the narrowband pixel region 31B, for example, pixels 51 each including a narrowband filter that is an optical filter that transmits narrowband light in a predetermined narrow wavelength band (narrow band) are disposed. For example, a plasmon filter that is a kind of metallic filter using a thin film made of a metal such as aluminum, and uses surface plasmons is used as the narrowband filter.

The transmission band of the narrowband filter is set for each pixel 51. The types (the number of bands) of the transmission band of the narrowband filter are set as appropriate, and may be four or more, for example.

Here, a narrow band is a wavelength band that is narrower than the transmission bands of conventional color filters of R (red), G (green), and B (blue), or Y (yellow), M (magenta), and C (cyan) based on the three primary colors or the color-matching functions, for example.

A reflected light reduction unit 31C that reduces light reflected by the sidewalls of the narrowband filters is disposed at the boundary portion between the normal pixel region 31A and the narrowband pixel region 31B. The reflected light reduction unit 31C will be described later in detail.

Note that, in a case where the pixels 51 in the normal pixel region 31A are distinguished from the pixels 51 in the narrowband pixel region 31B in the description below, the former will be referred to as the normal pixels 51A, and the latter will be referred to as the narrowband pixels 51B. Further, in the description below, an image obtained with the normal pixels 51A in the normal pixel region 31A will be referred to as a normal image, and an image obtained with the narrowband pixels 51B in the narrowband pixel region 31B will be referred to as a multispectral image.

Figure 4:
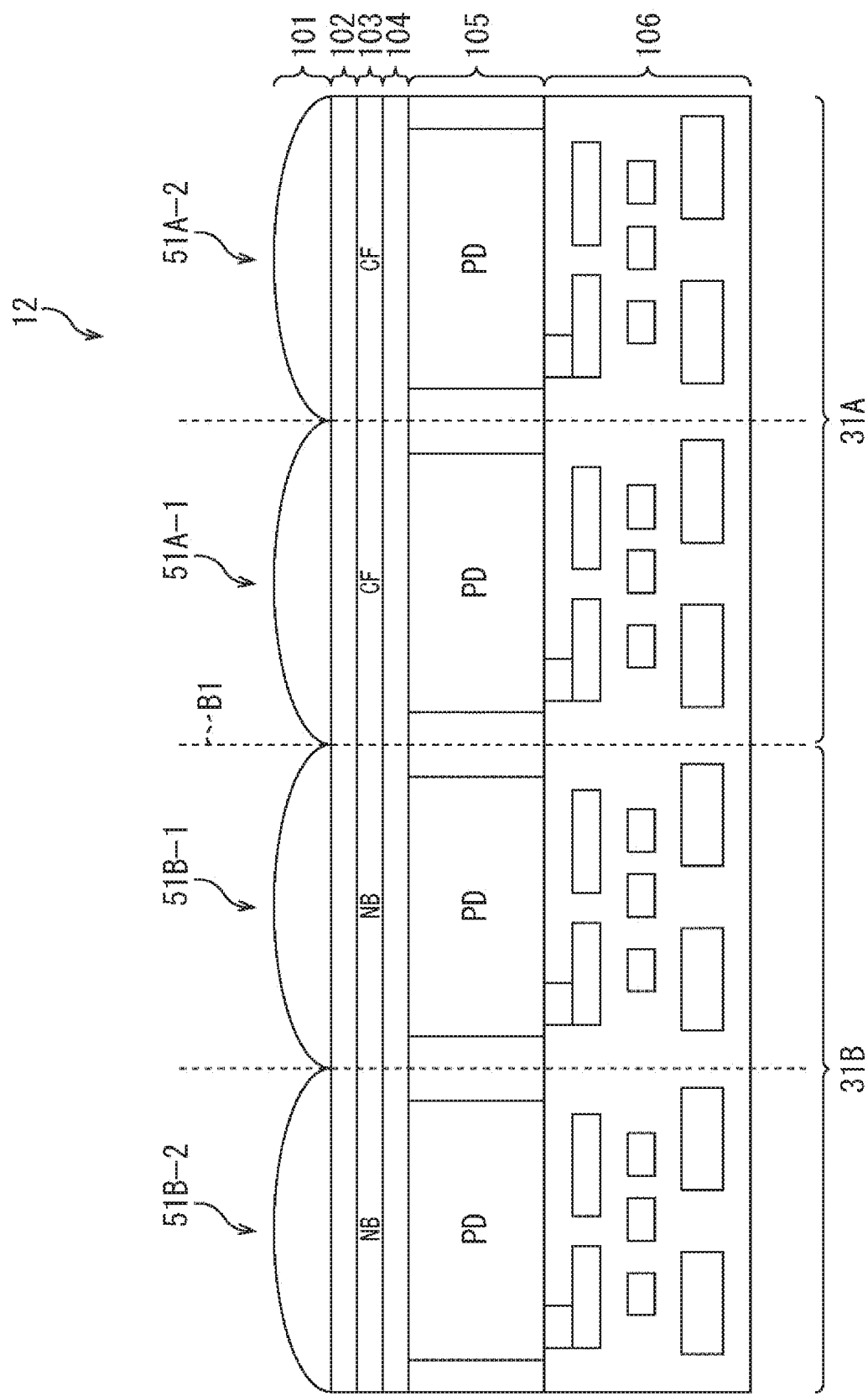
FIG. 4 is a schematic cross-sectional view of an example configuration of the imaging device.

FIG. 4 schematically shows an example configuration of a cross-section of the imaging device 12 shown in FIG. 1. FIG. 4 shows a cross-section of the four pixels: a normal pixel 51A-1, a normal pixel 51A-2, a narrowband pixel 51B-1, and a narrowband pixel 51B-2 in the vicinity of a boundary portion B1 between the normal pixel region 31A and the narrowband pixel region 31B (a boundary portion B1 between a normal pixel 51A and a narrowband pixel 51B that are adjacent to each other) of the imaging device 12.

Note that, in a case where there is no need to distinguish the normal pixel 51A-1 and the normal pixel 51A-2 from each other in the description below, the normal pixel 51A-1 and the normal pixel 51A-2 will be referred to simply as the normal pixels 51A. In a case where there is no need to distinguish the narrowband pixel 51B-1 and the narrowband pixel 51B-2 from each other, the narrowband pixel 51B-1 and the narrowband pixel 51B-2 will be referred to simply as the narrowband pixels 51B.

In each pixel 51, an on-chip microlens 101, an interlayer film 102, a filter layer 103, an interlayer film 104, a photoelectric conversion element layer 105, and a signal wiring layer 106 are stacked in this order from the top. That is, the imaging device 12 is a back-illuminated CMOS image sensor in which the photoelectric conversion element layer 105 is disposed closer to the light incident side than the signal wiring layer 106.

The on-chip microlenses 101 are optical elements for gathering light onto the photoelectric conversion element layer 105 of each pixel 51.

The interlayer film 102 and the interlayer film 104 include a dielectric material such as SiO2. As described later, the dielectric constant of the interlayer film 102 and the interlayer film 104 is preferably as low as possible.

In the filter layer 103, color filters CF are provided for the respective normal pixel 51A, and narrowband filters NB are provided for the respective narrowband pixels 51B.

Note that, in the filter layer 103, any color filter CF may not be provided for some or all of the normal pixels 51A, for example. Also, in the filter layer 103, any narrowband filter NB may not be provided for some of the narrowband pixels 51B, for example.

The photoelectric conversion element layer 105 includes the photodiode 61 shown in FIG. 2 (hereinafter, also referred to as the photodiode PD) and the like, for example, receives light that has passed through the filter layer 103, and converts the received light into electric charges. The photoelectric conversion element layer 105 is also designed such that the pixels 51 are electrically separated from each other by a device separation layer.

The signal wiring layer 106 includes wiring lines and the like for reading the electric charges stored in the photoelectric conversion element layer 105.

<Plasmon Filter>

Next, a plasmon filter that can be used as a narrowband filter NB is described, with reference to FIGS. 5, 6, 7, 8, 10, 11A, 11B, 12, 13A, 13B, 14, 15, 16, 17, 18A, and 18B.

Figure 5:
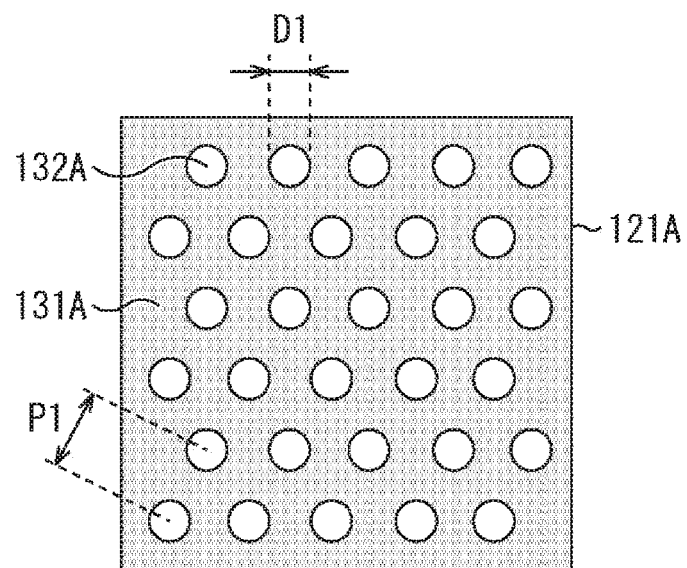
FIG. 5 is a diagram showing an example configuration of a plasmon filter having a hole array structure.

FIG. 5 shows an example configuration of a plasmon filter 121A having a hole array structure.

The plasmon filter 121A is formed with a plasmon resonator in which holes 132A are arranged in a honeycomb fashion in a metallic thin film (hereinafter, referred to as the conductive thin film) 131A.

Each hole 132A penetrates the conductive thin film 131A, and functions as a waveguide. Generally, a waveguide has a cutoff frequency and a cutoff wavelength determined by the length of a side, the shape of the diameter, or the like, and characteristically does not allow light of frequencies equal to or lower than that (and wavelengths equal to or longer than that) to pass therethrough. The cutoff wavelength of the holes 132A depends primarily on the aperture diameter D1. The smaller the aperture diameter D1, the shorter the cutoff wavelength. Note that the aperture diameter D1 is set to a smaller value than the wavelength of the light to be transmitted.

On the other hand, when light enters the conductive thin film 131A in which the holes 132A are arranged at intervals equal to or shorter than the wavelength of the light, light having longer wavelengths than the cutoff wavelength of the holes 132A passes therethrough. This phenomenon is called an abnormal plasmon transmission phenomenon. This phenomenon occurs when surface plasmons are excited at the boundary between the conductive thin film 131A and the interlayer film 102 thereon.

Figure 6:
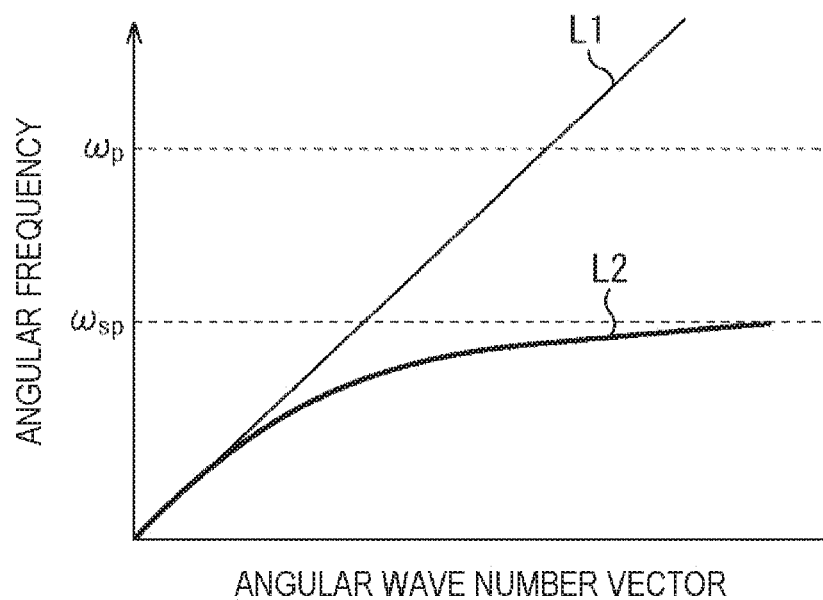
FIG. 6 is a graph showing the dispersion relationship of surface plasmons.

Referring now to FIG. 6, the conditions for an abnormal plasmon transmission phenomenon (surface plasmon resonance) to occur are described.

FIG. 6 is a graph showing the dispersion relationship of surface plasmons. In the graph, the abscissa axis indicates angular wave number vector k, and the ordinate axis indicates angular frequency $\omega$. In the graph, $\omega_p$ represents the plasma frequency of the conductive thin film 131A. Also, in the graph, $\omega_{sp}$ represents the surface plasma frequency at the interface between the interlayer film 102 and the conductive thin film 131A, and is expressed by Equation (1) shown below.

[Mathematical Formula 1]

$$\omega_{sp} = \frac{\omega_p}{\sqrt{1+\varepsilon_d}} \quad (1)$$

In the equation, $\varepsilon_d$ represents the dielectric constant of the dielectric material forming the interlayer film 102.

According to Equation (1), the surface plasma frequency $W_{sp}$ becomes higher as the plasma frequency $\omega_p$ becomes higher. The surface plasma frequency $\omega_{sp}$ also becomes higher as the dielectric constant $\varepsilon_d$ becomes lower.

A line L1 indicates the light dispersion relationship (the light line), and is expressed by Equation (2) shown below.

[Mathematical Formula 2]

$$\omega = \frac{c}{\sqrt{\varepsilon_d}} k \quad (2)$$

In the equation, c represents the speed of light.

A line L2 indicates the dispersion relationship of surface plasmons, and is expressed by Equation (3) shown below.

[Mathematical Formula 3]

$$\omega = ck \times \sqrt{\frac{\varepsilon_m + \varepsilon_d}{\varepsilon_m \varepsilon_d}} \quad (3)$$

In the equation, $\varepsilon_m$ represents the dielectric constant of the conductive thin film 131A.

The surface plasmon dispersion relationship indicated by the line L2 asymptotically approaches the light line indicated by the line L1 in the range in which the angular wave number vector k is small, and asymptotically approaches the surface plasma frequency $\omega_{sp}$ as the angular wave number vector k becomes greater.

When Equation (4) shown below is satisfied, an abnormal plasmon transmission phenomenon then occurs.

[Mathematical Formula 4]

$$\text{Re}\left[\frac{\omega_{sp}}{c}\sqrt{\frac{\varepsilon_m \varepsilon_d}{\varepsilon_m + \varepsilon_d}}\right] = \left|\frac{2\pi}{\lambda}\sin\theta + iG_x + jG_y\right| \quad (4)$$

In the equation, $\lambda$ represents the wavelength of the incident light. Further, $\theta$ represents the incident angle of the incident light. $G_x$ and $G_y$ are expressed by Equation (5) shown below.

$$|G_x| = |G_y| = 2\pi/a_0 \quad (5)$$

In the equation, $a_0$ represents the lattice constant of the hole array structure formed with the holes 132A of the conductive thin film 131A.

The left-hand side of Equation (4) indicates an angular wave number vector of the surface plasmons, and the right-hand side indicates the angular wave number vector of the hole array intervals in the conductive thin film 131A. Therefore, when the angular wave number vector of the surface plasmons is equal to the angular wave number vector of the hole array intervals in the conductive thin film 131A, an abnormal plasmon transmission phenomenon occurs.

Further, the value of A at this point of time is the plasmon resonant wavelength (the transmission wavelength of the plasmon filter 121A).

Note that the angular wave number vector of the surface plasmons on the left-hand side of Equation (4) is determined by the dielectric constant $\varepsilon_m$ of the conductive thin film 131A and the dielectric constant $\varepsilon_d$ of the interlayer film 102. Meanwhile, the angular wave number vector of the hole array intervals on the right-hand side is determined by the incident angle θ of light and the pitch (hole pitch) P1 between adjacent holes 132A of the conductive thin film 131A. Accordingly, the resonant wavelength and the resonant frequency of the plasmons are determined by the dielectric constant $\varepsilon_m$ of the conductive thin film 131A, the dielectric constant $\varepsilon_d$ of the interlayer film 102, the incident angle θ of light, and the hole pitch P1. Note that, in a case where the incident angle of light is 0°, the resonant wavelength and the resonant frequency of the plasmons are determined by the dielectric constant $\varepsilon_m$ of the conductive thin film 131A, the dielectric constant $\varepsilon_d$ of the interlayer film 102, and the hole pitch P1.

Accordingly, the transmission band of the plasmon filter 121A (the plasmon resonant wavelength) varies depending on the material and the thickness of the conductive thin film 131A, the material and the thickness of the interlayer film 102, the pattern intervals of the hole array (the aperture diameter D1 and the hole pitch P1 of the holes 132A, for example), and the like. In particular, in a case the materials and the thicknesses of the conductive thin film 131A and the interlayer film 102 have been determined, the transmission band of the plasmon filter 121A varies depending on the pattern intervals of the hole array, or more particularly, on the hole pitch P1. That is, as the hole pitch P1 becomes narrower, the transmission band of the plasmon filter 121A shifts to the shorter wavelength side. As the hole pitch P1 becomes wider, the transmission band of the plasmon filter 121A shifts to the longer wavelength side.

Figure 7:
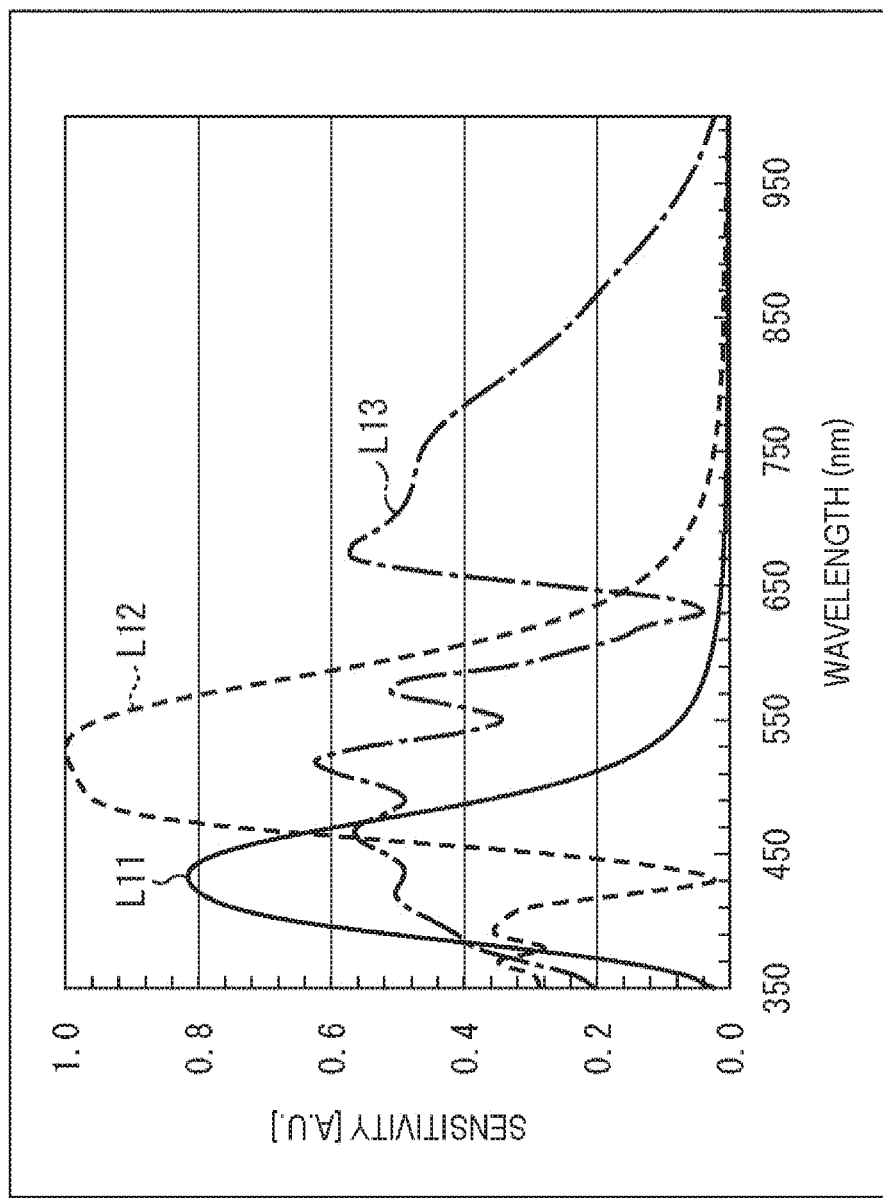
FIG. 7 is a graph showing a first example of the spectral characteristics of a plasmon filter having a hole array structure.

FIG. 7 is a graph showing an example of the spectral characteristics of the plasmon filter 121A in a case where the hole pitch P1 is varied. In the graph, the abscissa axis indicates wavelength (unit: nm), and the ordinate axis indicates sensitivity (unit being selected as appropriate). A line L11 indicates the spectral characteristics in a case where the hole pitch P1 is set at 250 nm, a line L12 indicates the spectral characteristics in a case where the hole pitch P1 is set at 325 nm, and a line L13 indicates the spectral characteristics in a case where the hole pitch P1 is set at 500 nm.

In the case where the hole pitch P1 is set at 250 nm, the plasmon filter 121A primarily transmits light in the blue-color wavelength band. In the case where the hole pitch P1 is set at 325 nm, the plasmon filter 121A primarily transmits light in the green-color wavelength band. In the case where the hole pitch P1 is set at 500 nm, the plasmon filter 121A primarily transmits light in the red-color wavelength band. However, in the case where the hole pitch P1 is set at 500 nm, the plasmon filter 121A also transmits a large amount of light in lower wavelength bands than the red color, with the waveguide mode described later.

Figure 8:
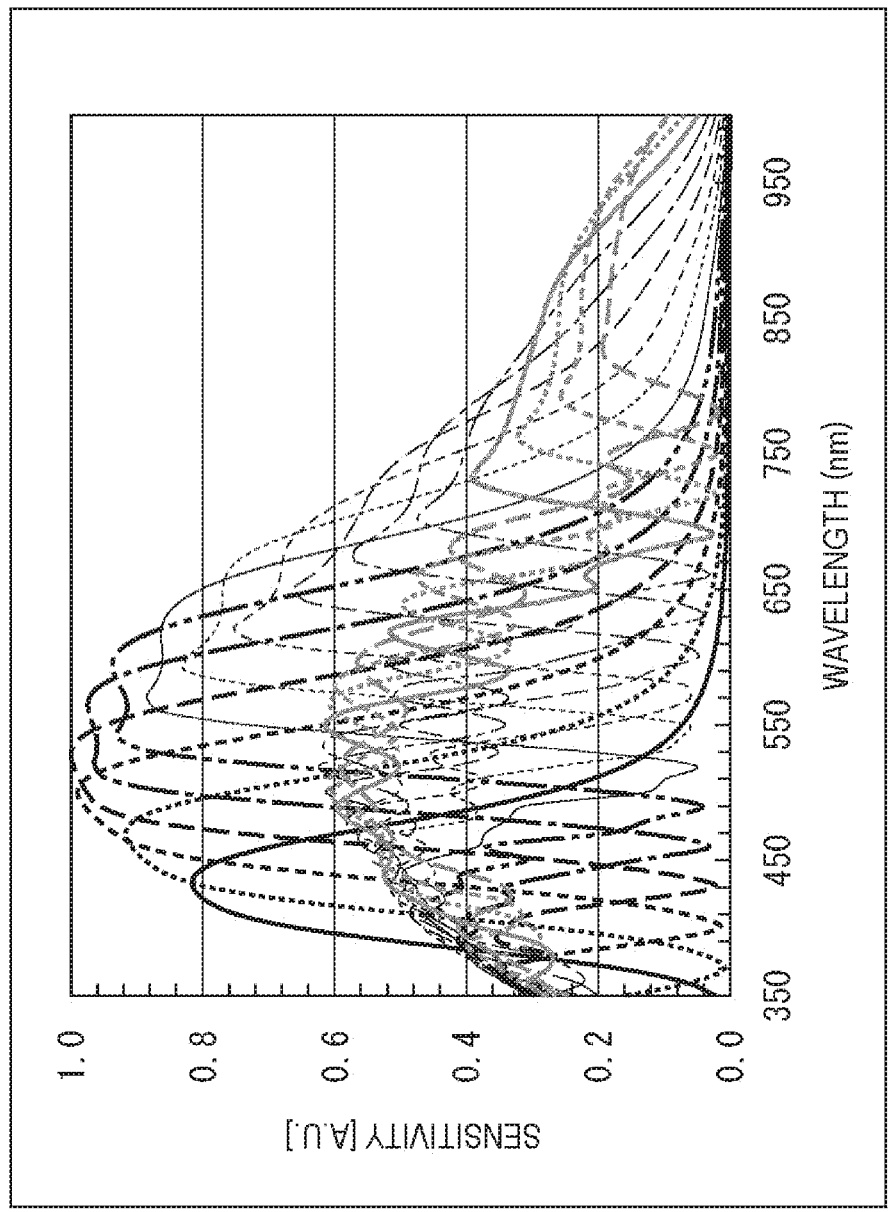
FIG. 8 is a graph showing a second example of the spectral characteristics of a plasmon filter having a hole array structure.

FIG. 8 is a graph showing another example of the spectral characteristics of the plasmon filter 121A in a case where the hole pitch P1 is varied. In the graph, the abscissa axis indicates wavelength (unit: nm), and the ordinate axis indicates sensitivity (unit being selected as appropriate). This example is an example of 16 kinds of spectral characteristics of the plasmon filter 121A in a case where the hole pitch P1 is varied from 250 nm to 625 nm, at intervals of 25 nm.

Note that the transmittance of the plasmon filter 121A is determined primarily by the aperture diameter D1 of the holes 132A. Where the aperture diameter D1 is greater, the transmittance is greater, but color mixing is more likely to occur. It is normally preferable to set the aperture diameter D1 so that the aperture ratio becomes 50% to 60% of the hole pitch P1.

Further, each hole 132A of the plasmon filter 121A functions as a waveguide, as described above. Therefore, depending on the pattern of the hole array of the plasmon filter 121A, not only the wavelength component to be transmitted by surface plasmon resonance (the wavelength component in the plasmon mode), but also the wavelength component to pass through the holes 132A (waveguides) (the wavelength component in the waveguide mode) might become large in the spectral characteristics.

Figure 9:
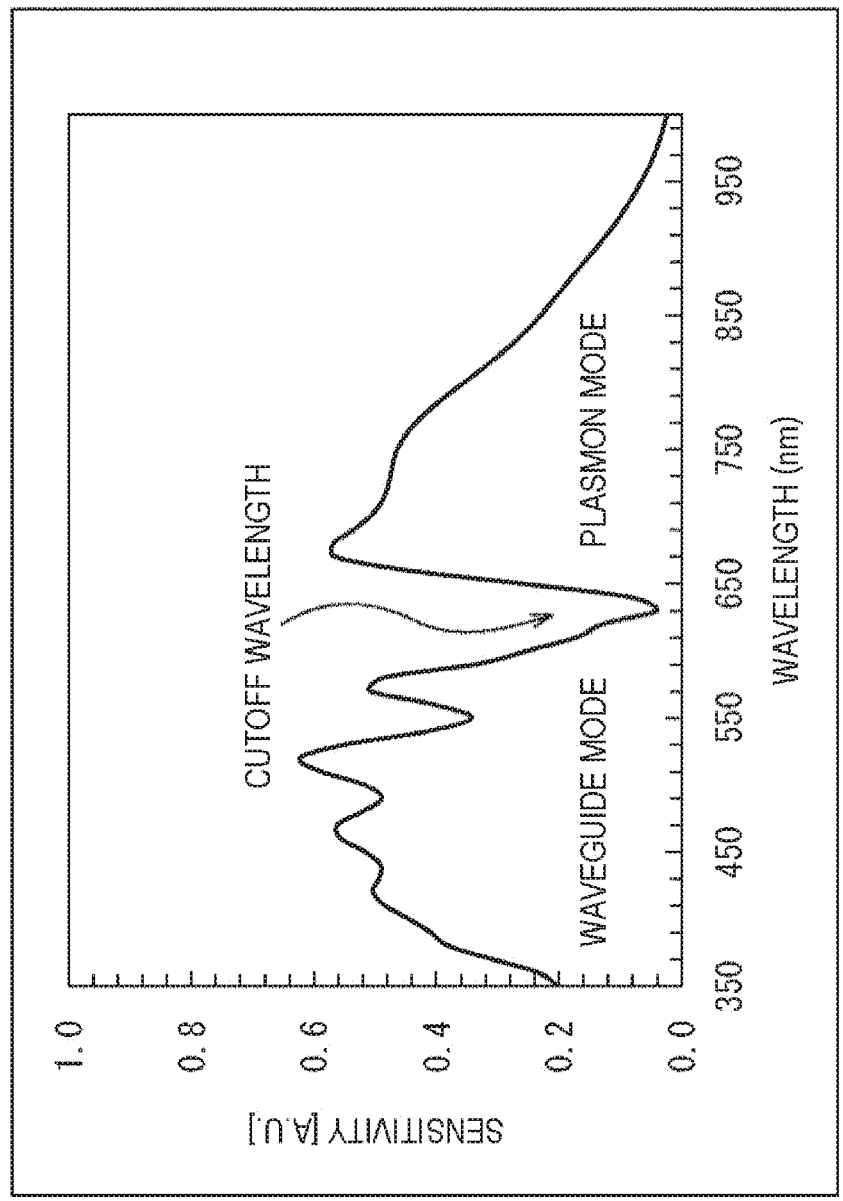
FIG. 9 is a graph showing a plasmon mode and a waveguide mode.

FIG. 9 shows the spectral characteristics of the plasmon filter 121A in a case where the hole pitch P1 is set at 500 nm, like the spectral characteristics represented by the line L13 in FIG. 7. In this example, the longer wavelength side than the cutoff wavelength in the neighborhood of 630 nm is the wavelength component in the plasmon mode, and the shorter wavelength side than the cutoff wavelength is the wavelength component in the waveguide mode.

As described above, the cutoff wavelength depends primarily on the aperture diameter D1 of the holes 132A. The shorter the cutoff wavelength, the smaller the aperture diameter D1. Further, as the difference between the cutoff wavelength and the peak wavelength in the plasmon mode is made larger, the wavelength resolution characteristics of the plasmon filter 121A improve.

Also, as described above, the higher the plasma frequency $\omega_p$ of the conductive thin film 131A, the higher the surface plasma frequency $\omega_{sp}$ of the conductive thin film 131A. Also, the lower the dielectric constant $\varepsilon_d$ of the interlayer film 102, the higher the surface plasma frequency $\omega_{sp}$. Further, as the surface plasma frequency $\omega_{sp}$ becomes higher, a higher plasmon resonant frequency can be set, and the transmission band of the plasmon filter 121A (the plasmon resonant wavelength) can be set in a shorter wavelength band.

Accordingly, where a metal having a lower plasma frequency $\omega_p$ is used for the conductive thin film 131A, the transmission band of the plasmon filter 121A can be set in a shorter wavelength band. For example, aluminum, silver, gold, or the like is preferable. However, in a case where a long wavelength band such as the wavelength band of infrared light is set as the transmission band, copper or the like can be used.

Also, where a dielectric material having a lower dielectric constant $\varepsilon_d$ is used for the interlayer film 102, the transmission band of the plasmon filter 121A can be set in a shorter-wavelength band. For example, SiO2, a Low-k material, or the like is preferable.

Figure 10:
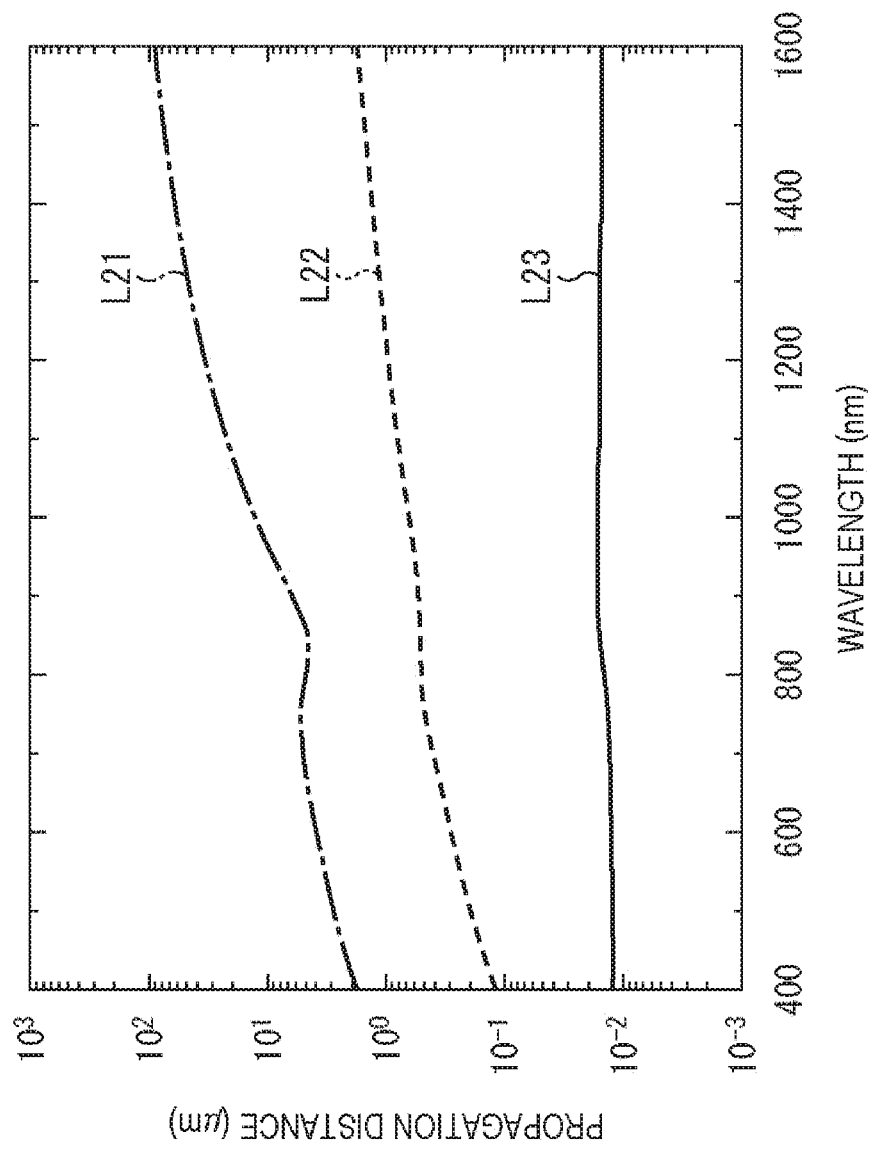
FIG. 10 is a graph showing an example of the propagation characteristics of surface plasmons.

FIG. 10 is a graph showing the propagation characteristics of the surface plasmons at the interface between the conductive thin film 131A and the interlayer film 102 in a case where aluminum is used for the conductive thin film 131A, and SiO2 is used for the interlayer film 102. In the graph, the abscissa axis indicates the wavelength of light (unit: nm), and the ordinate axis indicates the propagation distance (unit: μm). Further, a line L21 indicates the propagation characteristics in the interfacial direction, a line L22 indicates the propagation characteristics in the depth direction of the interlayer film 102 (a direction perpendicular to the interface), and a line L23 indicates the depth direction of the conductive thin film 131A (a direction perpendicular to the interface).

The propagation distance $\Lambda_{SPP}(\lambda)$ of the surface plasmons in the depth direction is expressed by Equation (6) shown below.

[Mathematical Formula 5]

$$\Lambda_{SPP}(\lambda) \equiv \frac{4\pi k_{SPP}}{\lambda} = \frac{4\pi}{\lambda} \text{Im}\left[\sqrt{\frac{\varepsilon_m \varepsilon_d}{\varepsilon_m + \varepsilon_d}}\right] \quad (6)$$

In the equation, $k_{SPP}$ represents the absorption coefficient of a substance through which the surface plasmons propagate. In the equation, $\varepsilon_m(\lambda)$ represents the dielectric constant of the conductive thin film 131A with respect to light having the wavelength $\lambda$. Further, $\varepsilon_d(\lambda)$ represents the dielectric constant of the interlayer film 102 with respect to light having the wavelength $\lambda$.

Accordingly, the surface plasmons for light having a wavelength of 400 nm propagate from the surface of the interlayer film 102 including SiO2 to a depth of about 100 nm, as shown in FIG. 10. Thus, as the thickness of the interlayer film 102 is set at 100 nm or greater, the substance stacked on the surface on the opposite side of the interlayer film 102 from the conductive thin film 131A is prevented from affecting the surface plasmons at the interface between the interlayer film 102 and the conductive thin film 131A.

Also, the surface plasmons for light having a wavelength of 400 nm propagate from the surface of the conductive thin film 131A including aluminum to a depth of about 10 nm. Thus, as the thickness of the conductive thin film 131A is set at 10 nm or greater, the interlayer film 104 is prevented from affecting the surface plasmons at the interface between the interlayer film 102 and the conductive thin film 131A.

<Other Examples of Plasmon Filters>

Next, other examples of plasmon filters are described, with reference to FIGS. 11, 11B, 12, 13A, 13B, 14, 15, 16, 17, 18A, and 18B.

Figure 11A:
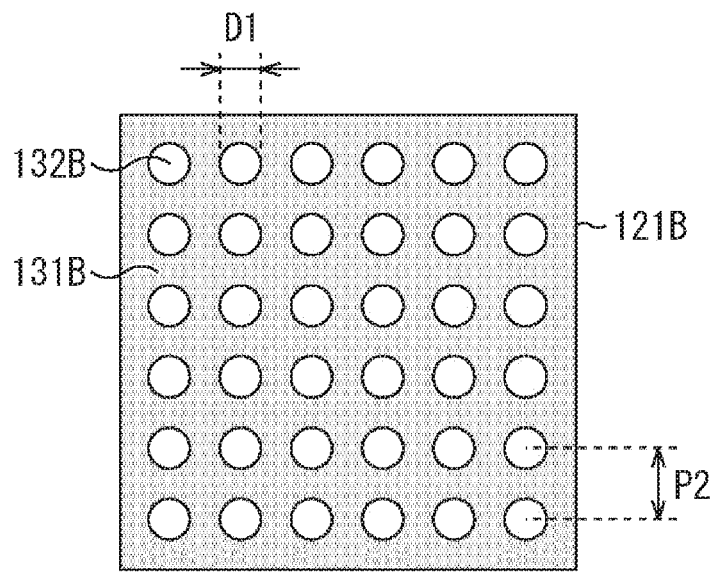
FIGS. 11A and 11B are diagrams showing other example configurations of plasmon filters having a hole array structure.

A plasmon filter 121B in FIG. 11A is formed with a plasmon resonator in which holes 132B are formed in an orthogonal matrix in a conductive thin film 131B. In the plasmon filter 121B, the transmission band varies depending on a pitch P2 between adjacent holes 132B, for example.

Meanwhile, in a plasmon resonator, not all the holes need to penetrate the conductive thin film. Even if some holes are formed with non-through holes that do not penetrate the conductive thin film, the plasmon resonator functions as a filter.

Figure 11B:
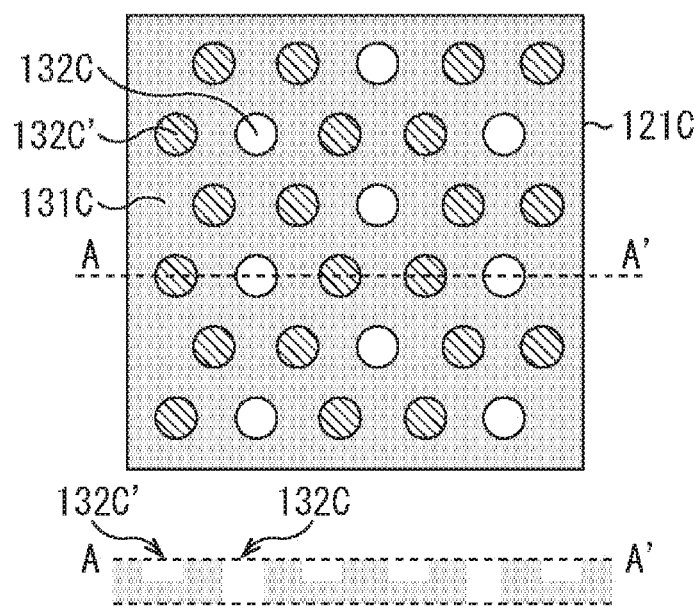

For example, FIG. 11B shows a plan view and a cross-sectional view (taken along the line A-A' defined in the plan view) of a plasmon filter 121C formed with a plasmon resonator in which holes 132C formed with through holes and holes 132C' formed with non-through holes are arranged in a honeycomb fashion in a conductive thin film 131C. That is, the holes 132C formed with through holes and holes 132C' formed with non-through holes are arranged at intervals in the plasmon filter 121C.

Further, a single-layer plasmon resonator is normally used as a plasmon filter, but a plasmon filter may be formed with a two-layer plasmon resonator, for example.

Figure 12:
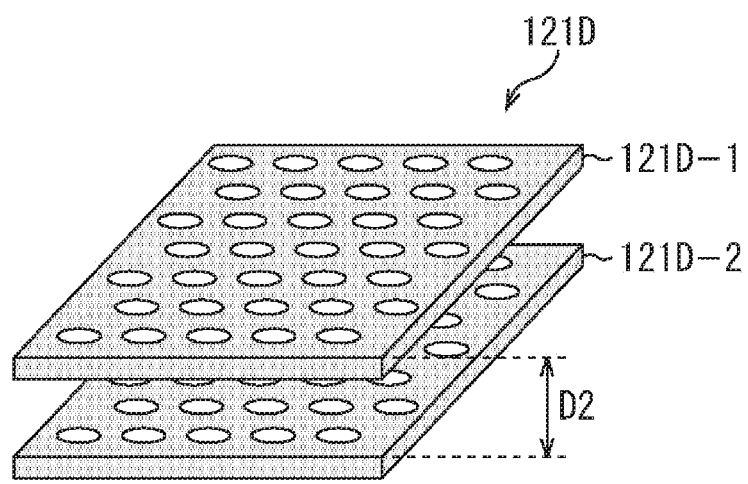
FIG. 12 is a view showing an example configuration of a plasmon filter having a two-layer structure.

For example, a plasmon filter 121D shown in FIG. 12 includes two layers: a plasmon filter 121D-1 and a plasmon filter 121D-2. Like the plasmon resonator forming the plasmon filter 121A shown in FIG. 5, the plasmon filter 121D-1 and the plasmon filter 121D-2 each have a structure in which holes are arranged in a honeycomb fashion.

Also, the distance D2 between the plasmon filter 121D-1 and the plasmon filter 121D-2 is preferably about ¼ of the peak wavelength of the transmission band. Further, with the degree of freedom of design being taken into account, the distance D2 is preferably equal to or shorter than ½ of the peak wavelength of the transmission band.

Note that, like the plasmon filter 121D, the holes may be arranged in the same pattern in the plasmon filter 121D-1 and the plasmon filter 121D-2, but the holes may be arranged in patterns similar to each other in a two-layer plasmon resonator structure, for example. Also, in a two-layer plasmon resonator structure, holes and dots may be arranged in such patterns that the hole array structure and the dot array structure (described later) are reversed structures. Further, the plasmon filter 121D has a two-layer structure, but a three or more layers may be adopted.

Also, in the above description, example configurations of plasmon filters using plasmon resonators each having a hole array structure have been described. However, a plasmon resonator having a dot array structure may be adopted as a plasmon filter.

Figure 13A:
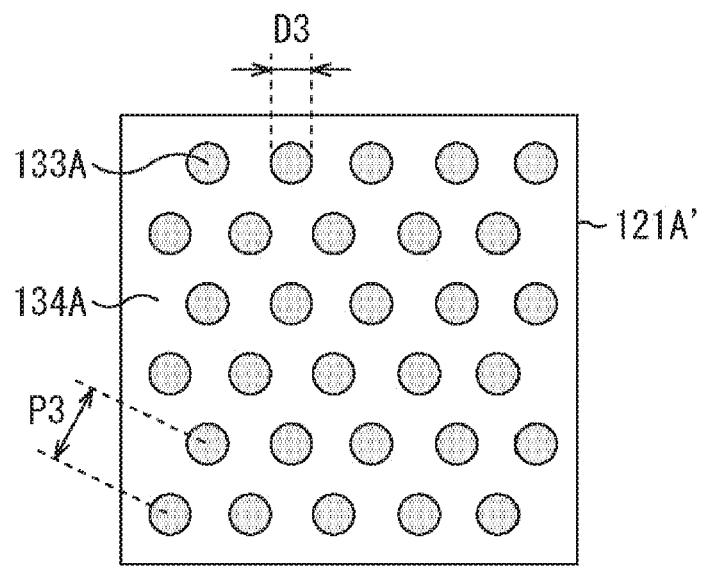
FIGS. 13A and 13B are diagrams showing example configurations of plasmon filters having a dot array structure.
Figure 13B:
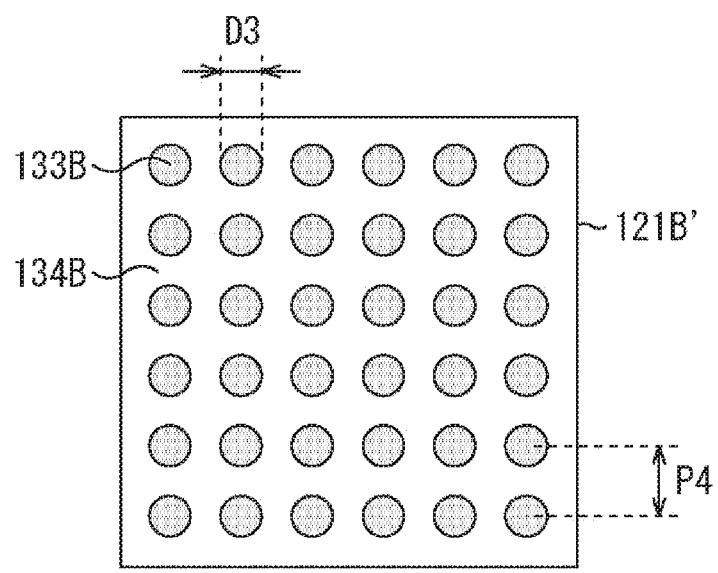

Referring now to FIGS. 13A and 13B, a plasmon filter having a dot array structure is described.

A plasmon filter 121A' in FIG. 13A is formed with a negative-positive reversed structure of the plasmon resonator of the plasmon filter 121A in FIG. 5, or is formed with a plasmon resonator in which dots 133A are formed in a honeycomb fashion in a dielectric layer 134A. Spaces between the respective dots 133A are filled with the dielectric layer 134A.

The plasmon filter 121A' absorbs light in a predetermined wavelength band, and therefore, is used as a complementary color filter. The wavelength band of light to be absorbed by the plasmon filter 121A' (this wavelength band will be hereinafter referred to as the absorption band) varies depending on the pitch P3 between adjacent dots 133A (this pitch will be hereinafter referred to as the dot pitch) and the like. Further, the diameter D3 of the dots 133A is adjusted in accordance with the dot pitch P3.

A plasmon filter 121B' in FIG. 13B is formed with a negative-positive reversed structure of the plasmon resonator of the plasmon filter 121B of FIG. 11A, or is formed with a plasmon resonator structure in which dots 133B are formed in an orthogonal matrix in a dielectric layer 134B. Spaces between the respective dots 133B are filled with the dielectric layer 134B.

The absorption band of the plasmon filter 121B' varies depending on a dot pitch P4 between adjacent dots 133B or the like. Further, the diameter D3 of the dots 133B is adjusted in accordance with the dot pitch P4.

Figure 14:
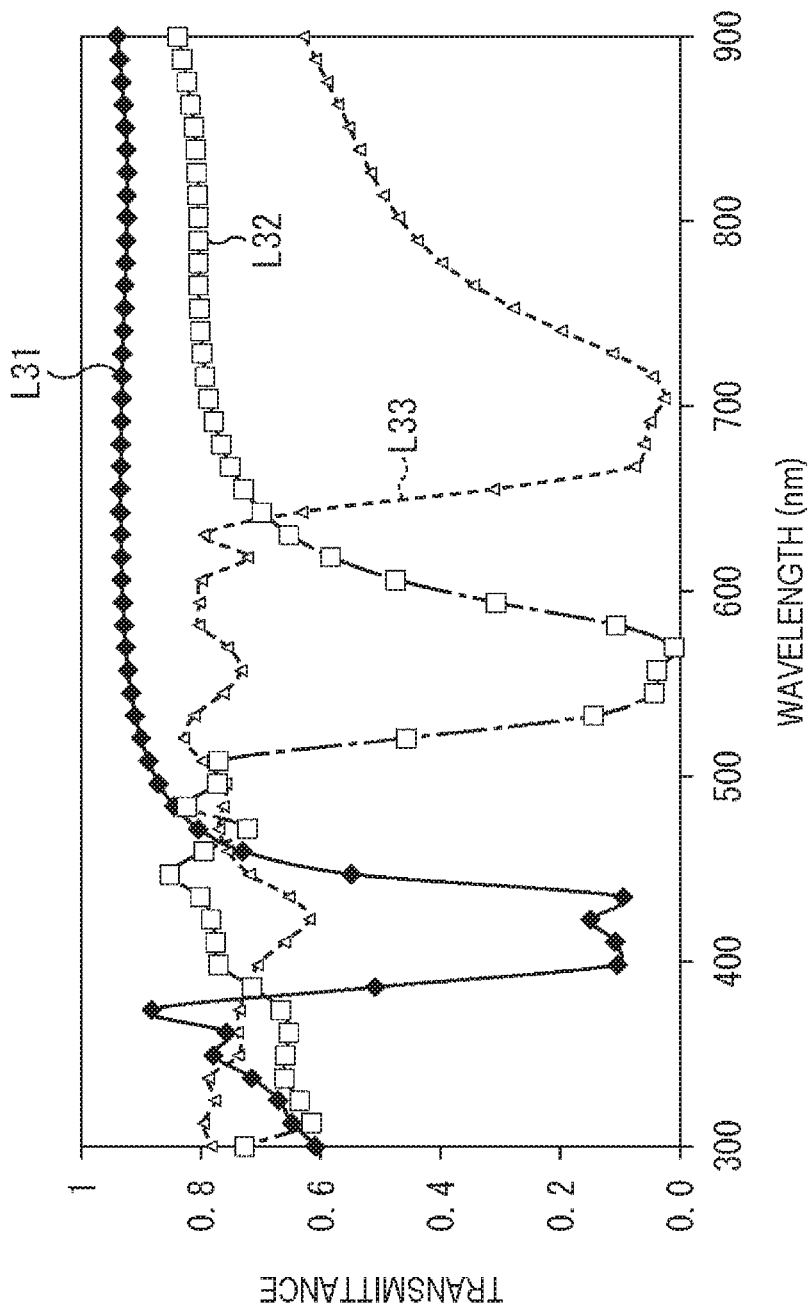
FIG. 14 is a graph showing an example of the spectral characteristics of a plasmon filter having a dot array structure.

FIG. 14 is a graph showing an example of the spectral characteristics in a case where the dot pitch P3 of the plasmon filter 121A' in FIG. 13A is varied. In the graph, the abscissa axis indicates wavelength (unit: nm), and the ordinate axis indicates transmittance. A line L31 indicates the spectral characteristics in a case where the dot pitch P3 is set at 300 nm, a line L32 indicates the spectral characteristics in a case where the dot pitch P3 is set at 400 nm, and a line L33 indicates the spectral characteristics in a case where the dot pitch P3 is set at 500 nm.

As shown in this drawing, as the dot pitch P3 becomes narrower, the absorption band of the plasmon filter 121A' shifts to the shorter wavelength side. As the dot pitch P3 becomes wider, the absorption band of the plasmon filter 121A' shifts to the longer wavelength side.

Further, in a plasmon filter having an array structure, rectangular squares can be used in place of circular dots.

Figure 15:
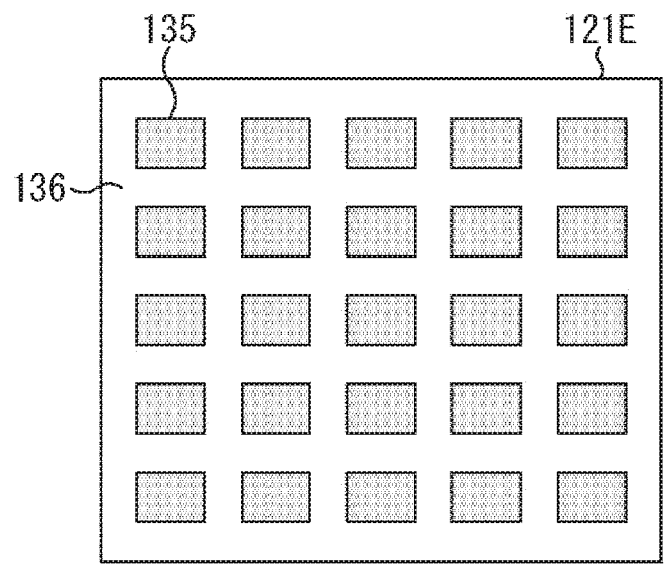
FIG. 15 is a diagram showing an example configuration of a plasmon filter having a square array structure.

FIG. 15 shows a plasmon filter 121E having a square array structure using rectangular squares 135. That is, the plasmon filter 121E has the rectangular squares 135 in place of the circular dots 133B of the plasmon filter 121B' in FIG. 13B. Spaces between the respective squares 135 are filled with a dielectric layer 136.

Likewise, the circular dots 133A of the plasmon filter 121A' in FIG. 13A can be replaced with rectangular squares.

Note that, in any of plasmon filters having a hole array structure, a dot array structure, or a square array structure, it is possible to adjust the transmission band or the absorption band simply by adjusting the pitch in the planar direction of the holes, the dots, or the squares. Accordingly, the pitch of the holes, the dots, or the squares is simply adjusted in the lithography process, for example, so that the transmission band or the absorption band can be set individually for each pixel, and the filters are turned into multiple colors in a fewer number of steps.

Further, the thickness of a plasmon filter is about 100 to 500 nm, which is almost similar to that of an organic color filter, and its affinity to the process is high.

Figure 16:
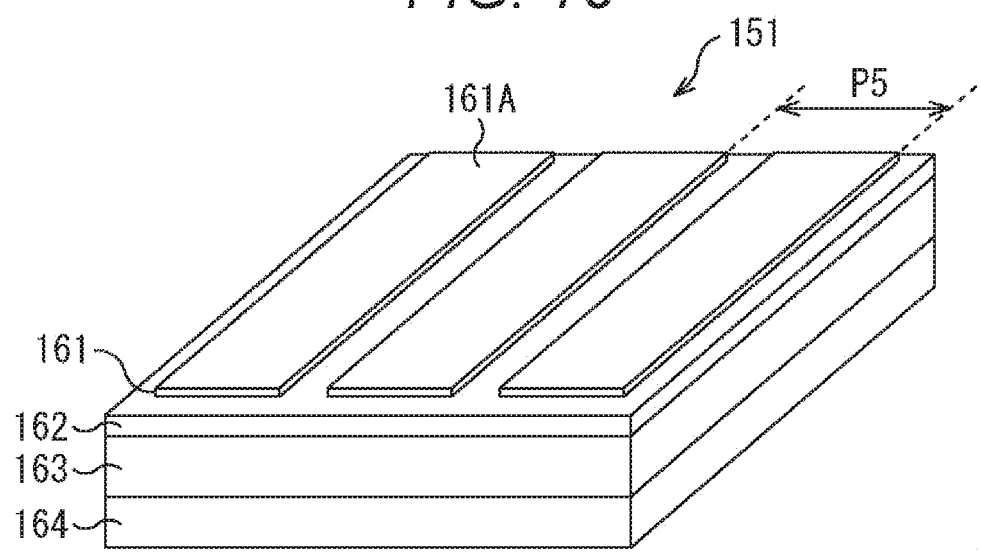
FIG. 16 is a diagram showing an example configuration of a plasmon filter using GMR.

Furthermore, a plasmon filter 151 using guided-mode resonant (GMR) shown in FIG. 16 can be used as a narrowband filter NB.

In the plasmon filter 151, a conductor layer 161, a SiO2 film 162, a SiN film 163, and a SiO2 substrate 164 are stacked in this order from the top. The conductor layer 161 is included in the filter layer 103 in FIG. 4, for example, and the SiO2 film 162, the SiN film 163, and the SiO2 substrate 164 are included in the interlayer film 104 in FIG. 4, for example.

In the conductor layer 161, rectangular conductive thin films 161A including aluminum, for example, are arranged at a predetermined pitch P5, so that the long sides of the conductive thin films 161A are adjacent to one another. The transmission band of the plasmon filter 151 then varies depending on the pitch P5 or the like.

Figure 17:
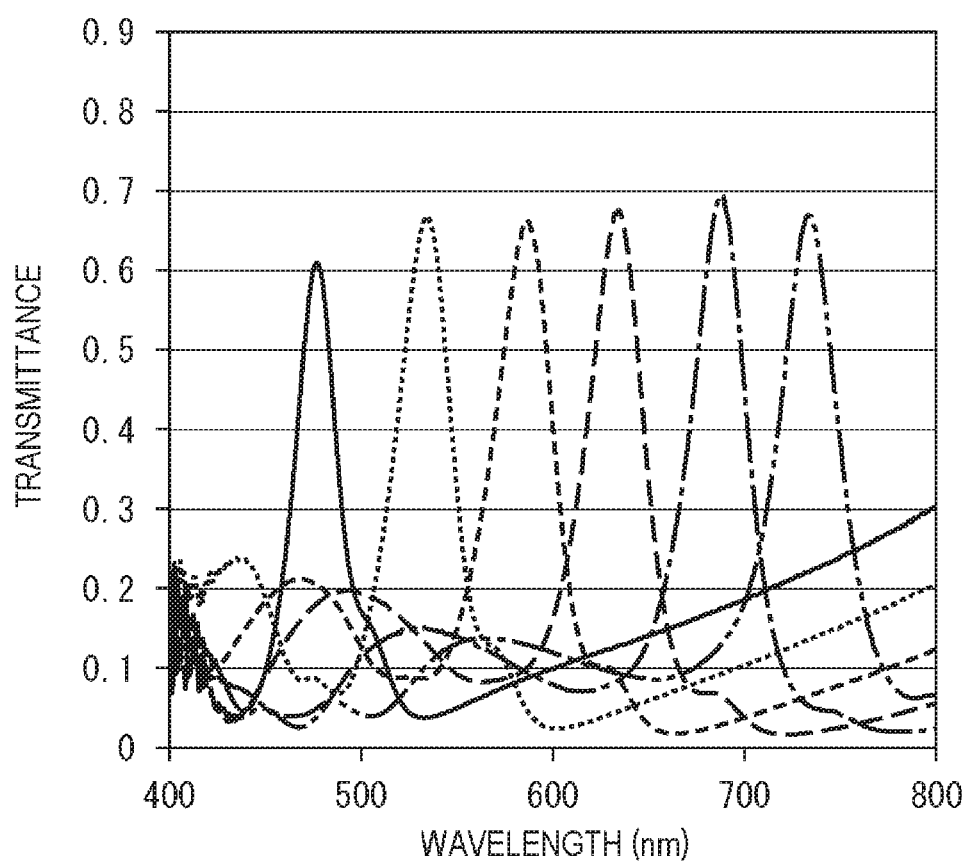
FIG. 17 is a graph showing an example of the spectral characteristics of a plasmon filter using GMR.

FIG. 17 is a graph showing an example of the spectral characteristics of the plasmon filter 151 in a case where the pitch P5 is varied. In the graph, the abscissa axis indicates wavelength (unit: nm), and the ordinate axis indicates transmittance. This example shows an example of the spectral characteristics in a case where the pitch P5 is varied from 280 nm to 480 nm in six kinds at intervals of 40 nm, and the width of the slits between the adjacent conductive thin films 161A is set at ¼ of the pitch P5. Further, the waveform having the shortest peak wavelength in the transmission band indicates the spectral characteristics in a case where the pitch P5 is set at 280 nm. As the pitch P5 becomes wider, the peak wavelength becomes longer. That is, as the pitch P5 becomes narrower, the transmission band of the plasmon filter 151 shifts to the shorter wavelength side. As the pitch P5 becomes wider, the transmission band of the plasmon filter 151 shifts to the longer wavelength side.

Like plasmon filters having the hole array structure and the dot array structure described above, this plasmon filter 151 using GMR also has a high affinity to organic color filters.

Figure 18A:
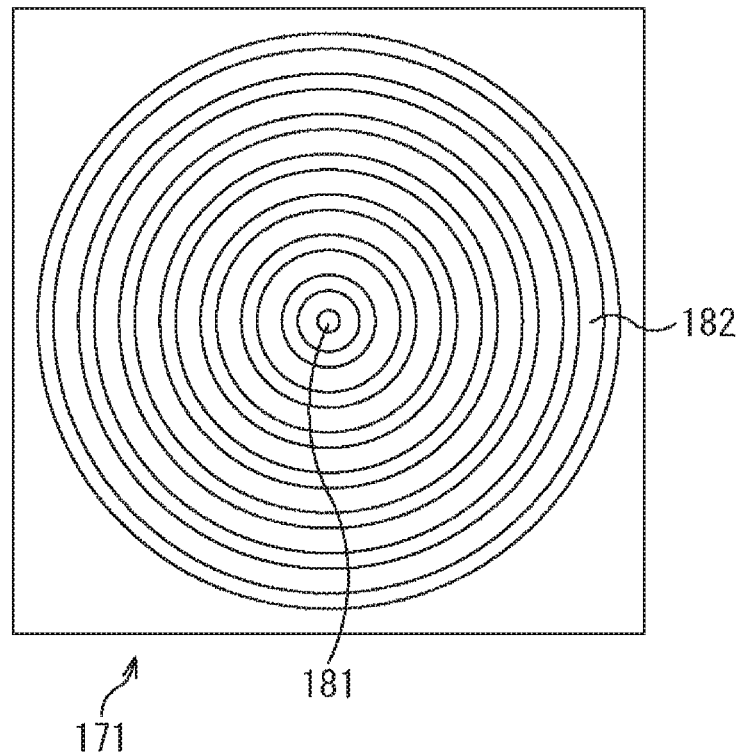
FIGS. 18A and 18B are diagrams showing an example configuration of a plasmon filter using a bull's-eye structure.
Figure 18B:
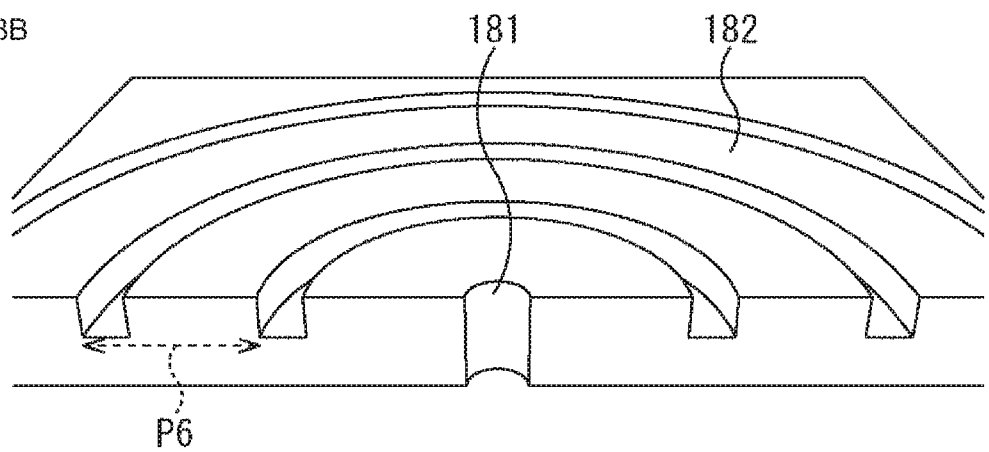

Further, a plasmon filter 171 using a bull's-eye structure shown in FIGS. 18A and 18B can be used as a narrowband filter NB. A bull's-eye structure has this name, because of its resemblance to a dart target or a bow and arrow target.

As shown in FIG. 18A, the plasmon filter 171 having a bull's-eye structure has a through hole 181 at its center, and includes a plurality of protruding portions 182 formed concentrically around the through hole 181. That is, the plasmon filter 171 having a bull's-eye structure has a shape to which a metallic diffraction grating structure that causes plasmon resonance is applied.

The plasmon filter 171 having a bull's-eye structure has characteristics similar to those of the plasmon filter 151 using GMR. That is, in a case where the pitch between the protruding portions 182 is a pitch P6, the plasmon filter 171 has the following characteristics: the transmission band shifts to the shorter wavelength side as the pitch P6 becomes narrower, and the transmission band shifts to the longer wavelength side as the pitch P6 becomes wider.

2. First Embodiment of the Present Technology

Next, a first embodiment of the present technology is described, with reference to FIGS. 19, 20A, 20B, 21, 22A, 22B, 23, 24A, 24B, 25, 26, 27, 28, and 29.

Figure 19:
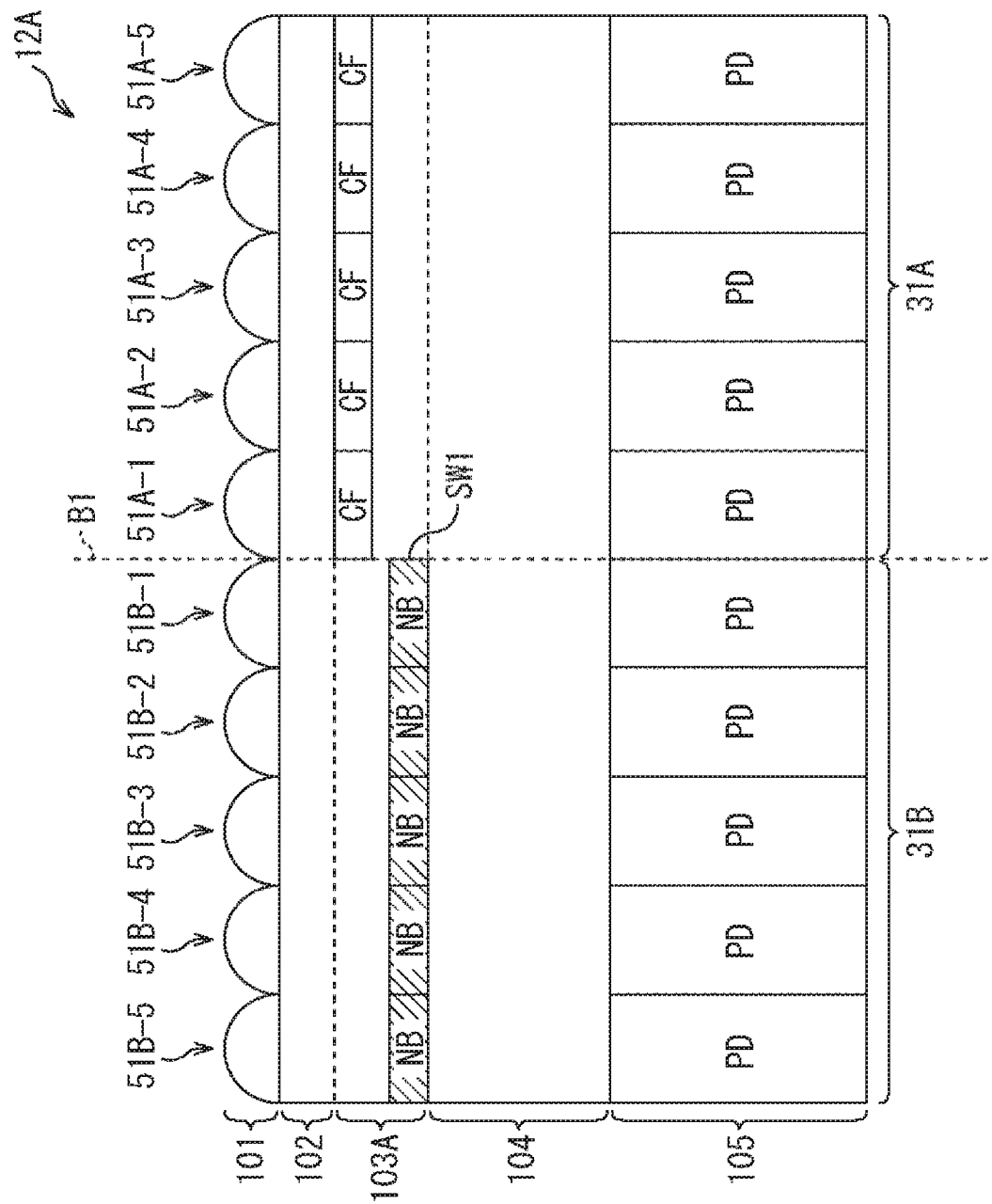
FIG. 19 is a cross-sectional view schematically showing a first embodiment of the filter layer of an imaging device.

FIG. 19 schematically shows an example configuration of an imaging device 12A including a filter layer 103A that is the first embodiment of the filter layer 103 in FIG. 4. FIG. 19 shows a cross-section of the ten pixels: normal pixels 51A-1 through 51A-5, and narrowband pixels 51B-1 through 51B-5 in the vicinity of the boundary portion B1 between the normal pixel region 31A and the narrowband pixel region 31B of the imaging device 12A.

In the filter layer 103A, the color filters CF in the normal pixel region 31A are disposed in a different layer from that of the narrowband filters NB in the narrowband pixel region 31B. Specifically, the color filters CF are disposed at higher locations than the narrowband filters NB, or are disposed closer to the light incident surface of the imaging device 12A.

Although not shown in the drawing, a reflected light reduction unit 31C is disposed in the interlayer film 102 or the filter layer 103A, as described later with reference to FIG. 20B.

Figure 20A:
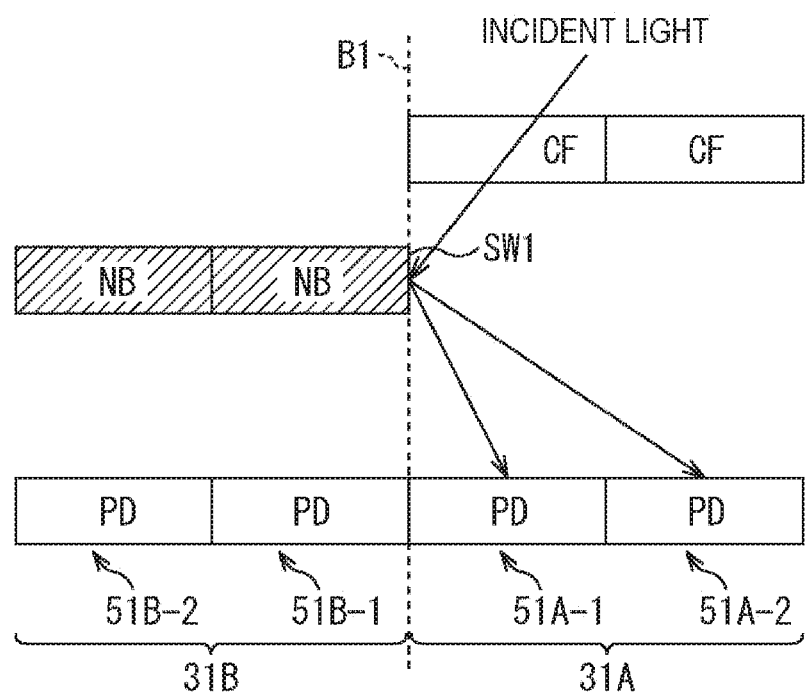
FIGS. 20A and 20B are diagrams schematically showing the first embodiment of a reflected light reduction unit for the filter layer shown in FIG. 19.

FIG. 20A is an enlarged view of the region around the filter layer 103A in the vicinity of the boundary portion B1 of the imaging device 12A shown in FIG. 19, and schematically shows the condition of incident light in a case where the reflected light reduction unit 31C is not adopted.

As shown in this drawing, part of the incident light that has passed through the color filters CF enters the sidewall SW1 of the narrowband filter NB at the boundary portion B1, and is irregularly reflected by the sidewall SW1. The light reflected irregularly by the sidewall SW1 then enters the photodiodes PD of the normal pixels 51A in the vicinity of the boundary portion B1. As a result, noise due to the reflected light is generated in the normal pixels 51A in the vicinity of the boundary portion B1, and the characteristics of the imaging device 12A (particularly, the normal pixels 51A in the vicinity of the boundary portion B1) are degraded.

Figure 20B:
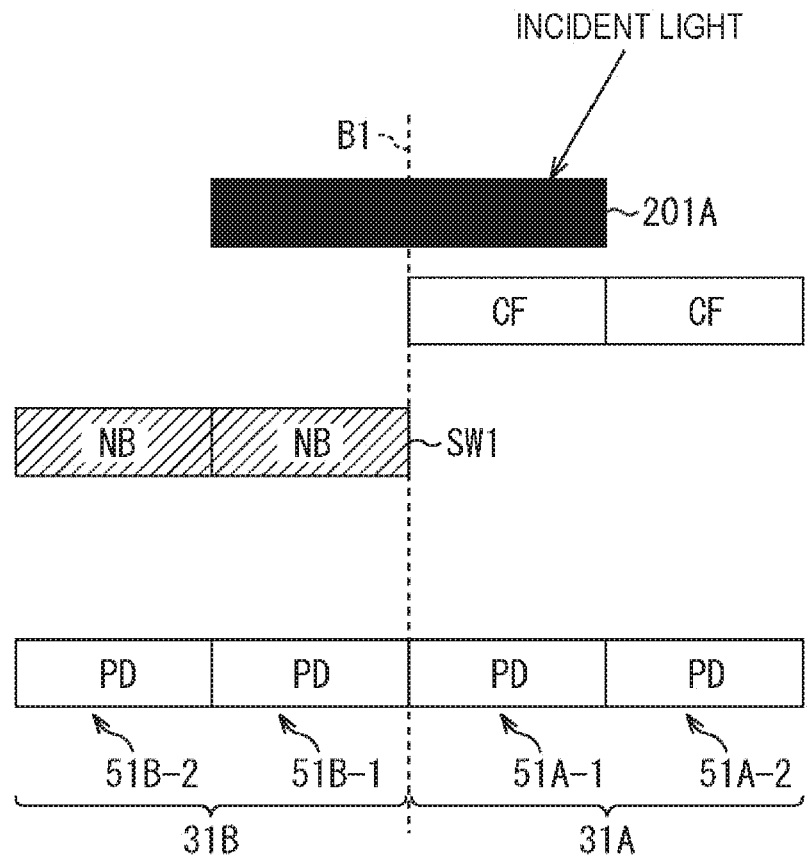

On the other hand, a black filter 201A that is a light absorber is provided as the reflected light reduction unit 31C, for example, as shown in FIG. 20B.

The black filter 201A is formed with a black resist, carbon black, or the like, for example. The black filter 201A is disposed at a higher location than the color filters CF and the narrowband filters NB (or is disposed closer to the light incident surface of the imaging device 12A than the color filters CF and the narrowband filters NB) at the boundary portion B1. The black filter 201A also overlaps at least part of the normal pixel 51A-1 and the narrowband pixel 51B-1 adjacent to the boundary portion B1, and covers at least part of the light incident surface of the color filter CF of the normal pixel 51A-1 and the light incident surface of the narrowband filter NB of the narrowband pixel 51B-1.

This black filter 201A absorbs incident light traveling toward the sidewall SW1, and reduces entrance of the incident light to the sidewall SW1. As a result, the light reflected by the sidewall SW1 is reduced, and thus, entrance of the reflected light to the photodiodes PD in the normal pixel region 31A and degradation of the characteristics of the normal pixels 51A are reduced.

Like FIG. 19, FIG. 21 schematically shows an example configuration of an imaging device 12B including a filter layer 103B that is a second embodiment of the filter layer 103 in FIG. 4.

In the filter layer 103B, the color filters CF in the normal pixel region 31A are disposed in the same layer as the narrowband filters NB in the narrowband pixel region 31B.

Although not shown in the drawing, a reflected light reduction unit 31C is disposed in the interlayer film 102 or the filter layer 103B, as described later with reference to FIG. 22B.

Figure 22A:
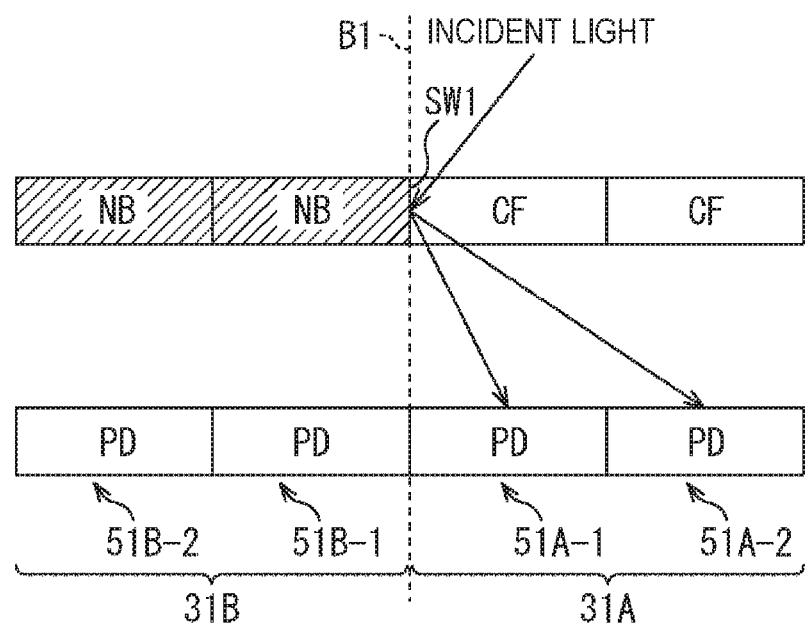
FIGS. 22A and 22B are diagrams schematically showing the first embodiment of the reflected light reduction unit for the filter layer shown in FIG. 21.

Like FIG. 20A, FIG. 22A schematically shows the condition of incident light in a case where the reflected light reduction unit 31C is not adopted.

As shown in this drawing, part of the incident light that has entered the color filters CF enters the sidewall SW1 of the narrowband filter NB at the boundary portion B1, and is irregularly reflected by the sidewall SW1. The light reflected irregularly by the sidewall SW1 then enters the photodiodes PD of the normal pixels 51A in the vicinity of the boundary portion B1. As a result, noise due to the reflected light is generated in the normal pixels 51A in the vicinity of the boundary portion B1, and the characteristics of the imaging device 12B (particularly, the normal pixels 51A in the vicinity of the boundary portion B1) are degraded.

Figure 22B:
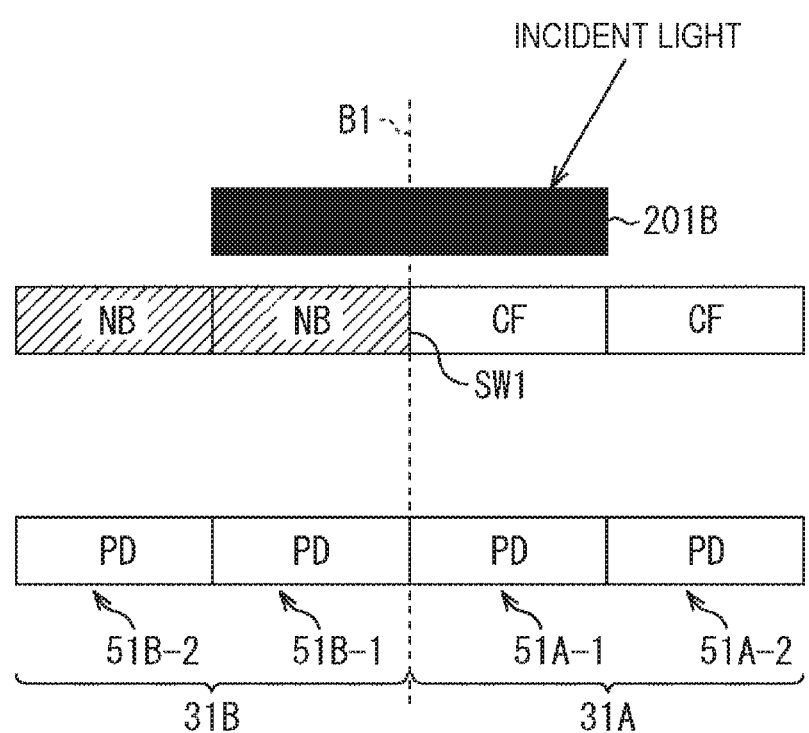

On the other hand, as shown in FIG. 22B, a black filter 201B similar to the black filter 201A in FIG. 20B is provided as the reflected light reduction unit 31C.

The black filter 201B is disposed at a higher location than the color filters CF and the narrowband filters NB (or is disposed closer to the light incident surface of the imaging device 12B than the color filters CF and the narrowband filters NB) at the boundary portion B1. The black filter 201B also overlaps at least part of the normal pixel 51A-1 and the narrowband pixel 51B-1 adjacent to the boundary portion B1, and covers at least part of the light incident surface of the color filter CF of the normal pixel 51A-1 and the light incident surface of the narrowband filter NB of the narrowband pixel 51B-1.

This black filter 201B absorbs incident light traveling toward the sidewall SW1, and reduces entrance of the incident light to the sidewall SW1. As a result, the light reflected by the sidewall SW1 is reduced, and thus, entrance of the reflected light to the photodiodes PD in the normal pixel region 31A and degradation of the characteristics of the normal pixels 51A are reduced.

Like FIG. 19 and FIG. 21, FIG. 23 schematically shows an example configuration of an imaging device 12C including a filter layer 103C that is a third embodiment of the filter layer 103 in FIG. 4.

In the filter layer 103C, while the narrowband filters NB are disposed in the narrowband pixel region 31B, any color filter CF is not provided in the normal pixel region 31A.

Although not shown in the drawing, a reflected light reduction unit 31C is disposed in the interlayer film 102 or the filter layer 103C, as described later with reference to FIG. 24B.

Figure 24A:
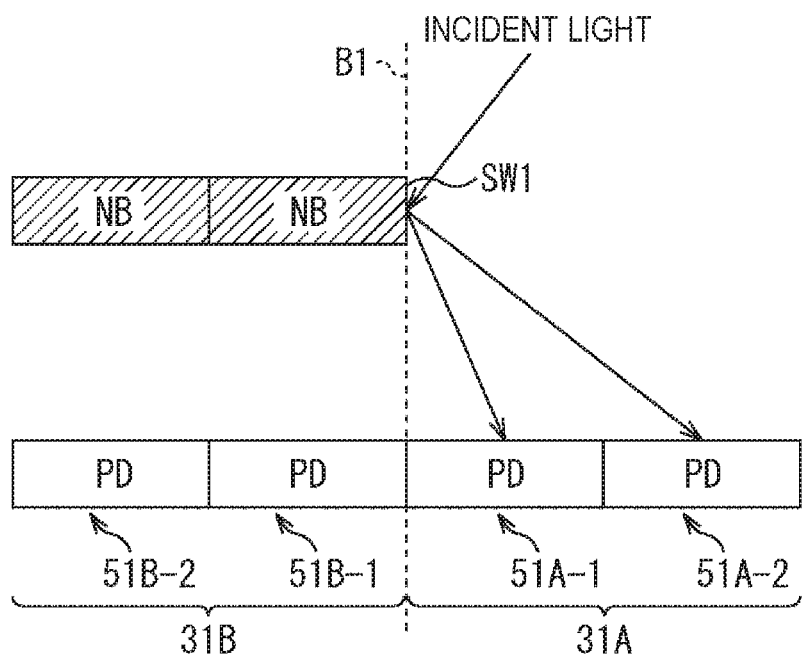
FIGS. 24A and 24B is a are diagrams schematically showing the first embodiment of the reflected light reduction unit for the filter layer shown in FIG. 23.

Like FIGS. 20A and FIG. 22A, FIG. 24A schematically shows the condition of incident light in a case where the reflected light reduction unit 31C is not adopted.

As shown in this drawing, light that has entered the sidewall SW1 of the narrowband filter NB at the boundary portion B1 is irregularly reflected by the sidewall SW1. The light reflected irregularly by the sidewall SW1 then enters the photodiodes PD of the normal pixels 51A in the normal pixel region 31A in the vicinity of the boundary portion B1. As a result, noise due to the reflected light is generated in the normal pixels 51A in the vicinity of the boundary portion, and the characteristics of the imaging device 12C (particularly, the normal pixels 51A in the vicinity of the boundary portion B1) are degraded.

Figure 24B:
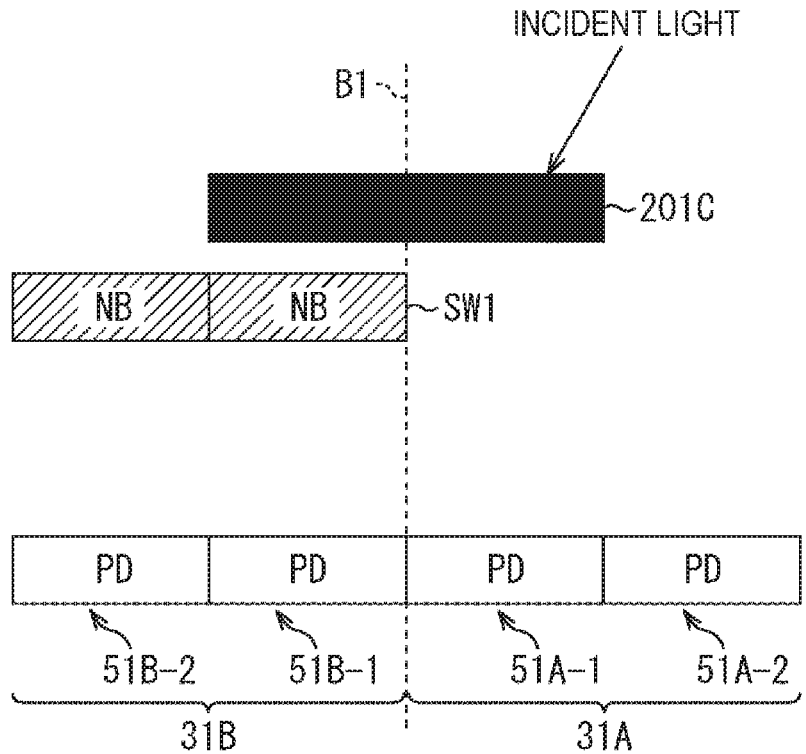

On the other hand, as shown in FIG. 24B, a black filter 201C similar to the black filter 201A in FIG. 20B and the black filter 201B in FIG. 22B is provided as the reflected light reduction unit 31C.

The black filter 201C is disposed at a higher location than the narrowband filters NB (or is disposed closer to the light incident surface of the imaging device 12C than the narrowband filters NB) at the boundary portion B1. The black filter 201C also overlaps at least part of the normal pixel 51A-1 and the narrowband pixel 51B-1 adjacent to the boundary portion B1, and covers at least part of the light incident surface of the color filter CF of the normal pixel 51A-1 and the light incident surface of the narrowband filter NB of the narrowband pixel 51B-1.

This black filter 201C absorbs incident light traveling toward the sidewall SW1, and reduces entrance of the incident light to the sidewall SW1. As a result, the light reflected by the sidewall SW1 is reduced, and thus, entrance of the reflected light to the photodiodes PD in the normal pixel region 31A and degradation of the characteristics of the normal pixels 51A are reduced.

Note that the width of the black filters 201A through 201C in a direction perpendicular to the boundary portion B1 can be changed as appropriate. However, if the width of the black filters 201A through 201C is too great, the invalid pixel region that no incident light enters becomes larger. On the other hand, if the width of the black filters 201A through 201C is too small, the reflected light reduction effect becomes smaller.

Therefore, the width of the black filters 201A through 201C is preferably adjusted as appropriate in accordance with the reflectance of the metallic thin films of the narrowband filters NB or the like. For example, the width of the black filters 201A through 201C is preferably set within a range of two to four pixels around the boundary portion B1.

Figure 25:
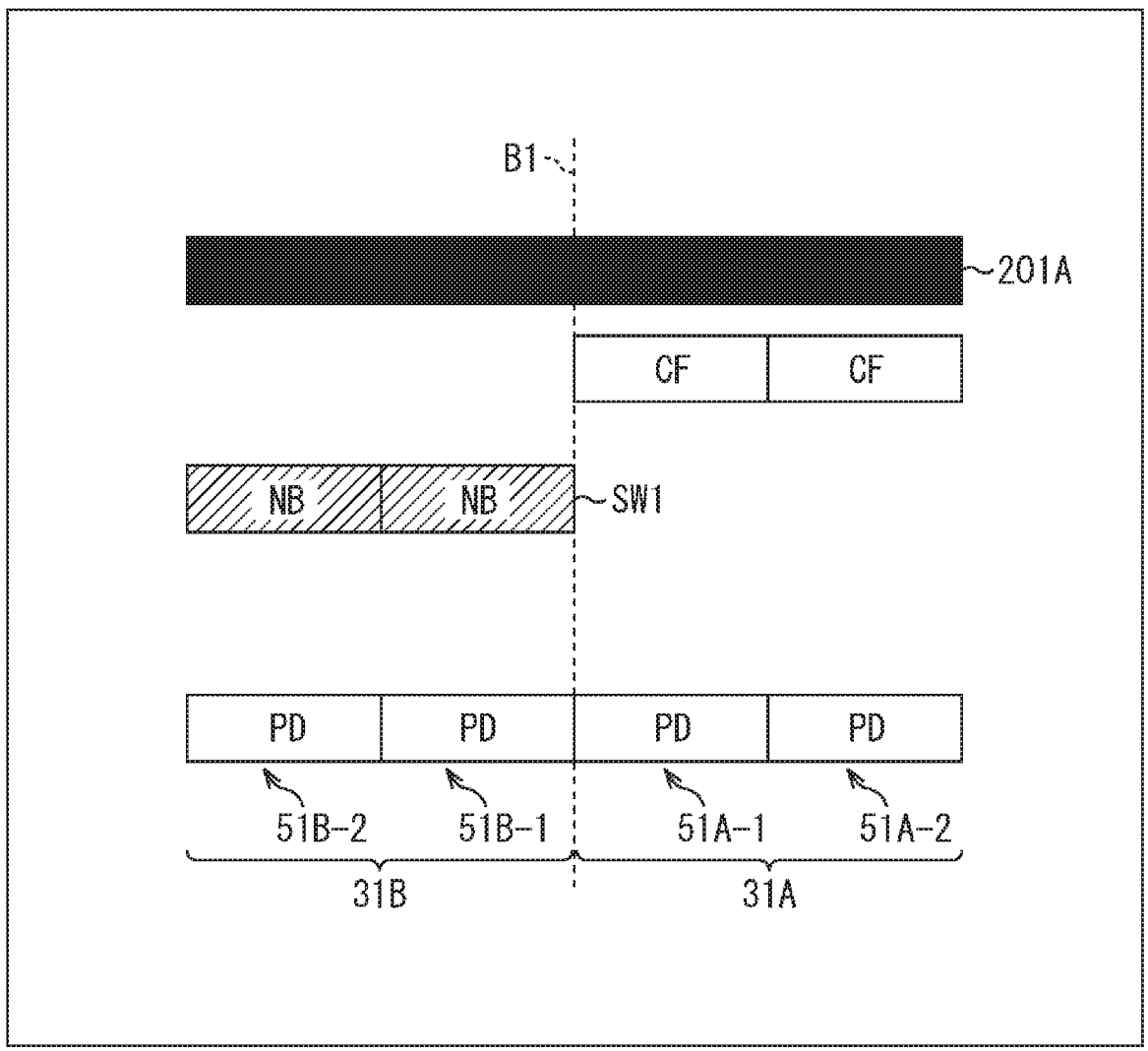
FIG. 25 is a diagram showing an example width of a black filter.

For example, FIG. 25 shows an example in which the black filter 201A covers the four pixels 51 of two normal pixels 51A and two narrowband pixels 51B around the boundary portion B1.

Figure 26:
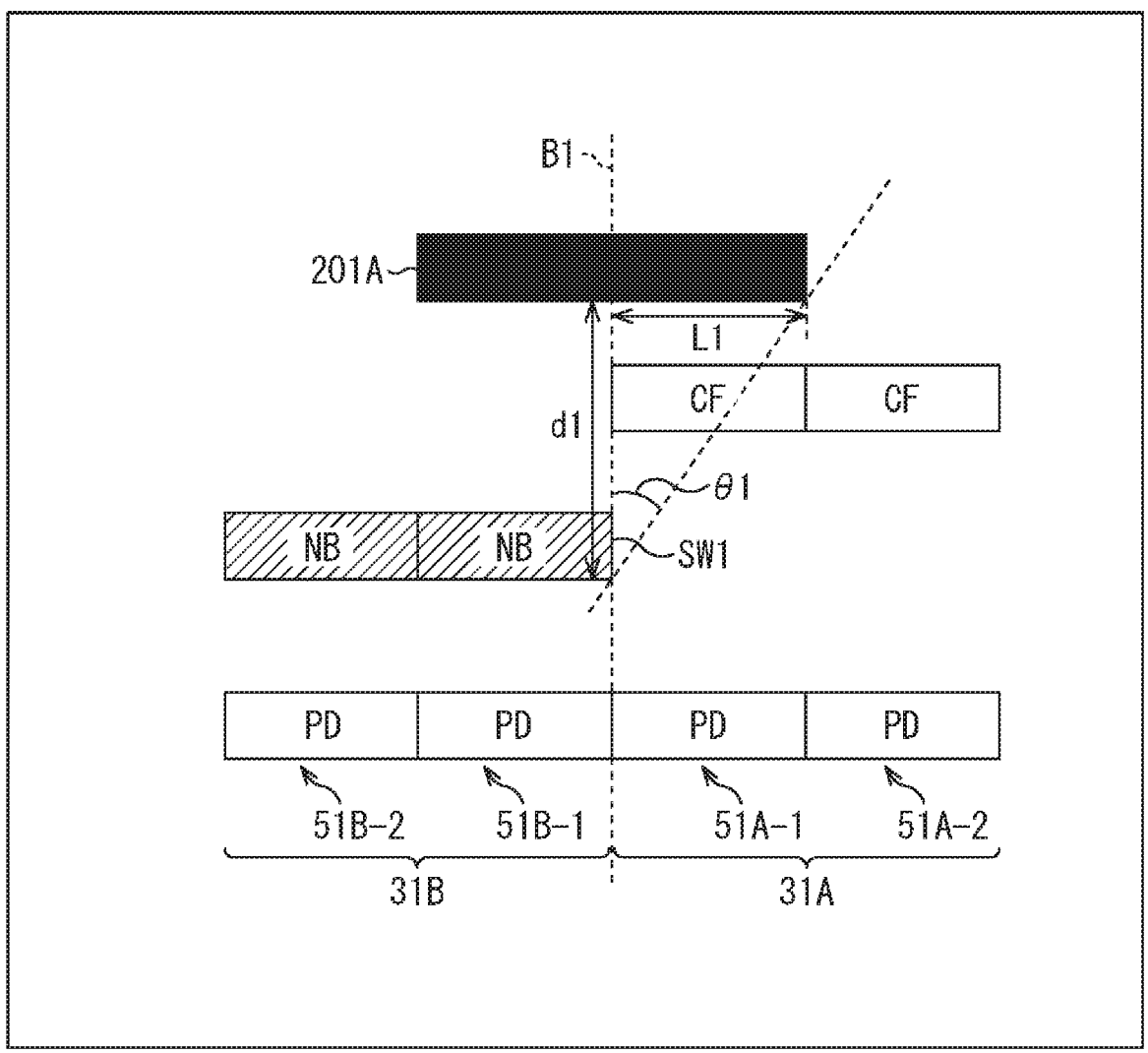
FIG. 26 is a diagram for explaining the conditions for the amount of protrusion of the black filter.

Referring now to FIG. 26, the conditions for the amount of protrusion L1 of the black filter 201A from the boundary portion B1 into the normal pixel region 31A (the width of the black filter 201A in the normal pixel region 31A) are described.

Note that a distance d1 indicates the distance between the bottom surface of the black filter 201A on the opposite side from the light incident surface and the bottom surface of the narrowband filter NB on the opposite side from the light incident surface. An angle θ1 indicates the angle between the sidewall SW1 and the plane extending through the side of the bottom surface of the black filter 201A on the side of the normal pixel region 31A and the side of the bottom surface of the sidewall SW1.

Further, where the assumed value of the maximum incident angle of incident light on the sidewall SW1 is represented by θmax, the amount of protrusion L1 is preferably set so that θ1≥θmax is satisfied. That is, the amount of protrusion L1 is preferably set so as to satisfy Equation (7) shown below.

$$L1 \geq d \times \tan(\theta \max) \tag{7}$$

Note that the maximum incident angle θmax is expressed by Equation (8) shown below.

$$\theta \max = (CRA + f\text{-number maximum incident angle of light}) \times \alpha \tag{8}$$

CRA represents the principal ray angle of light incident on the normal pixel 51A-1 adjacent to the boundary portion B1. The f-number maximum incident angle of light is the maximum value of the angles of respective light rays incident on the normal pixel 51A-1 to the principal ray in a case where the f-number of the optical system 11 is the minimum. In the equation, α is a coefficient equal to or greater than 1, and is a coefficient obtained by adding 1 to a margin that is set with the production variations of the optical systems 11, the on-chip microlenses 101, and the like taken into account.

Note that CRA in Equation (8) varies with the image height, and therefore, the maximum incident angle θmax also varies with the image height. In view of this, a maximum incident angle θmax may be determined for each image height, and the amount of protrusion L1 may be varied with the image height on the basis of the determined maximum incident angle θmax, for example. Alternatively, the maximum incident angle θmax may be fixed at the minimum value in the imaging device 12, for example, and the amount of protrusion L1 may be fixed, regardless of the image height.

For the black filter 201B in FIG. 22B and the black filter 201C in FIG. 24B, the conditions for the amount of protrusion L1 are determined by a similar calculation process.

Figure 27:
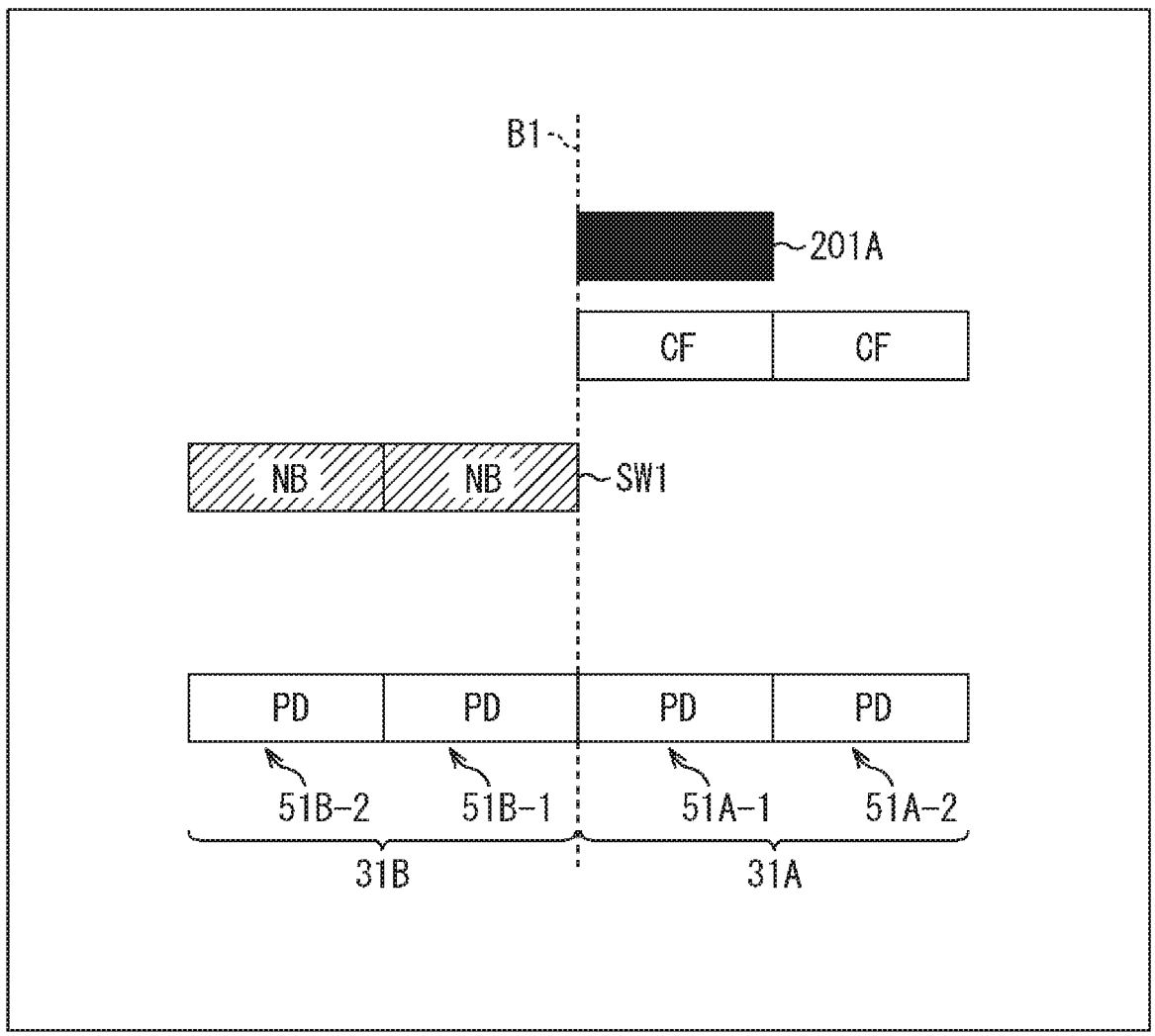
FIG. 27 is a diagram showing a first modification of the black filter.

Alternatively, the black filter 201A may cover only the normal pixel region 31A, as shown in FIG. 27, for example.

Figure 28:
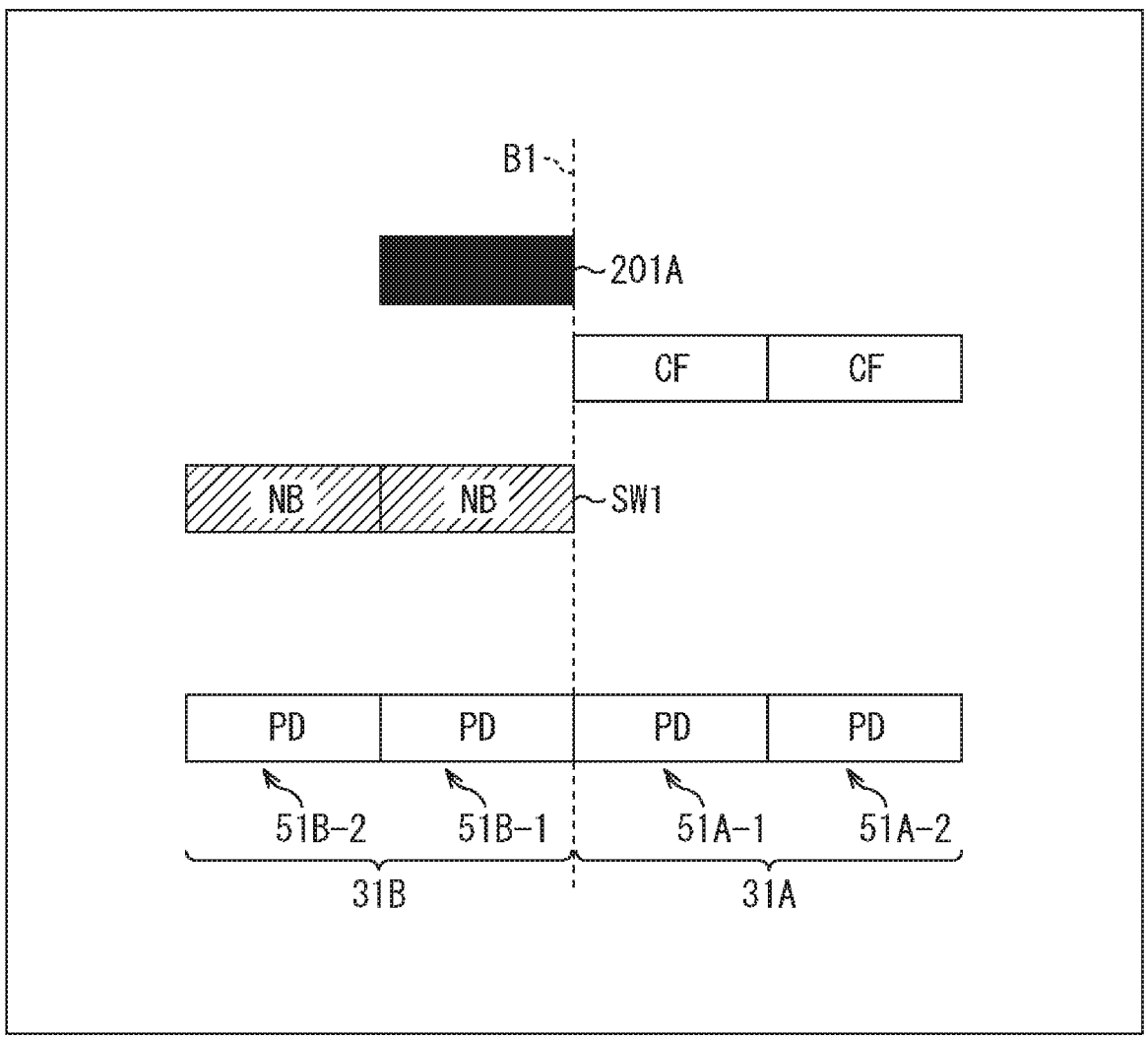
FIG. 28 is a diagram showing a second modification of the black filter.

Further, as shown in FIG. 28, the black filter 201A may cover only the narrowband pixel region 31B, for example.

The contents of FIGS. 27 and 28 can be similarly applied to the black filter 201B in FIG. 22B and the black filter 201C in FIG. 24B.

Figure 29:
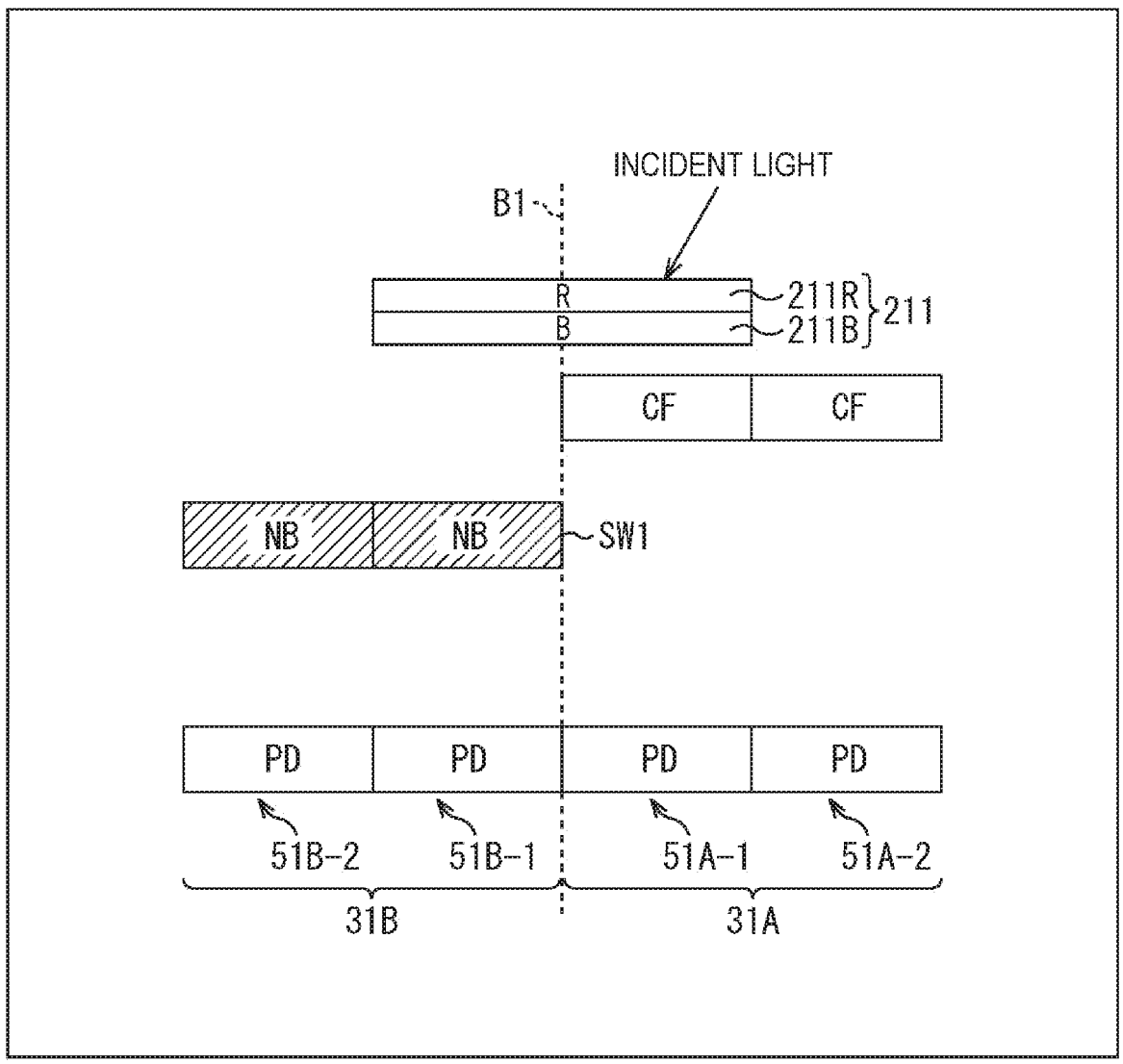
FIG. 29 is a diagram showing a modification of the first embodiment of the reflected light reduction unit.

Further, as shown in FIG. 29, an optical filter 211 in which two kinds of color filters, which are a red filter 211R and a blue filter 211B, are stacked may be used in place of the black filter 201A, for example.

The red filter 211R does not transmit light having a wavelength near blue, and the blue filter 21B does not transmit light having a wavelength near red. Accordingly, as the red filter 211R and the blue filter 211B are stacked, an effect equal to that of the black filter 201A can be expected.

Note that the optical filter 211 can also be used in place of the black filter 201B in FIG. 22B and the black filter 201C in FIG. 24B.

3. Second Embodiment of the Present Technology

Figure 30:
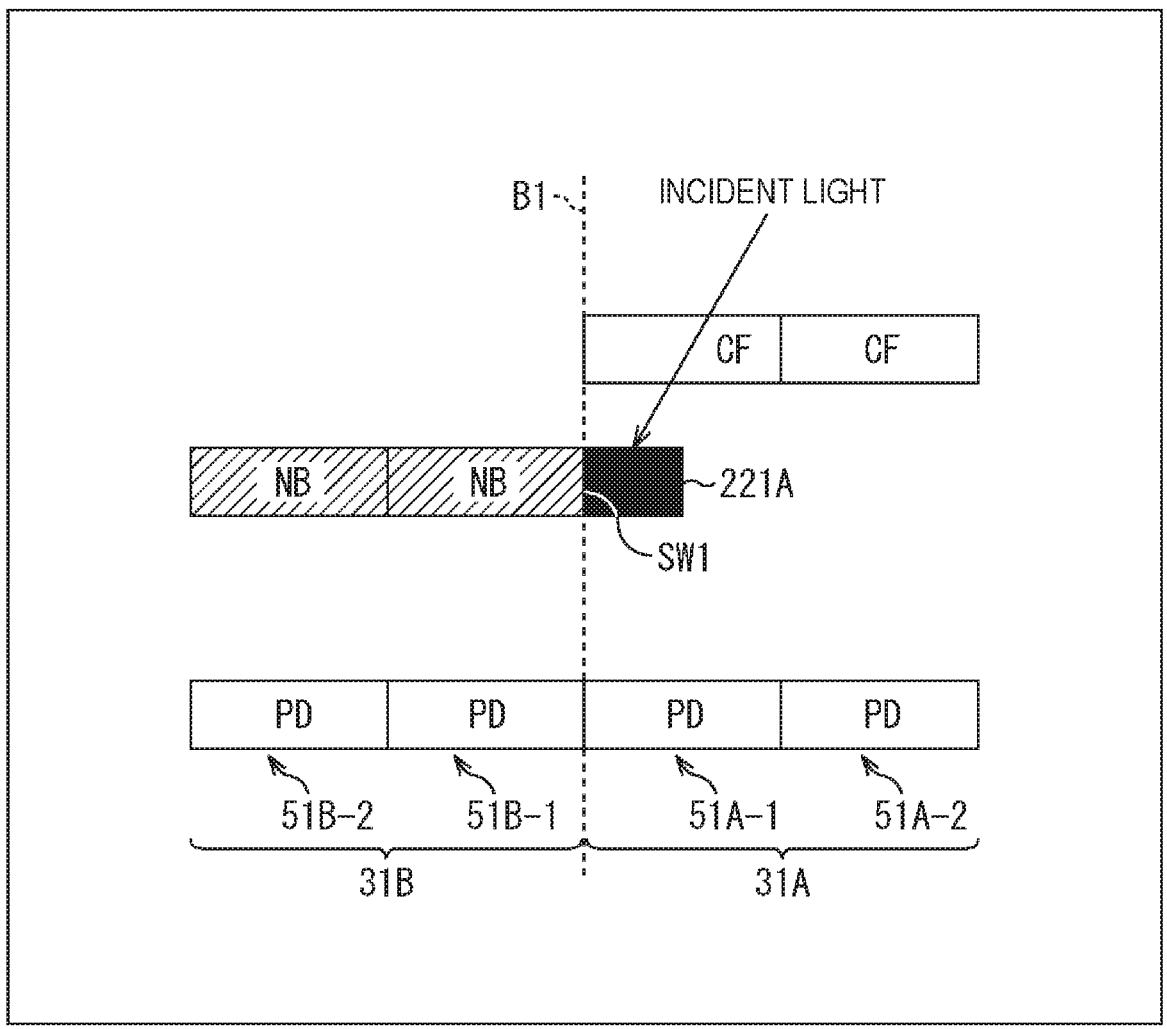
FIG. 30 is a diagram schematically showing a second embodiment of the reflected light reduction unit for the filter layer shown in FIG. 19.
Figure 31:
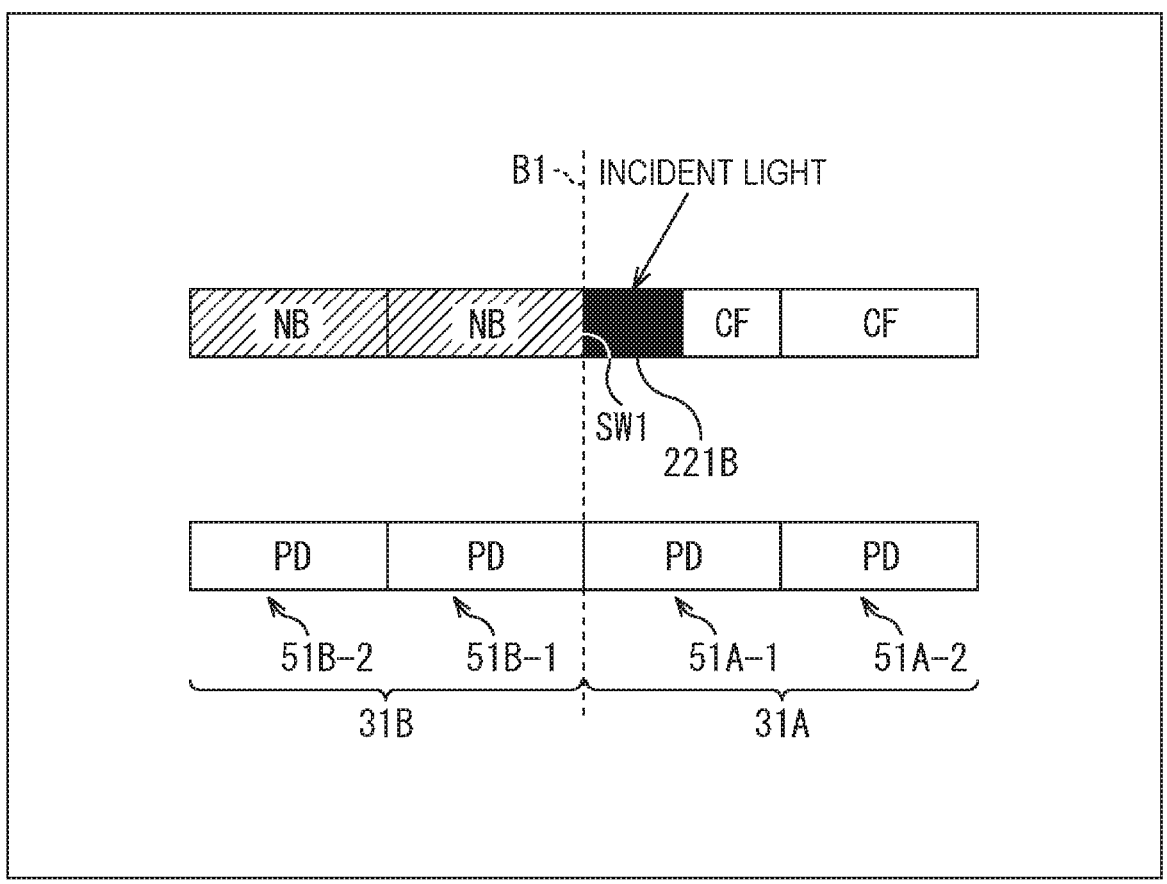
FIG. 31 is a diagram schematically showing the second embodiment of the reflected light reduction unit for the filter layer shown in FIG. 21.
Figure 32:
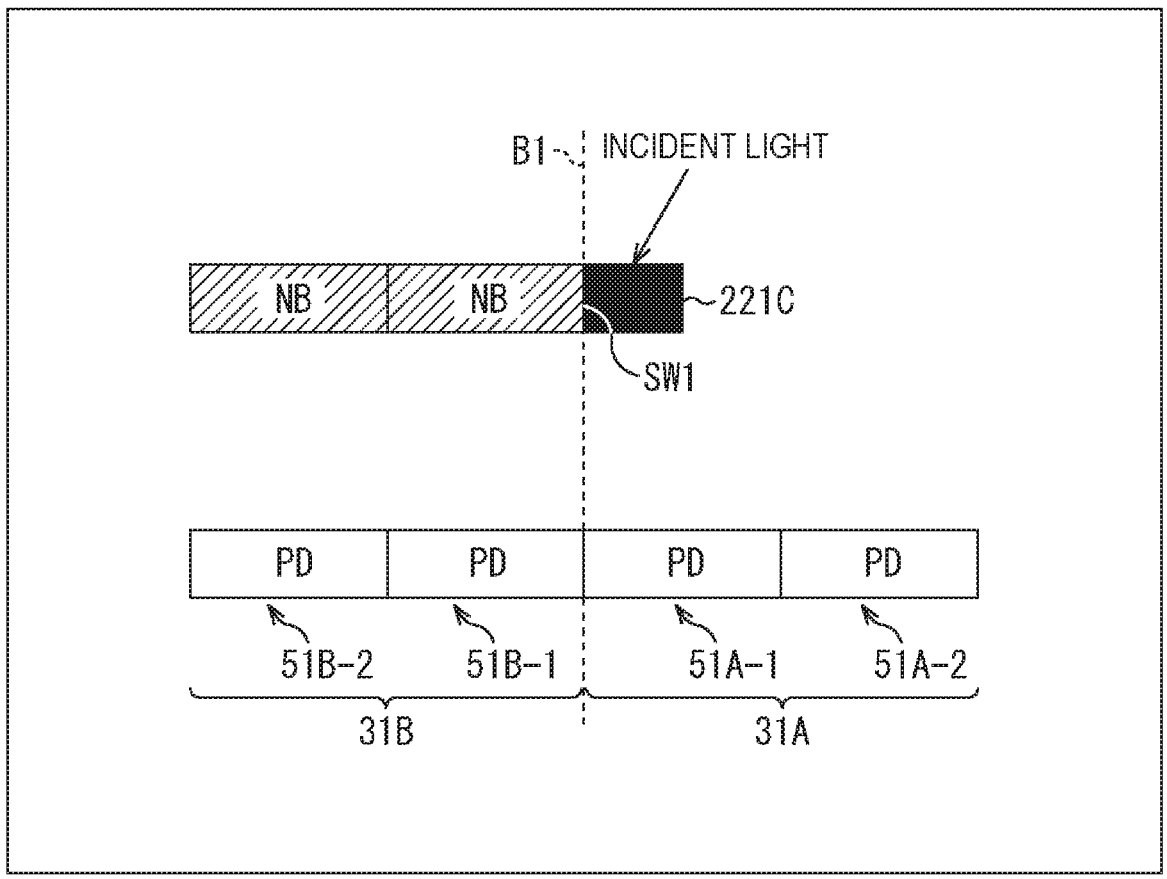
FIG. 32 is a diagram schematically showing the second embodiment of the reflected light reduction unit for the filter layer shown in FIG. 23.

Next, a second embodiment of the present technology is described, with reference to FIGS. 30 through 32.

FIG. 30 shows the second embodiment of the reflected light reduction unit 31C in the imaging device 12A shown in FIG. 19. The embodiment in FIG. 30 differs from the embodiment in FIG. 20B in that a black filter 221A is adopted in place of the black filter 201A.

The black filter 221A covers the sidewall SW1 of the narrowband filter NB at the boundary portion B1, and absorbs light incident on the sidewall SW1. As a result, the light reflected by the sidewall SW1 is reduced, and thus, entrance of the reflected light to the photodiodes PD in the normal pixel region 31A and degradation of the characteristics of the normal pixels 51A are reduced.

FIG. 31 shows the second embodiment of the reflected light reduction unit 31C in the imaging device 12B shown in FIG. 21. The embodiment in FIG. 31 differs from the embodiment in FIG. 22B in that a black filter 221B is adopted in place of the black filter 201B.

The black filter 221B covers the sidewall SW1 of the narrowband filter NB between the color filter CF of the normal pixel 51A-1 and the narrowband filter NB of the narrowband pixel 51B-1 adjacent to the boundary portion B1, and absorbs light incident on the sidewall SW1. As a result, the light reflected by the sidewall SW1 is reduced, and thus, entrance of the reflected light to the photodiodes PD in the normal pixel region 31A and degradation of the characteristics of the normal pixels 51A are reduced.

FIG. 32 shows the second embodiment of the reflected light reduction unit 31C in the imaging device 12C shown in FIG. 23. The embodiment in FIG. 32 differs from the embodiment in FIG. 24B in that a black filter 221C is adopted in place of the black filter 201C.

The black filter 221C covers the sidewall SW1 of the narrowband filter NB at the boundary portion B1, and absorbs light incident on the sidewall SW1. As a result, the light reflected by the sidewall SW1 is reduced, and thus, entrance of the reflected light to the photodiodes PD in the normal pixel region 31A and degradation of the characteristics of the normal pixels 51A are reduced.

Note that an optical filter in which a red filter and a blue filter are stacked as in the optical filter 211 in FIG. 29 may be used in place of the black filters 221A through 221C in FIGS. 30 through 32.

Further, a black filter, or a light absorption filter formed with an optical filter in which a red filter and a blue filter are stacked does not need to cover the entire sidewall SW1 of the narrowband filter NB at the boundary portion B1, and may cover only part of the sidewall SW1.

Alternatively, a light absorption filter may cover not only the sidewall SW1 of the narrowband filter NB, but also the incident surface and/or the bottom surface of the narrowband filter NB. In this case, the light absorption filter may cover part of the incident surface and/or the bottom surface of the narrowband filter NB, or may cover the entire surface within a range of one to several pixels.

4. Third Embodiment of the Present Technology

Figure 33:
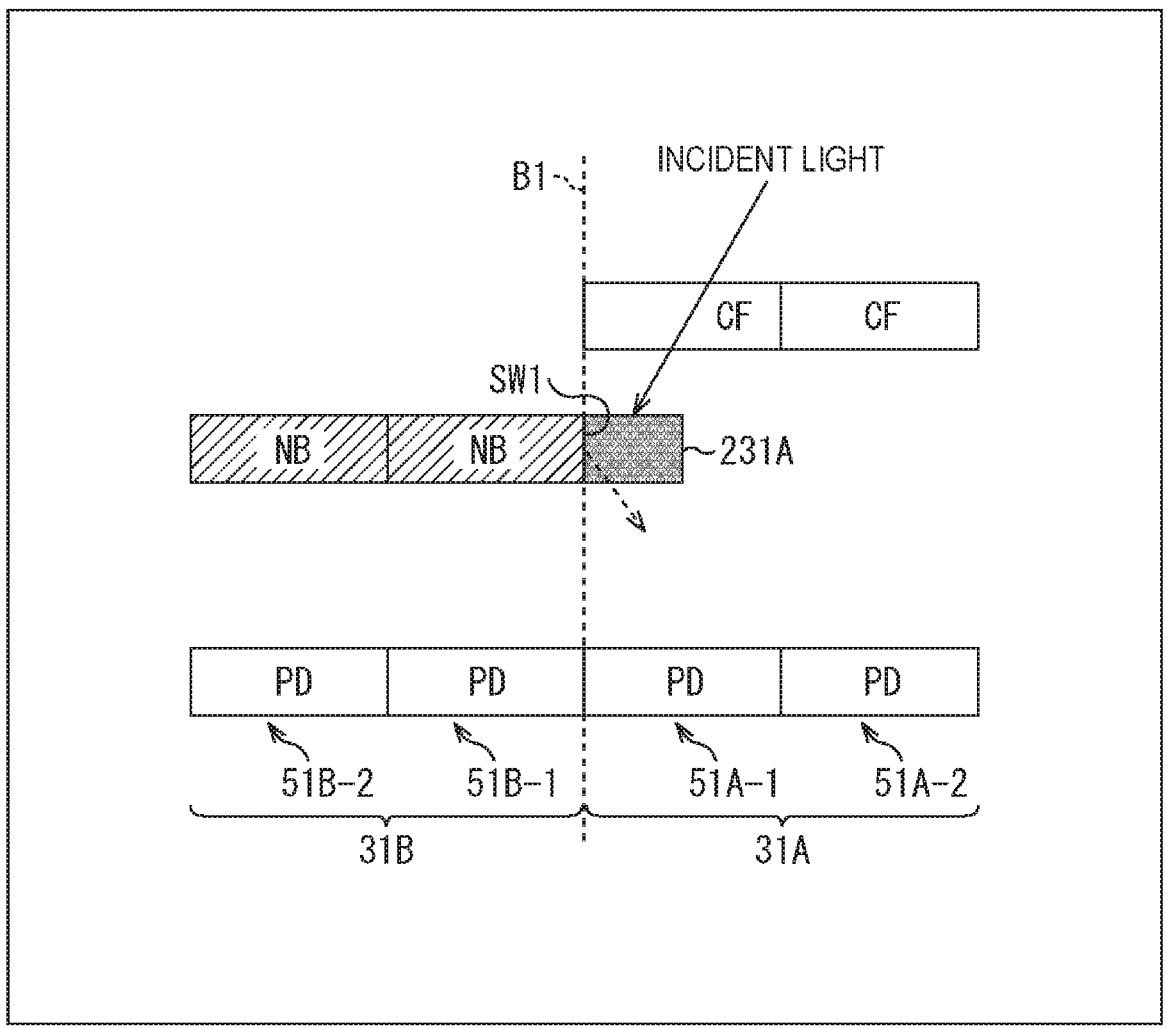
FIG. 33 is a diagram schematically showing a third embodiment of the reflected light reduction unit for the filter layer shown in FIG. 19.
Figure 34:
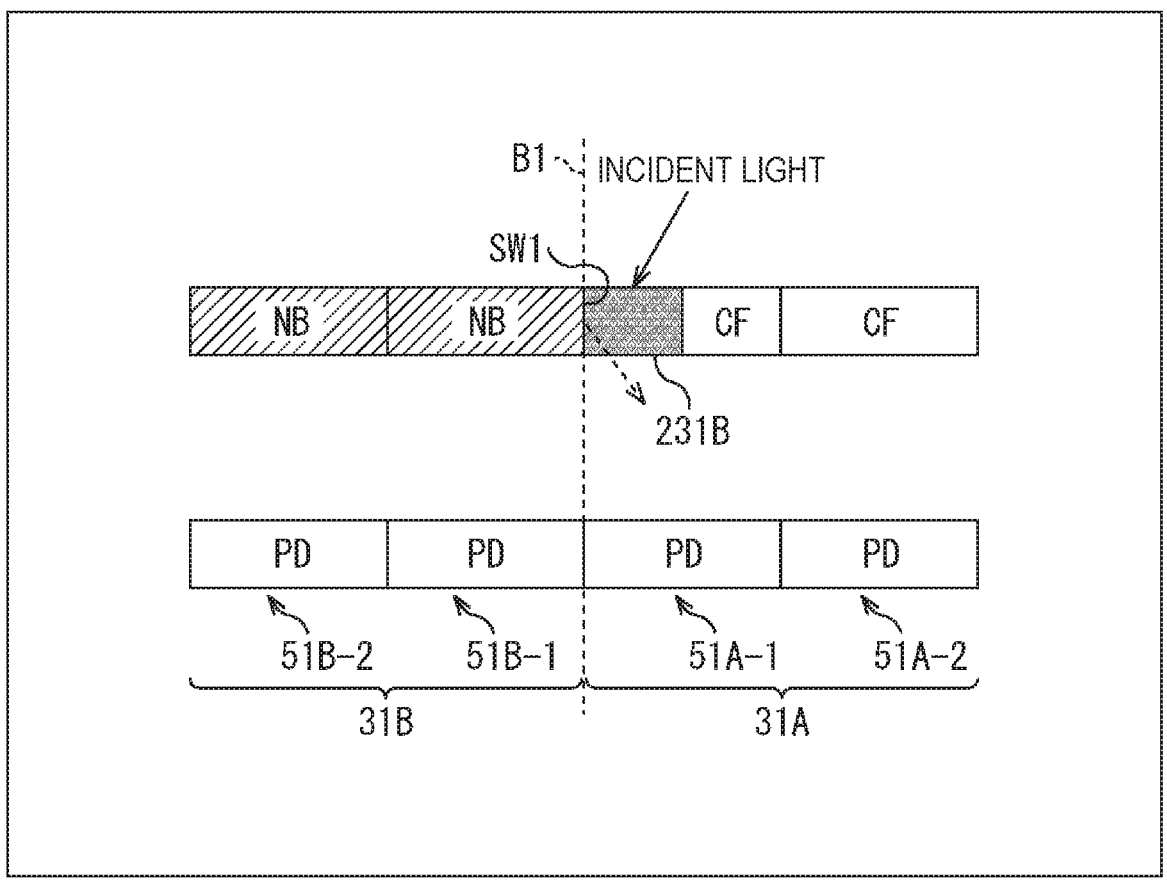
FIG. 34 is a diagram schematically showing the third embodiment of the reflected light reduction unit for the filter layer shown in FIG. 21.
Figure 35:
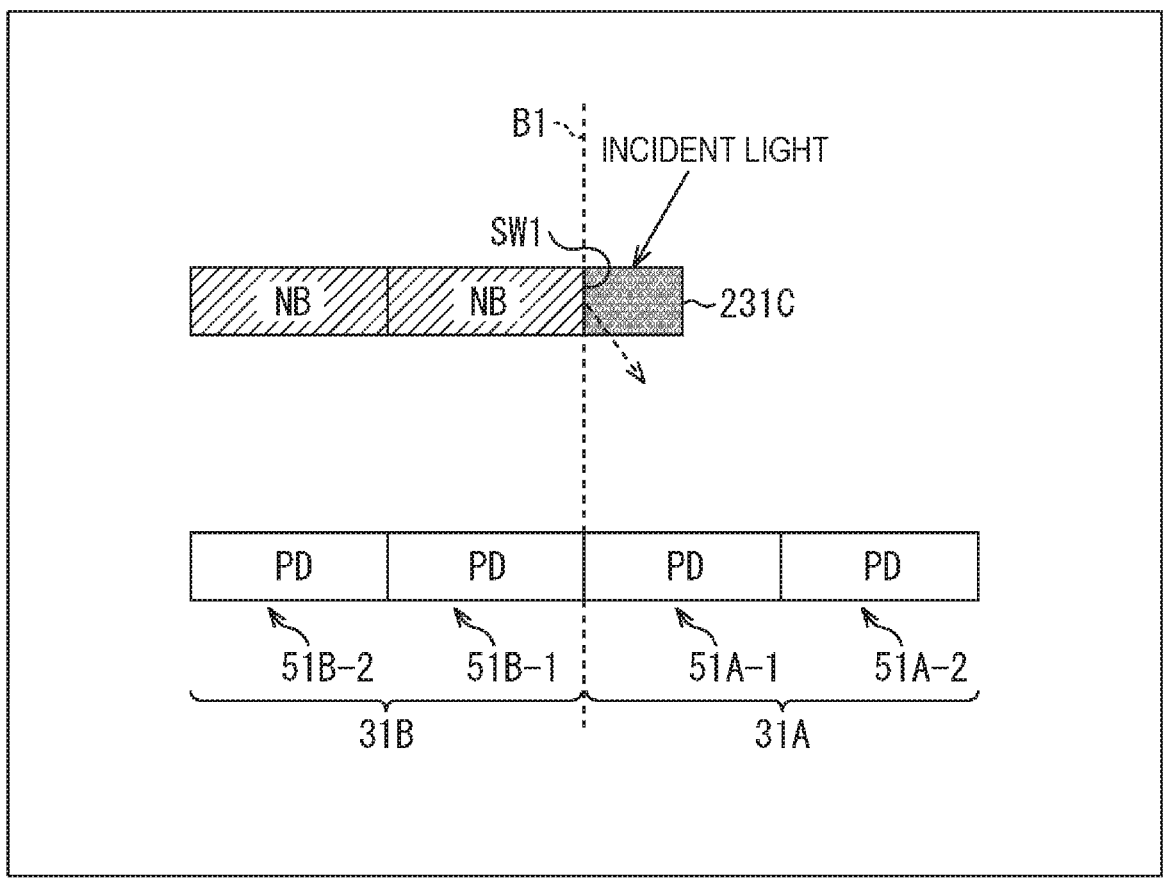
FIG. 35 is a diagram schematically showing the third embodiment of the reflected light reduction unit for the filter layer shown in FIG. 23.

Next, a third embodiment of the present technology is described, with reference to FIGS. 33 through 35.

FIG. 33 shows the third embodiment of the reflected light reduction unit 31C in the imaging device 12A shown in FIG. 19. The embodiment in FIG. 33 differs from the embodiment in FIG. 30 in that the black filter 221A is replaced with a low-reflection film 231A.

Like the black filter 221A, the low-reflection film 231A covers the sidewall SW1 of the narrowband filter NB at the boundary portion B1. The low-reflection film 231A is formed with a material having a lower reflectance than at least the metal forming the narrowband filters NB, such as titanium nitride, tungsten, or titanium, for example.

With this arrangement, reflection of light incident on the sidewall SW1 is reduced by the low-reflection film 231A. As a result, entrance of the reflected light to the photodiodes PD in the normal pixel region 31A and degradation of the characteristics of the normal pixels 51A are reduced.

FIG. 34 shows the third embodiment of the reflected light reduction unit 31C in the imaging device 12B shown in FIG. 21. The embodiment in FIG. 34 differs from the embodiment in FIG. 31 in that a low-reflection film 231B is adopted in place of the black filter 221B.

Like the black filter 221B, the low-reflection film 231B covers the sidewall SW1 of the narrowband filter NB between the color filter CF of the normal pixel 51A-1 and the narrowband filter NB of the narrowband pixel 51B-1 adjacent to the boundary portion B1. With this arrangement, reflection of light incident on the sidewall SW1 is reduced by the low-reflection film 231B. As a result, entrance of the reflected light to the photodiodes PD in the normal pixel region 31A and degradation of the characteristics of the normal pixels 51A are reduced.

FIG. 35 shows the third embodiment of the reflected light reduction unit 31C in the imaging device 12C shown in FIG. 23. The embodiment in FIG. 35 differs from the embodiment in FIG. 32 in that a low-reflection film 231C is adopted in place of the black filter 221C.

Like the black filter 221C, the low-reflection film 231C covers the sidewall SW1 of the narrowband filter NB at the boundary portion B1. With this arrangement, reflection of light incident on the sidewall SW1 is reduced by the low-reflection film 231C. As a result, entrance of the reflected light to the photodiodes PD in the normal pixel region 31A and degradation of the characteristics of the normal pixels 51A are reduced.

Note that the low-reflection films 231A through 231C do not need to cover the entire sidewall SW1 of the narrowband filter NB at the boundary portion B1, and may cover only part of the sidewall SW1.

Alternatively, the low-reflection films 231A through 231C may cover not only the sidewall SW1 of the narrowband filter NB, but also the incident surface and/or the bottom surface of the narrowband filter NB. In this case, the low-reflection films 231A through 231C may cover part of the incident surface and/or the bottom surface of the narrowband filter NB, or may cover the entire surface within a range of one to several pixels.

5. Fourth Embodiment of the Present Technology

Next, a fourth embodiment of the present technology is described, with reference to FIGS. 36 through 39.

Figure 36:
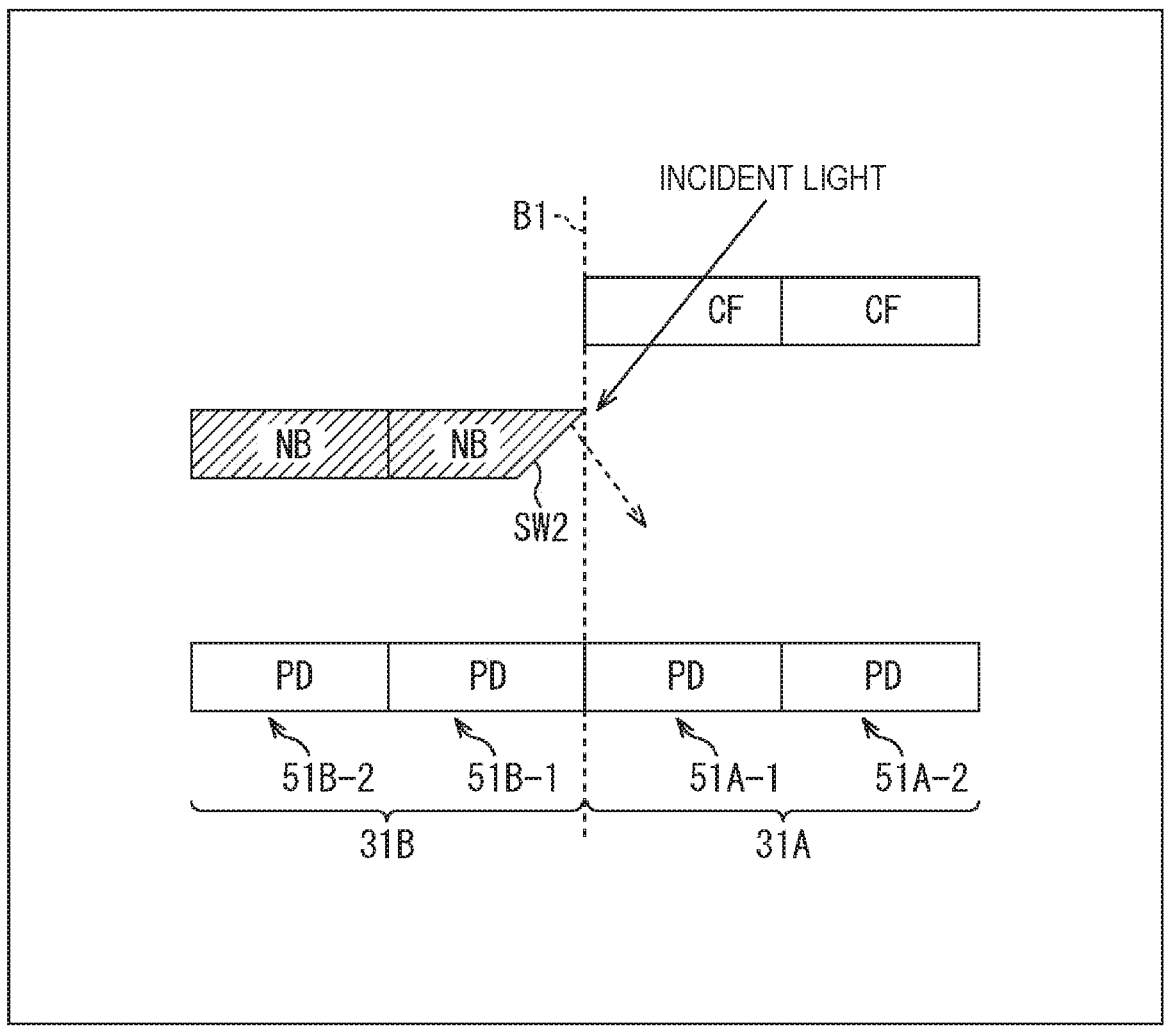
FIG. 36 is a diagram schematically showing a fourth embodiment of the reflected light reduction unit for the filter layer shown in FIG. 19.

FIG. 36 shows the fourth embodiment of the reflected light reduction unit 31C in the imaging device 12A shown in FIG. 19.

In this embodiment, the sidewall SW2 of the narrowband filter NB at the boundary portion B1 is inclined with respect to the boundary portion B1. The sidewall SW2 is inclined so as to move away from the boundary portion B1 toward the narrowband pixel region 31B (the narrowband pixel 51B-1) as the distance from the light incident surface of the narrowband filter NB becomes longer.

With this arrangement, light directly incident on the sidewall SW2 decreases, and reflection of the incident light by the sidewall SW2 is reduced. As a result, entrance of the reflected light to the photodiodes PD in the normal pixel region 31A and degradation of the characteristics of the normal pixels 51A are reduced.

Figure 37:
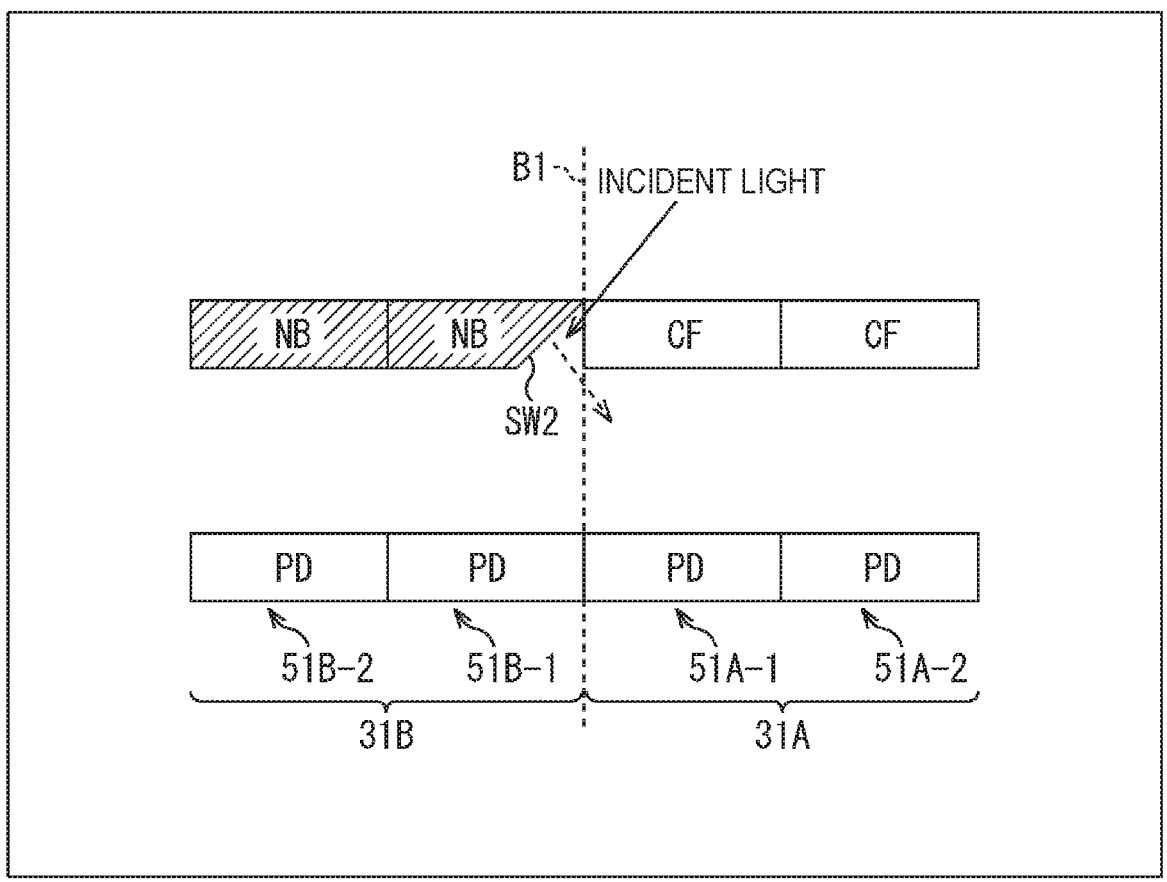
FIG. 37 is a diagram schematically showing the fourth embodiment of the reflected light reduction unit for the filter layer shown in FIG. 21.

FIG. 37 shows the fourth embodiment of the reflected light reduction unit 31C in the imaging device 12B shown in FIG. 21.

In this embodiment, the sidewall SW2 of the narrowband filter NB at the boundary portion B1 is inclined with respect to the boundary portion B1, as in the embodiment shown in FIG. 36. With this arrangement, light directly incident on the sidewall SW2 decreases, and reflection of the incident light by the sidewall SW2 is reduced. As a result, entrance of the reflected light to the photodiodes PD in the normal pixel region 31A and degradation of the characteristics of the normal pixels 51A are reduced.

Figure 38:
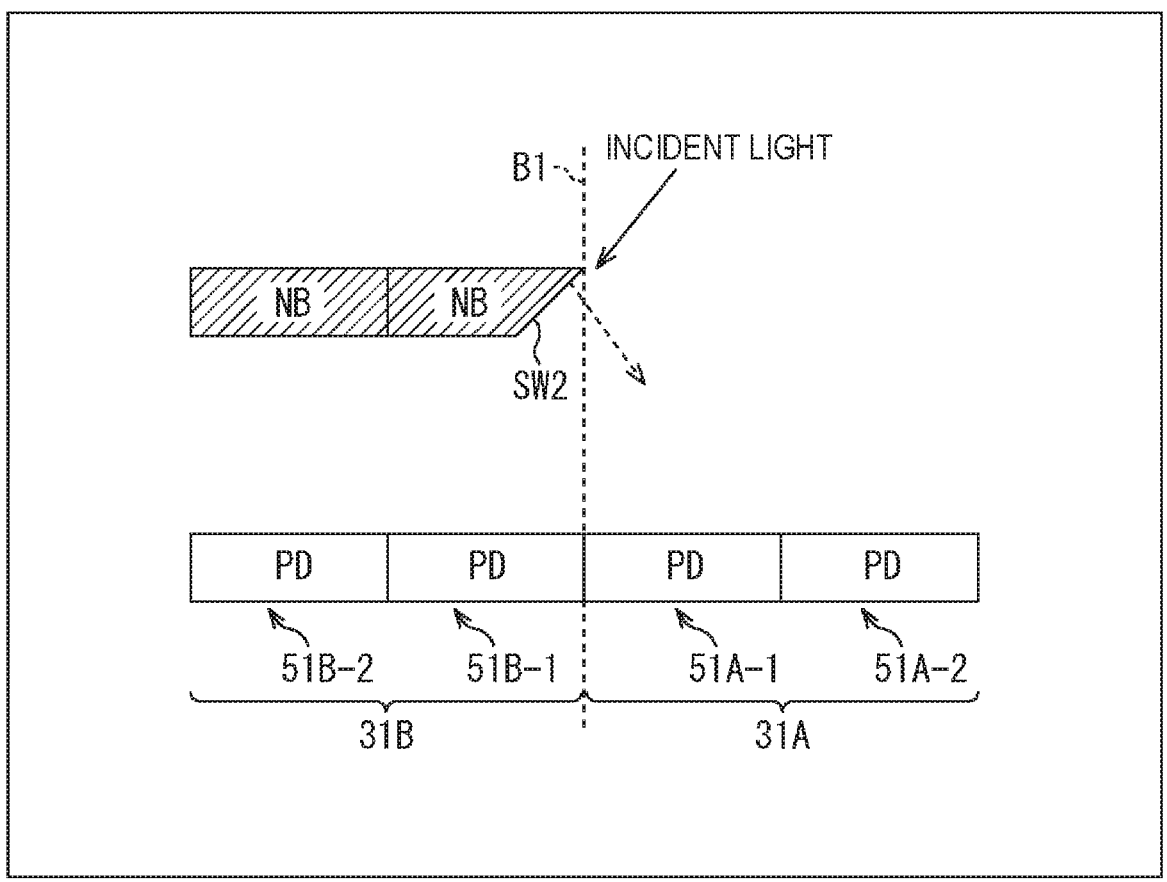
FIG. 38 is a diagram schematically showing the fourth embodiment of the reflected light reduction unit for the filter layer shown in FIG. 23.

FIG. 38 shows the fourth embodiment of the reflected light reduction unit 31C in the imaging device 12C shown in FIG. 23.

In this embodiment, the sidewall SW2 of the narrowband filter NB at the boundary portion B1 is inclined with respect to the boundary portion B1, as in the embodiments shown in FIGS. 36 and 37. With this arrangement, light directly incident on the sidewall SW2 decreases, and reflection of the incident light by the sidewall SW2 is reduced. As a result, entrance of the reflected light to the photodiodes PD in the normal pixel region 31A and degradation of the characteristics of the normal pixels 51A are reduced.

Figure 39:
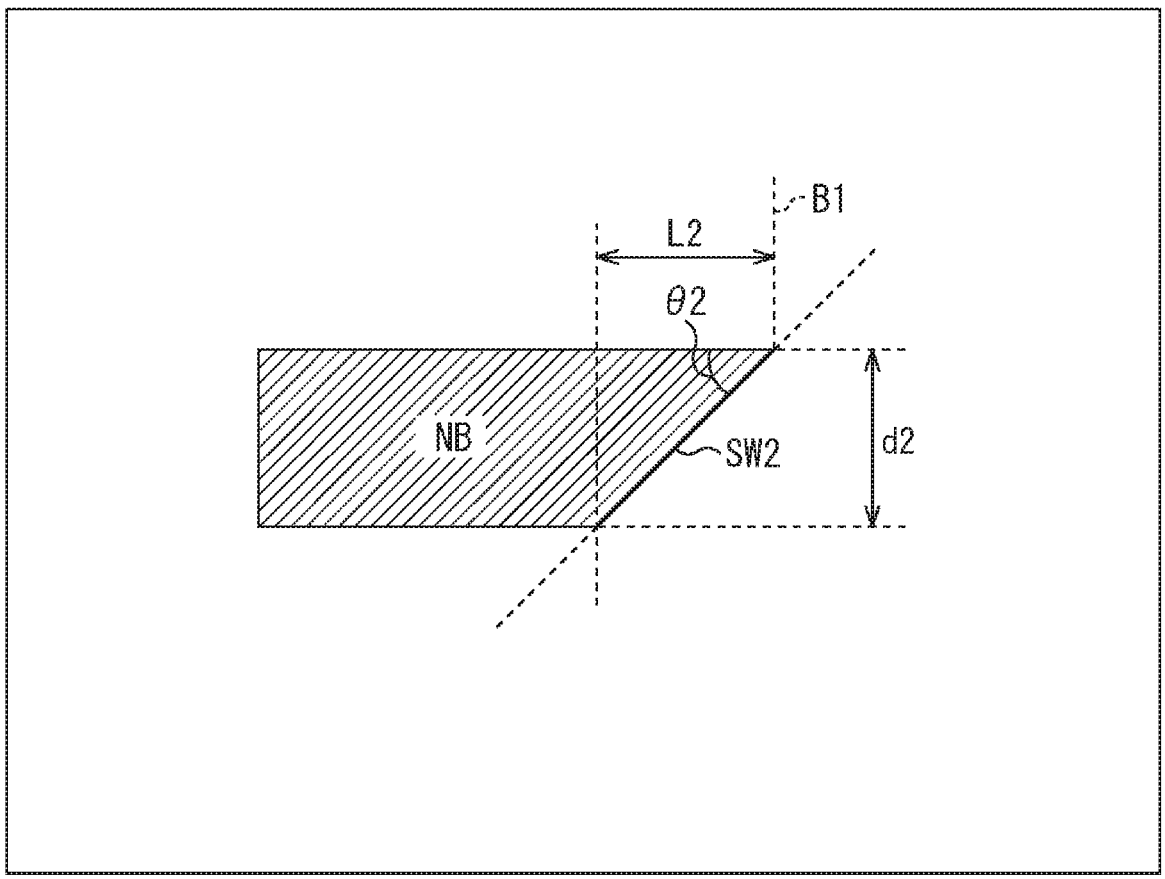
FIG. 39 is a diagram for explaining the conditions for the inclination angle of a narrowband filter.

Referring now to FIG. 39, the conditions for the inclination angle $\theta 2$ of the sidewall SW2 with respect to the light incident surface of the narrowband filter NB are described.

The inclination angle $\theta 2$ is preferably set so as to satisfy Equation (9) shown below.

$$\theta 2 \leq 90° - \theta \max \quad (9)$$

Note that the maximum incident angle $\theta\max$ is determined according to Equation (8) shown above.

Where the thickness of the narrowband filter NB is represented by d2, and the length of the sidewall SW2 (an inclined surface) in the depth direction is represented by L2, Equation (10) shown below is satisfied.

$$\tan \theta 2 = d2/L2 \quad (10)$$

According to Equations (9) and (10), the length L2 of the sidewall SW2 in the depth direction is preferably set so as to satisfy Equation (11) shown below.

$$L2 \geq d2/\tan(90° - \theta \max) \quad (11)$$

Note that the maximum incident angle $\theta\max$ in Equation (8) varies depending on the image height, as described above. In view of this, a maximum incident angle $\theta\max$ may be determined for each image height, and the length L2 may be varied with the image height on the basis of the determined maximum incident angle $\theta\max$, for example. Alternatively, the maximum incident angle $\theta\max$ may be fixed at the minimum value in the imaging device 12C, for example, and the length L2 may be fixed, regardless of the image height.

6. Example Positions of the Reflected Light Reduction Unit 31C in the Pixel Array 31

Next, example positions of the reflected light reduction unit 31C in the pixel array 31 are described with reference to FIGS. 40A, 40B, 40C, 40D, 41A, 41B, 41C, 41D, 42A, 42B, 42C, 42D, 43A, 43B, 43C, 43D, 44A, 44B, 44C, 44D, 45A, 45B, 45C, 45D, 46A, 46B, 46C, 46D, 47A, 47B, 47C, 47D, 48A, 48B, 48C, 48D, 49A, 49B, 49C, 50A, 50B, and 50C.

FIGS. 40A, 40B, 40C, 40D, 41A, 41B, 41C, 41D, 42A, 42B, 42C, 42D, 43A, 43B, 43C, and 43D show examples in which part of an invalid pixel region 31D around the normal pixel region 31A (the effective pixel region) of the pixel array 31 is replaced with the narrowband pixel region 31B. Note that optical black pixels are disposed in the invalid pixel region 31D in some cases.

In each example shown in FIGS. 40A, 40B, 40C, and 40D, three of the four portions (the upper, lower, right, and left portions) of the invalid pixel region 31D around the normal pixel region 31A are replaced with the narrowband pixel region 31B. The reflected light reduction unit 31C is then disposed at the boundary portions between the narrowband pixel region 31B, and the normal pixel region 31A and the invalid pixel region 31D. On the other hand, the reflected light reduction unit 31C is not formed at the boundary portion between the normal pixel region 31A and the invalid pixel region 31D.

In each example shown in FIGS. 41A, 41B, 41C, and 41D, two of the four portions, which are the upper, lower, right, and left portions, of the invalid pixel region 31D around the normal pixel region 31A are replaced with the narrowband pixel region 31B. The reflected light reduction unit 31C is then disposed at the boundary portions between the narrowband pixel region 31B, and the normal pixel region 31A and the invalid pixel region 31D. On the other hand, the reflected light reduction unit 31C is not formed at the boundary portion between the normal pixel region 31A and the invalid pixel region 31D.

In each example shown in FIGS. 42A, 42B, 42C, and 42D, one of the four portions, which are the upper, lower, right, and left portions, of the invalid pixel region 31D around the normal pixel region 31A is replaced with the narrowband pixel region 31B. The reflected light reduction unit 31C is then disposed at the boundary portions between the narrowband pixel region 31B, and the normal pixel region 31A and the invalid pixel region 31D. On the other hand, the reflected light reduction unit 31C is not formed at the boundary portion between the normal pixel region 31A and the invalid pixel region 31D.

In each example shown in FIGS. 43A, 43B, 43C, and 43D, the narrowband pixel region 31B is formed in an image circle 301.

In the example shown in FIG. 43A, in the image circle 301, the four sides of the normal pixel region 31A are surrounded by the narrowband pixel region 31B. The reflected light reduction unit 31C is then disposed at the boundary portions between the narrowband pixel region 31B, and the normal pixel region 31A and the invalid pixel region 31D. Further, the horizontal portions of the reflected light reduction unit 31C extend to both the right and left ends of the pixel array 31 beyond the ends of the narrowband pixel region 31B.

The example in FIG. 43B differs from the example in FIG. 43A in that the portions of the narrowband pixel region 31B on the right and left sides of the normal pixel region 31A, and the vertical portions of the reflected light reduction unit 31C are removed.

The example in FIG. 43C differs from the example in FIG. 43A in that the portions of the narrowband pixel region 31B on the upper and lower sides of the normal pixel region 31A, and the horizontal portions of the reflected light reduction unit 31C are removed.

The example in FIG. 43D differs from the example in FIG. 43A in that the portions of the narrowband pixel region 31B on the right and lower sides of the normal pixel region 31A, and the portions of the reflected light reduction unit 31C on the right and lower sides of the normal pixel region 31A are removed.

Note that, since the narrowband pixel region 31B is formed in the image circle 301, any unnecessary structure (such as a narrowband filter NB, for example) is not formed in any unnecessary portion, and thus, irregular reflection of light can be reduced or prevented.

FIGS. 44, 45A, 45B, 45C, 45D, 46A, 46B, 46C, 46D, 47A, 47B, 47C, and 47D show examples in which part of the normal pixel region 31A (the effective pixel region) of the pixel array 31 is replaced with the narrowband pixel region 31B.

Figure 44:
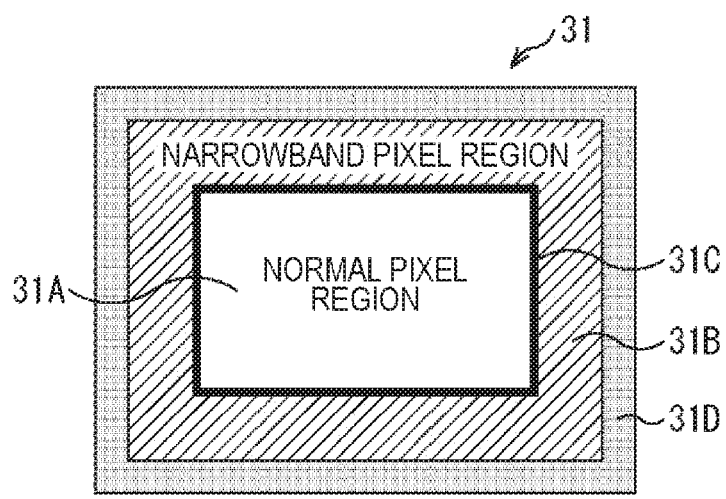
FIG. 44 is a diagram showing an example layout in the pixel array of an imaging device.
Figure 46A:
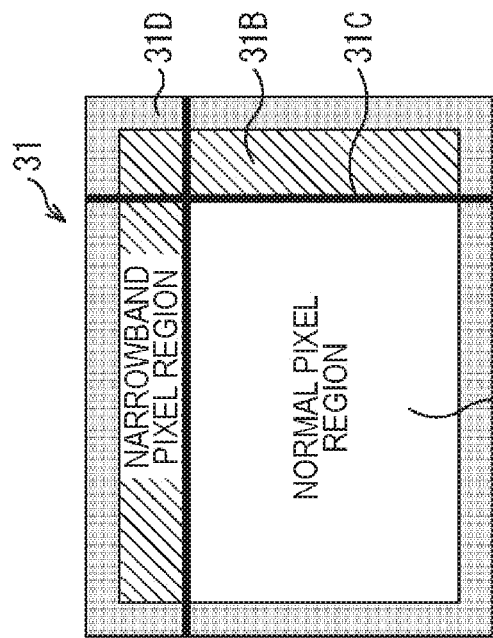
FIGS. 46A, 46B, 46C, and 46D are diagrams showing example layouts in the pixel array of an imaging device.
Figure 46B:
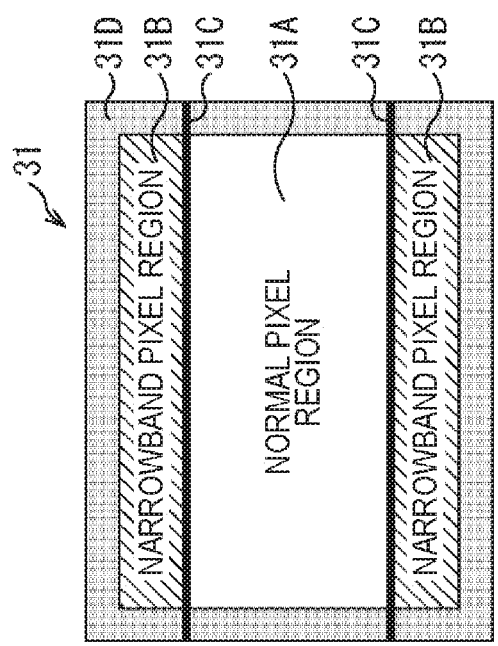
Figure 46C:
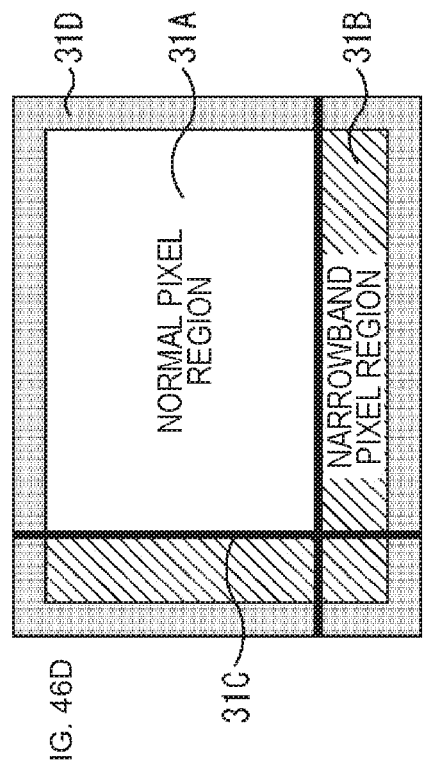
Figure 46D:
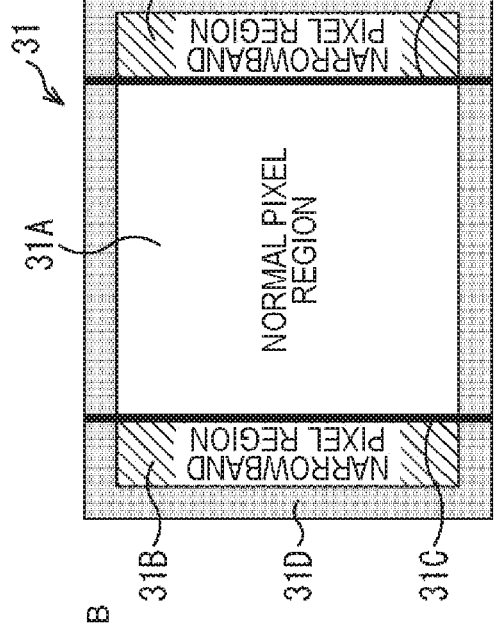
Figure 47C:
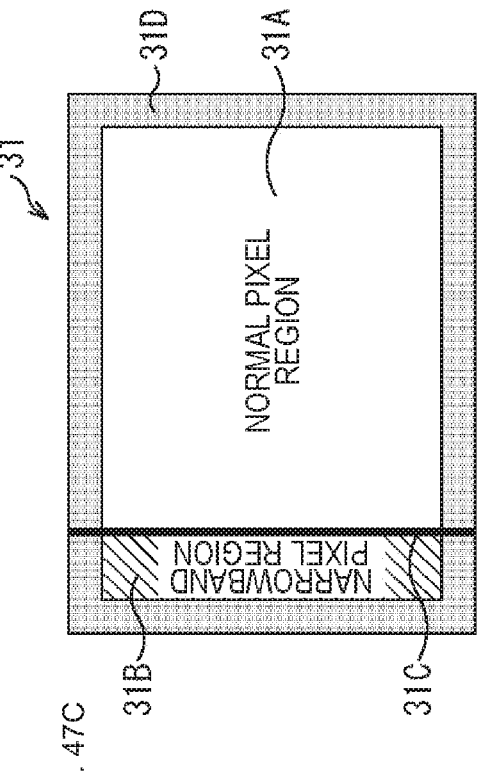
FIGS. 47A, 47B, 47C, and 47D are diagrams showing example layouts in the pixel array of an imaging device.
Figure 47D:
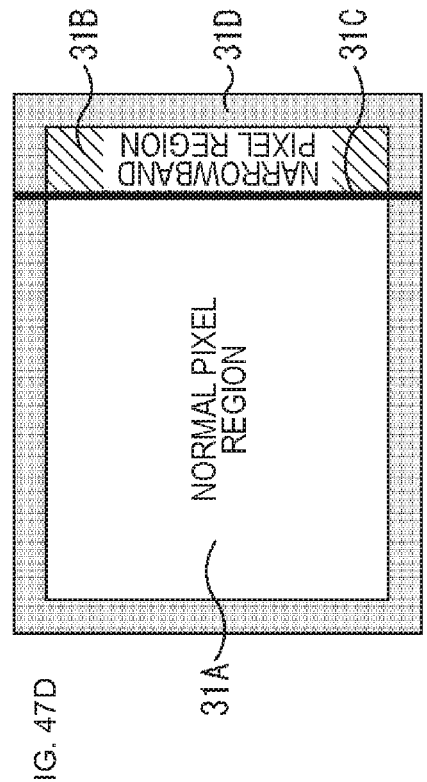
Figure 47A:
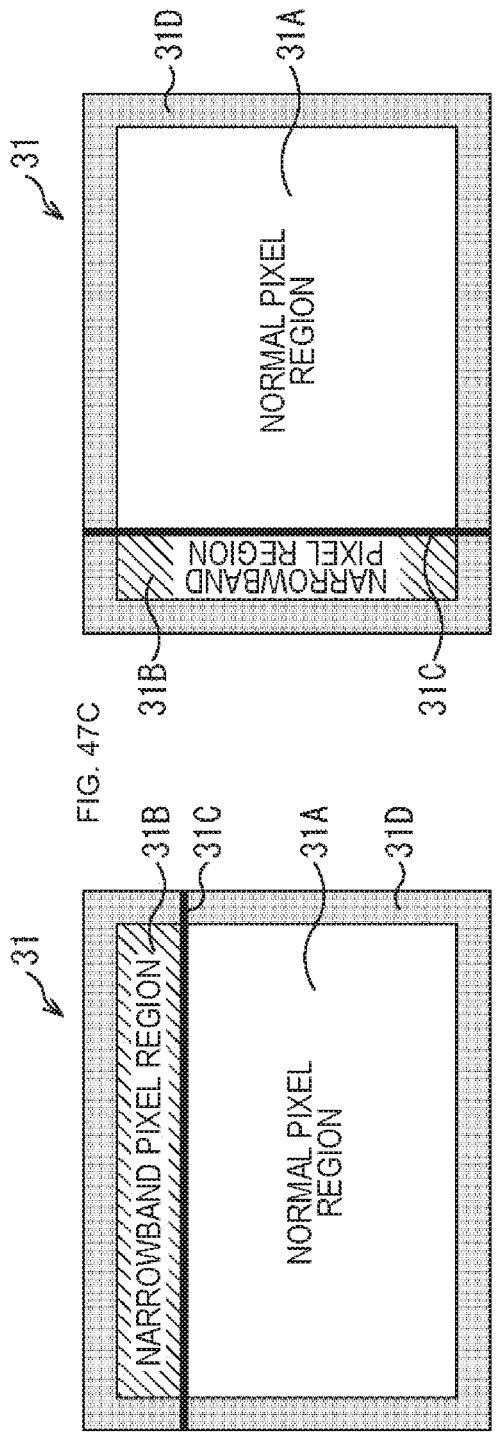
Figure 47B:
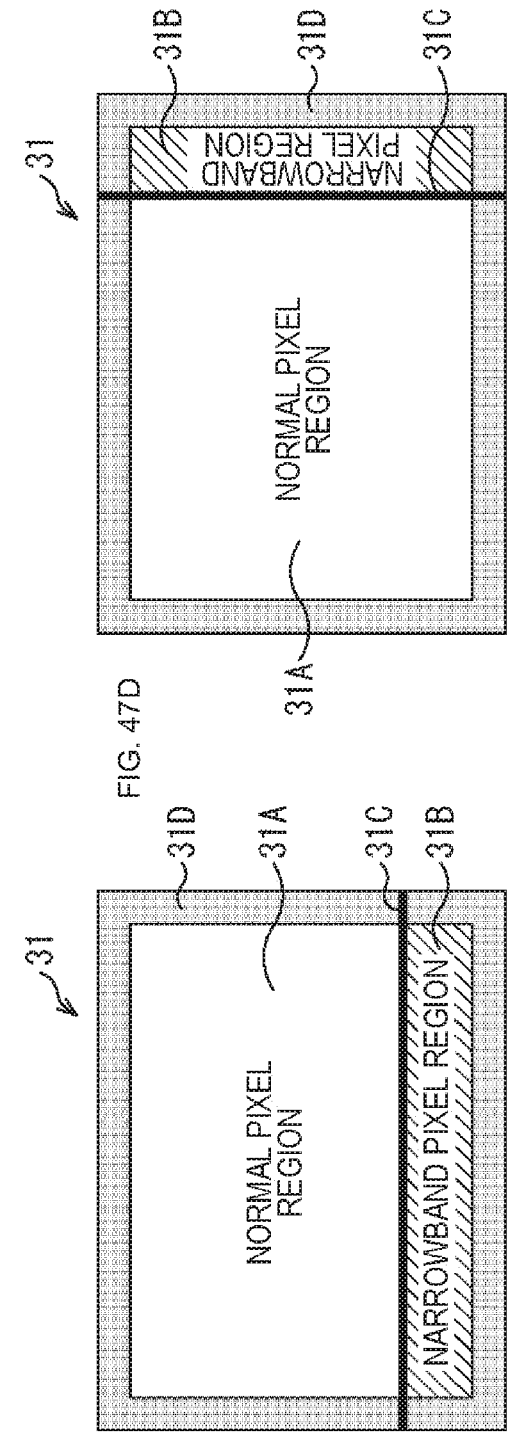

In the example shown in FIG. 44, the outer peripheral portion of the normal pixel region 31A is replaced with the narrowband pixel region 31B. Accordingly, the periphery of the normal pixel region 31A is surrounded by the narrowband pixel region 31B. The reflected light reduction unit 31C is then disposed at the boundary portion between the narrowband pixel region 31B and the normal pixel region 31A.

In each example shown in FIGS. 45A, 45B, 45C, and 45D, three of the four portions, which are the upper, lower, right, and left portions, of the outer peripheral portion of the normal pixel region 31A are replaced with the narrowband pixel region 31B. Accordingly, three of the four portions of the periphery of the normal pixel region 31A are surrounded by the narrowband pixel region 31B. The reflected light reduction unit 31C is then disposed at the boundary portion between the narrowband pixel region 31B and the normal pixel region 31A. Further, each portion of the reflected light reduction unit 31C extends to the upper and lower ends, or the right and left ends of the pixel array 31. Therefore, the reflected light reduction unit 31C is also disposed in the narrowband pixel region 31B and the invalid pixel region 31D.

In each example shown in FIGS. 46A, 46B, 46C, and 46D, two of the four portions, which are the upper, lower, right, and left portions, of the outer peripheral portion of the normal pixel region 31A are replaced with the narrowband pixel region 31B. Accordingly, two of the four portions of the periphery of the normal pixel region 31A are surrounded by the narrowband pixel region 31B. The reflected light reduction unit 31C is then disposed at the boundary portion between the narrowband pixel region 31B and the normal pixel region 31A. Further, each portion of the reflected light reduction unit 31C extends to the upper and lower ends, or the right and left ends of the pixel array 31. Therefore, the reflected light reduction unit 31C is also disposed in the narrowband pixel region 31B and the invalid pixel region 31D.

In each example shown in FIGS. 47A, 47B, 47C, and 47D, one of the four portions, which are the upper, lower, right, and left portions, of the outer peripheral portion of the normal pixel region 31A is replaced with the narrowband pixel region 31B. Accordingly, one of the four portions of the periphery of the normal pixel region 31A is surrounded by the narrowband pixel region 31B. The reflected light reduction unit 31C is then disposed at the boundary portion between the narrowband pixel region 31B and the normal pixel region 31A. Further, each portion of the reflected light reduction unit 31C extends to the upper and lower ends, or the right and left ends of the pixel array 31. Therefore, the reflected light reduction unit 31C is also disposed in the invalid pixel region 31D.

FIGS. 48A, 48B, 48C, and 48D show examples in which both the normal pixel region 31A and the invalid pixel region 31D are partially replaced with the narrowband pixel region 31B. Note that the dotted lines in FIGS. 48A 48B, 48C, and 48D indicate the boundaries between the normal pixel region 31A and the invalid pixel region 31D before the replacement.

In the example in FIG. 48A, the narrowband pixel region 31B is disposed at the left end and the lower end of the pixel array 31. The reflected light reduction unit 31C is then disposed at the boundary portions between the narrowband pixel region 31B, and the normal pixel region 31A and the invalid pixel region 31D. Further, each portion of the reflected light reduction unit 31C extends to the upper and lower ends, or the right and left ends of the pixel array 31. Therefore, the reflected light reduction unit 31C is also disposed in the narrowband pixel region 31B.

In the example in FIG. 48B, the upper end portion and the left end portion of the normal pixel region 31A are replaced with the narrowband pixel region 31B. The narrowband pixel region 31B also extends to the upper and lower ends or the right and left ends of the pixel array 31, and part of the invalid pixel region 31D is replaced with the narrowband pixel region 31B. The reflected light reduction unit 31C is then disposed at the boundary portion between the narrowband pixel region 31B and the normal pixel region 31A. Further, each portion of the reflected light reduction unit 31C extends to the upper and lower ends, or the right and left ends of the pixel array 31. Therefore, the reflected light reduction unit 31C is also disposed in the narrowband pixel region 31B and the invalid pixel region 31D.

In the example in FIG. 48C, the upper end portion, the lower end portion, and the right end portion of the normal pixel region 31A are replaced with the narrowband pixel region 31B. The lower end portion and the right end portion of the invalid pixel region 31D are also replaced with the narrowband pixel region 31B. The reflected light reduction unit 31C is then disposed at the boundary portion between the narrowband pixel region 31B and the normal pixel region 31A. Further, each portion of the reflected light reduction unit 31C extends to the upper and lower ends, or the right and left ends of the pixel array 31. Therefore, the reflected light reduction unit 31C is also disposed in the narrowband pixel region 31B and the invalid pixel region 31D.

In the example in FIG. 48D, the upper end portion, the lower end portion, and the left end portion of the normal pixel region 31A are replaced with the narrowband pixel region 31B. The left end portion of the invalid pixel region 31D is also replaced with the narrowband pixel region 31B. The reflected light reduction unit 31C is then disposed at the boundary portion between the narrowband pixel region 31B and the normal pixel region 31A. Further, each portion of the reflected light reduction unit 31C extends to the upper and lower ends, or the right and left ends of the pixel array 31. Therefore, the reflected light reduction unit 31C is also disposed in the narrowband pixel region 31B and the invalid pixel region 31D.

Figure 49A:
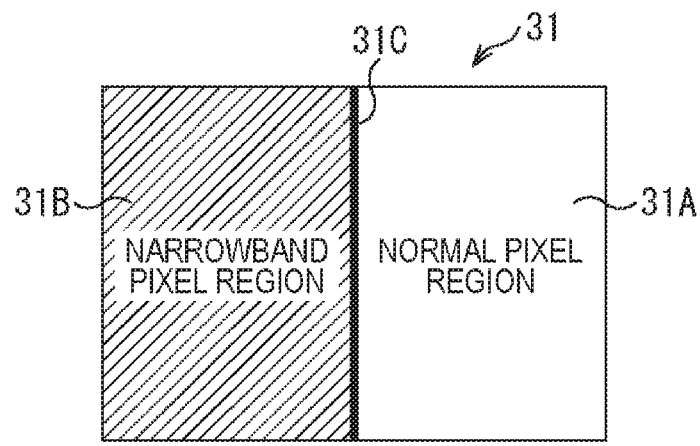
FIGS. 49A, 49B, and 49C are diagrams showing example layouts in the pixel array of an imaging device.
Figure 49B:
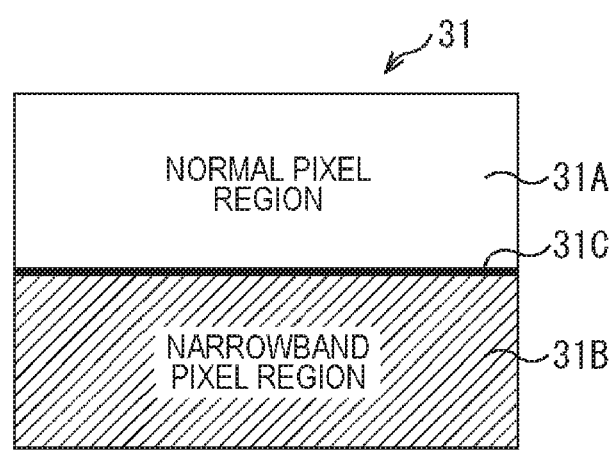
Figure 49C:
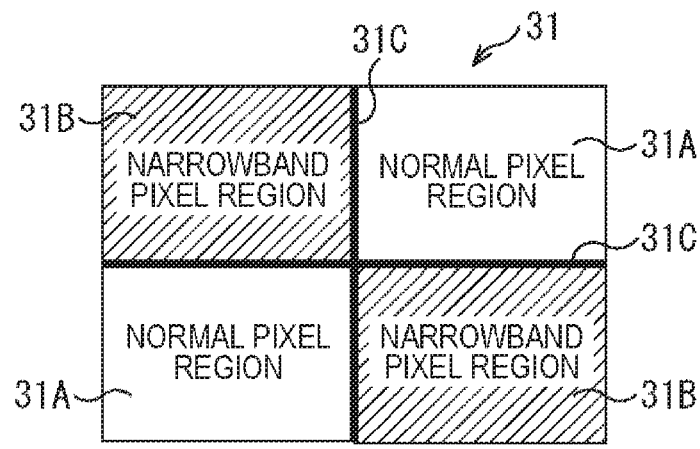

FIGS. 49A, 49B, and 49C show examples in which the pixel array 31 is divided into the normal pixel region 31A and the narrowband pixel region 31B.

Specifically, in the example in FIG. 49A, the pixel array 31 is horizontally divided into the normal pixel region 31A and the narrowband pixel region 31B. The reflected light reduction unit 31C is then disposed at the boundary portion between the narrowband pixel region 31B and the normal pixel region 31A.

In the example in FIG. 49B, the pixel array 31 is vertically divided into the normal pixel region 31A and the narrowband pixel region 31B. The reflected light reduction unit 31C is then disposed at the boundary portion between the narrowband pixel region 31B and the normal pixel region 31A.

In the example in FIG. 49C, the pixel array 31 is divided into four regions, the normal pixel region 31A is located at the upper right portion and the lower left portion, and the narrowband pixel region 31B is located at the upper left portion and the lower right portion. The reflected light reduction unit 31C is then disposed at the boundary portion between the narrowband pixel region 31B and the normal pixel region 31A.

Figure 50A:
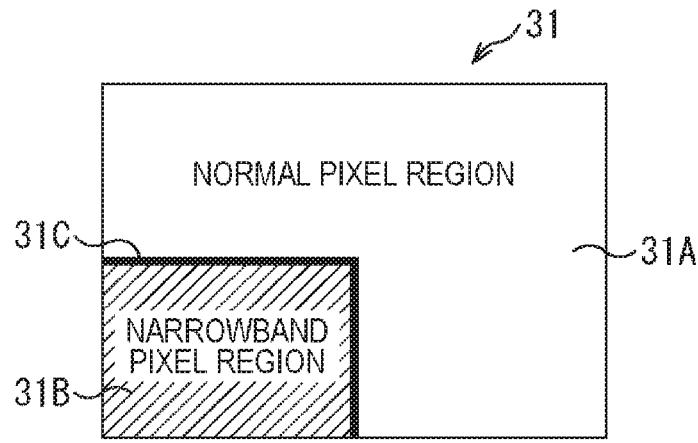
FIGS. 50A, 50B, and 50C are diagrams showing example layouts in the pixel array of an imaging device.
Figure 50B:
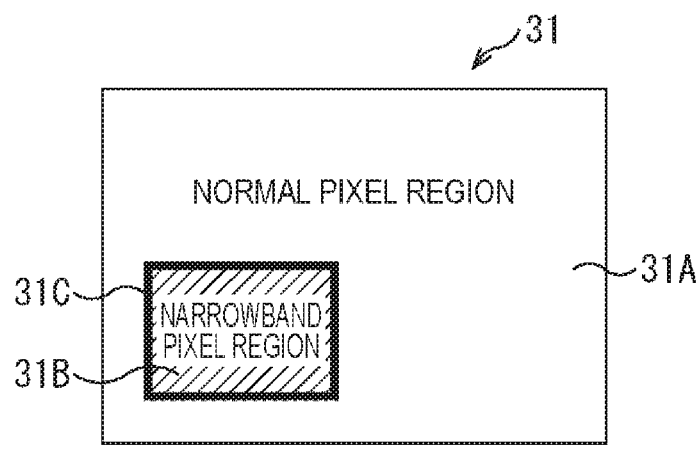
Figure 50C:
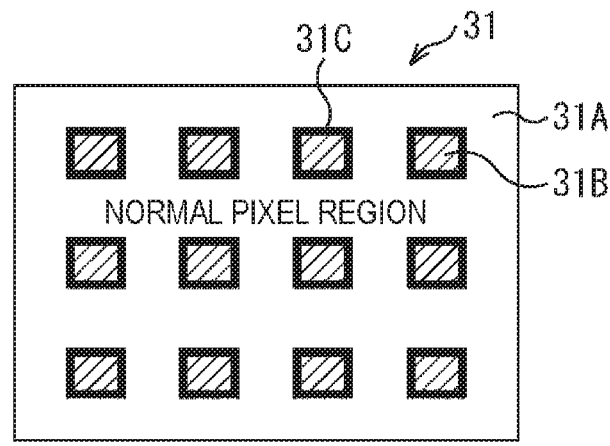

FIGS. 50A, 50B, and 50C show examples in which the narrowband pixel region 31B is formed in part of the normal pixel region 31A.

Specifically, in the example in FIG. 50A, the narrowband pixel region 31B is disposed at the lower left corner of the normal pixel region 31A. The reflected light reduction unit 31C is then disposed at the boundary portion between the narrowband pixel region 31B and the normal pixel region 31A.

In the example ink FIG. 50B, the narrowband pixel region 31B is disposed in the normal pixel region 31A. The reflected light reduction unit 31C is then disposed so as to surround the narrowband pixel region 31B.

In the example in FIG. 50C, a plurality of narrowband pixel regions 31B is disposed in the normal pixel region 31A. The reflected light reduction unit 31C is then disposed so as to surround each narrowband pixel region 31B.

As the reflected light reduction unit 31C is disposed at least at the boundary portion between the normal pixel region 31A and the narrowband pixel region 31B in the above manner, the reflected light on the sidewall of the narrowband filter NB at the boundary portion can be reduced as described above.

Note that, if the narrowband pixel region 31B is disposed in the invalid pixel region 31D, it is possible to avoid a decrease in the number of pixels in the normal pixel region 31A (the effective pixel region), a change in the angle of view, a change in the aspect ratio, and the like. Meanwhile, the image height of the narrowband pixel region 31B becomes greater. Therefore, the lens aberration and the CRA become greater, and the characteristics of the narrowband pixels 51B are degraded. Further, the oblique light component entering the narrowband pixels 51B increases, and the irregular reflection component on the sidewall of the narrowband filter NB becomes larger. Therefore, to improve the characteristics of the imaging device (particularly, the characteristics of the narrowband pixels 51B), the load of signal processing might increase.

On the other hand, if the narrowband pixel region 31B is disposed in the normal pixel region 31A, the lens aberration, the CRA, and the oblique light component become smaller, and degradation of the characteristics of the imaging device 12 can be reduced. Meanwhile, a decrease in the number of pixels in the normal pixel region 31A, a change in the angle of view, a change in the aspect ratio, and the like are caused.

Therefore, it is preferable to position the narrowband pixel region 31B, while taking into consideration the above advantages and disadvantages.

7. Fifth Embodiment of the Present Technology

Next, a fifth embodiment of the present technology is described, with reference to FIGS. 51, 52, 53, 54, 55A, 55B, 56A, 56B, 57A, and 57B. In the fifth embodiment, to reduce generation of flare, an antireflective film that reduces light reflection is provided on the light incident surface of each narrowband filter NB.

Figure 51:
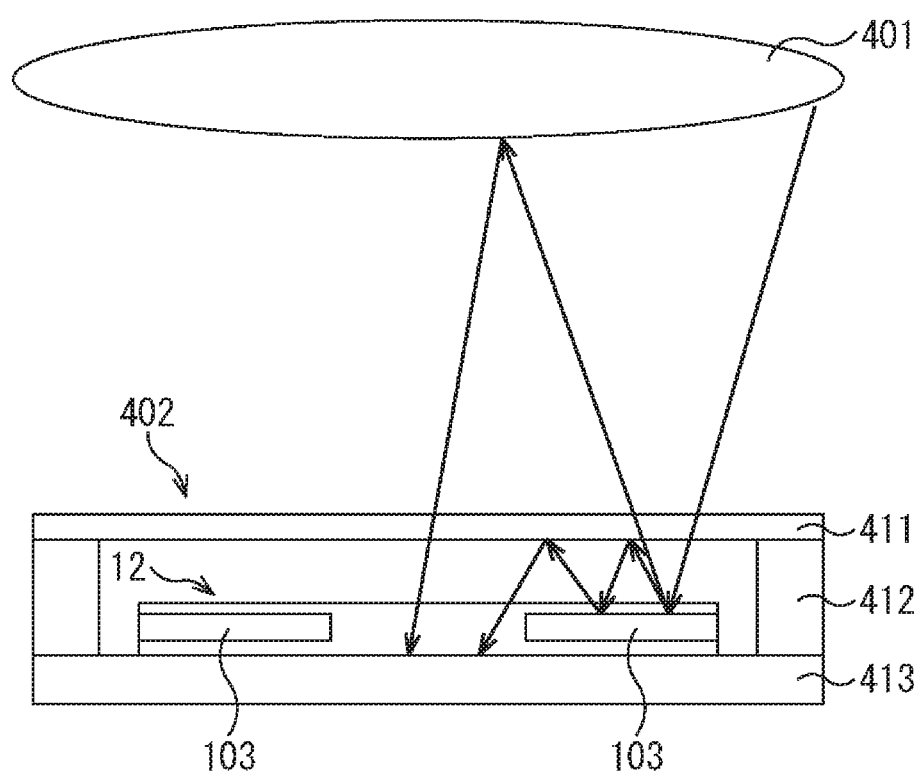
FIG. 51 is a diagram schematically showing how flare is generated in an imaging apparatus.

Referring first to FIG. 51, a cause of generation of flare in the imaging apparatus 10 using the imaging device 12 shown in FIG. 2 is described.

In the example shown in FIG. 51, the imaging device 12 is disposed in a semiconductor chip 402. Specifically, the semiconductor chip 402 is mounted on a substrate 413, and its periphery is covered with sealing glass 411 and resin 412. Light that has passed through a lens 401 provided in the optical system 11 shown in FIG. 1 and the sealing glass 411 then enters the imaging device 12.

Here, in a case where the narrowband filters NB of the filter layer 103 of the imaging device 12 are formed with plasmon filters, a conductive thin film made of a metal is formed on each plasmon filter, as described above. This conductive thin film has a high reflectance, and easily reflects light having a wavelength outside the transmission band. Part of the light reflected by the conductive thin film is then reflected by the sealing glass 411 or the lens 401, for example, and re-enters the imaging device 12. Although not shown in FIG. 51, part of the light reflected by the conductive thin film is also reflected by an optical filter such as an infrared cutoff filter, bonding wires, or the like, and re-enters the imaging device 12. Flare is then generated by these rays of re-entering light. In particular, a plasmon filter using a hole array structure has a low aperture ratio, and therefore, flare is easily generated.

Figure 52:
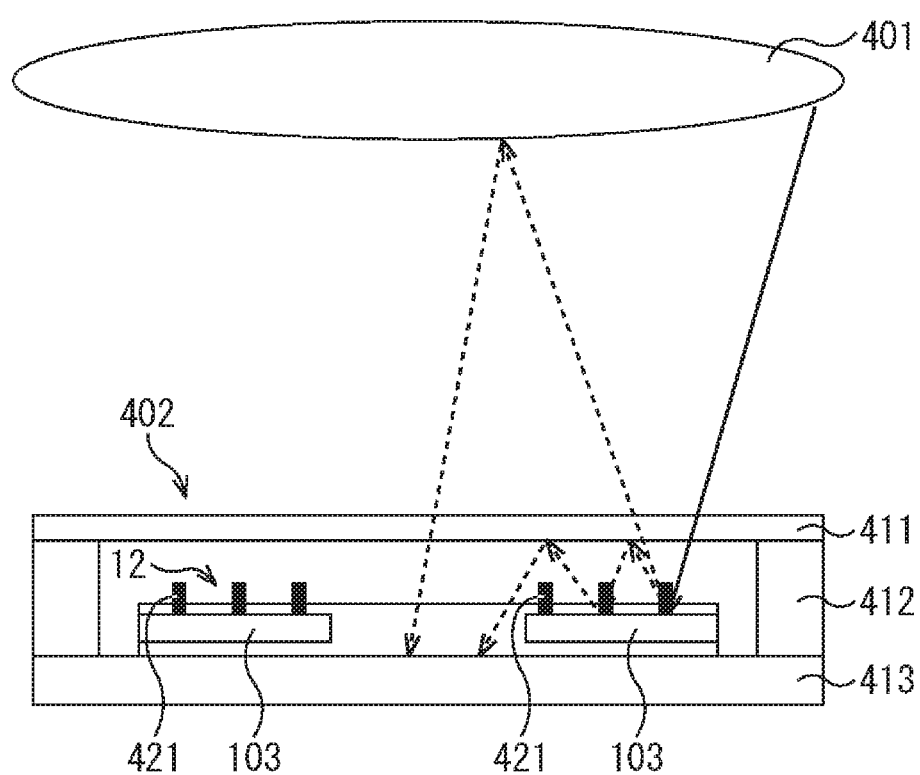
FIG. 52 is a diagram for explaining a fifth embodiment of the present technology.

On the other hand, as shown in FIG. 52, an antireflective film 421 is provided on the light incident surface of each narrowband filter NB. The antireflective film 421 is formed with a black filter, for example.

This antireflective film 421 absorbs the light reflected by the conductive thin film of the narrowband filter NB. As a result, the reflected light is reflected by the sealing glass 411, the lens 401, or the like, and is prevented from re-entering the imaging device 12. As a result, generation of flare is reduced or prevented.

Next, example layouts of the antireflective film 421 are described, with reference to FIGS. 53, 54, 55A, 55B, 56A, 56B, 57A, and 57B.

Figure 53:
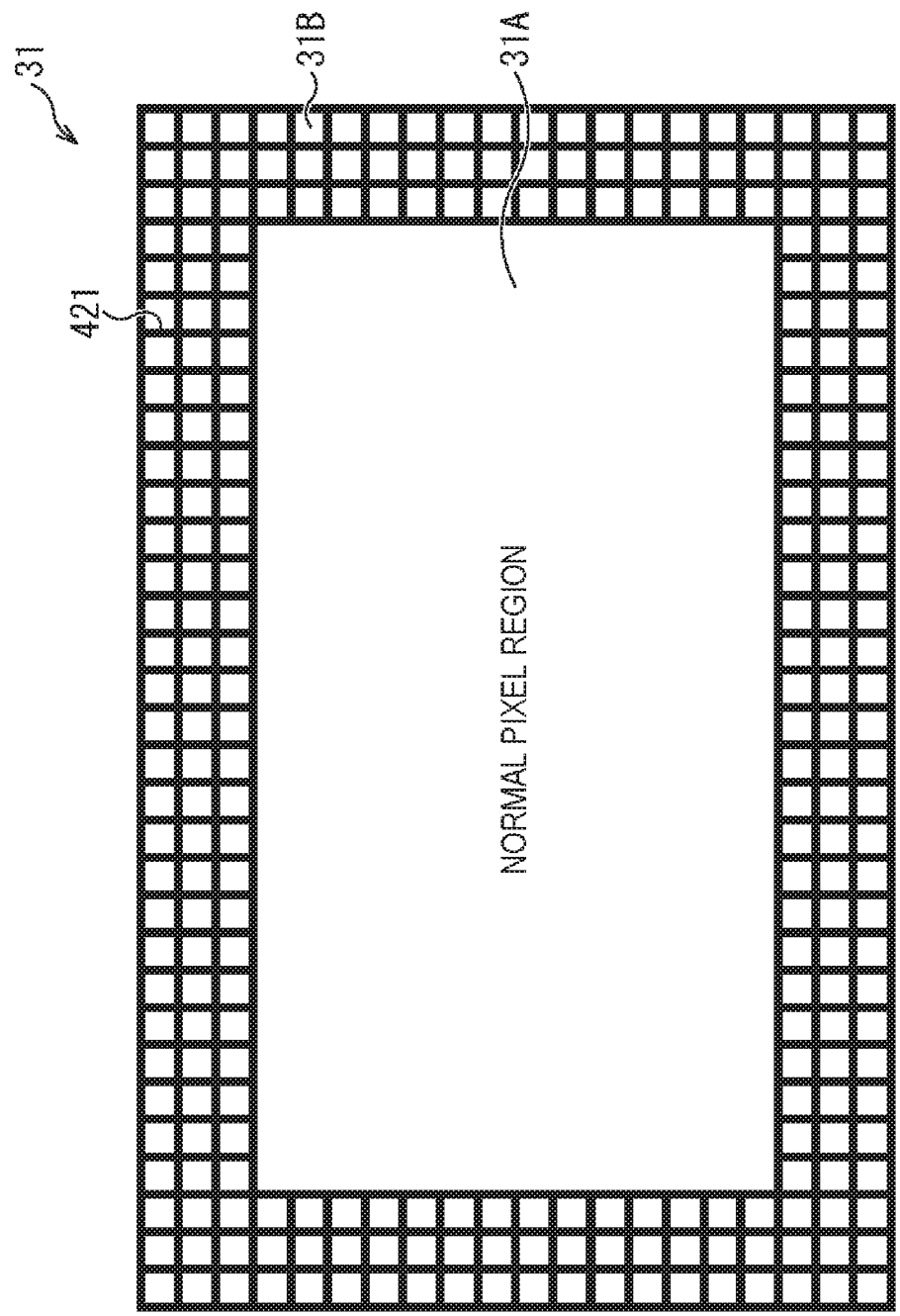
FIG. 53 is a diagram showing an example layout of an antireflective film.
Figure 54:
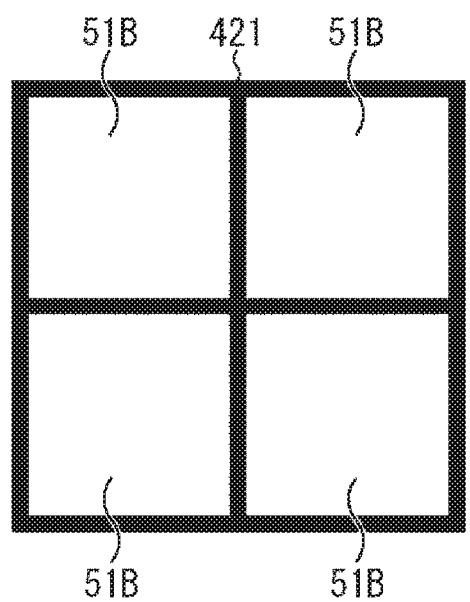
FIG. 54 is a diagram showing an example layout of an antireflective film.

FIG. 53 and FIG. 54 show a first example layout of the antireflective film 421. FIG. 53 shows an example layout of the antireflective film 421 in the entire pixel array 31. FIG. 54 shows an example layout of the antireflective film 421 in each narrowband pixel 51B.

In this example, the antireflective film 421 is formed in a grid pattern in the narrowband pixel region 31B, and the periphery of each narrowband pixel 51B is surrounded by the antireflective film 421.

The antireflective film 421 absorbs the light reflected by the conductive thin film of the narrowband filter NB of each narrowband pixel 51B, and prevents generation of flare.

Further, the antireflective film 421 is not formed on the portions of the light incident surface of the narrowband filter NB through which incident light is to be transmitted. Thus, a preferred transmittance is maintained in the narrowband filter NB, and excellent characteristics are maintained in each narrowband pixel 51B.

Note that, as the width of the antireflective film 421 (the width of the grids) becomes smaller, the sensitivity of each narrowband pixel 51B becomes higher, but the effect to reduce reflected light becomes smaller. On the other hand, as the width of the antireflective film 421 (the width of the grids) becomes greater, the effect to reduce reflected light becomes larger, but the sensitivity of each narrowband pixel 51B becomes lower. Therefore, it is preferable to adjust the width of the antireflective film 421 as appropriate, in accordance with the required specifications, performance, and the like.

FIGS. 55A, 55B, 56A, 56B, 57A, and 57B show other example layouts of the antireflective film 421 in each narrowband pixel 51B.

Figure 55A:
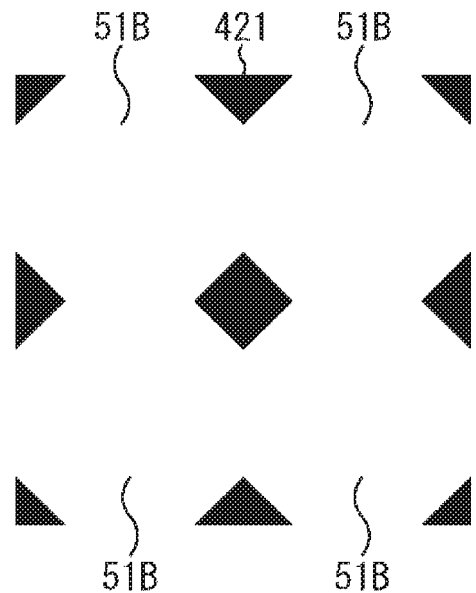
FIGS. 55A and 55B are diagrams showing example layouts of antireflective films.

In the example layout in FIG. 55A, a square portion of the antireflective film 421 is disposed at the portion where four narrowband pixels 51B are adjacent to one another. Each vertex of the square portion of the antireflective film 421 is located on a side of each narrowband pixel 51B. Further, the antireflective film 421 is not formed at the boundary portions other than the four corner portions of each narrowband pixel 51B.

Figure 55B:
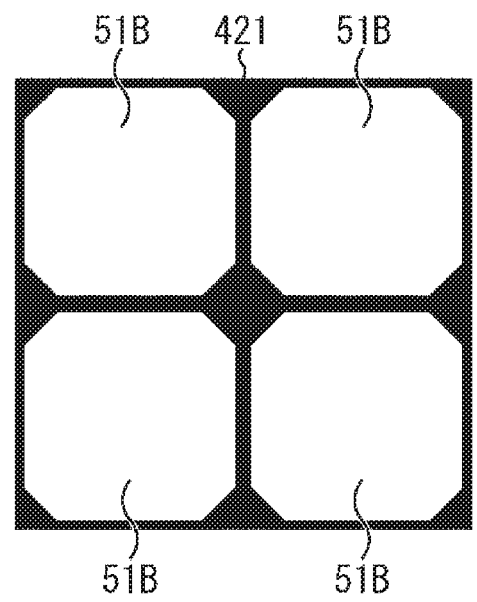

The example layout in FIG. 55B is a combination of the example layout in FIG. 54 and the example layout in FIG. 55A. That is, this example differs from the example layout in FIG. 55A in that the antireflective film 421 is also disposed at the boundary portions other than the four corner portions of each narrowband pixel 51B, and the periphery of each narrowband pixel 51B is surrounded by the antireflective film 421.

Therefore, in the example layout in FIG. 55A, the sensitivity of each narrowband pixel 51B becomes higher, but the effect to reduce reflected light becomes smaller than in the example layout in FIG. 55B. Conversely, in the example layout in FIG. 55B, the effect to reduce reflected light becomes greater, but the sensitivity of each narrowband pixel 51B becomes lower than in the example layout in FIG. 55A.

Figure 56A:
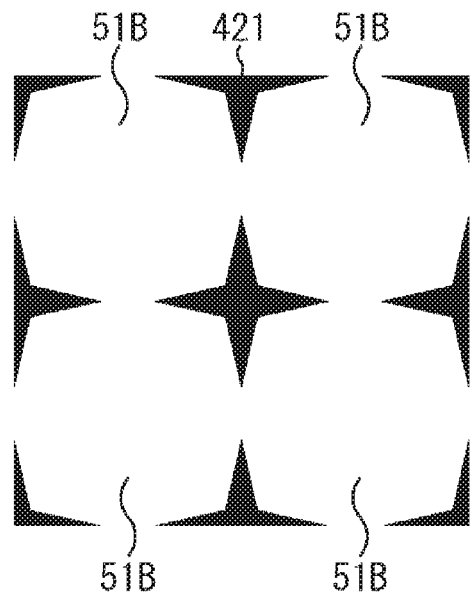
FIGS. 56A and 56B are diagrams showing example layouts of antireflective films.

In the example layout in FIG. 56A, a four-vertex star-shaped portion of the antireflective film 421 is disposed at the portion where four narrowband pixels 51B are adjacent to one another. Each vertex of the star-shaped portion of the antireflective film 421 is located on a side of each narrowband pixel 51B. Further, the antireflective film 421 is not formed at the boundary portions other than the four corner portions of each narrowband pixel 51B.

Figure 56B:
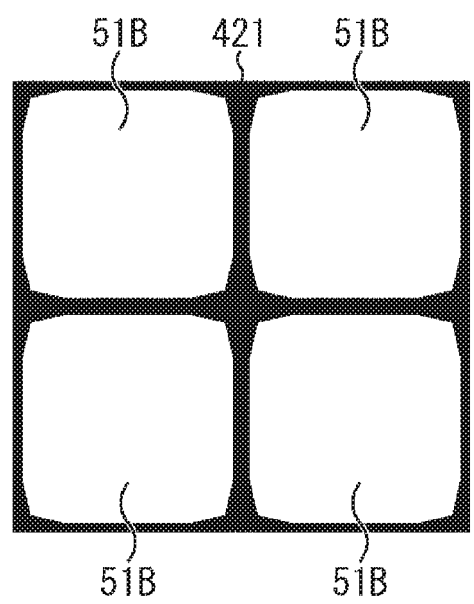

The example layout in FIG. 56B is a combination of the example layout in FIG. 54 and the example layout in FIG. 56A. That is, this example differs from the example layout in FIG. 56A in that the antireflective film 421 is also disposed at the boundary portions other than the four corner portions of each narrowband pixel 51B, and the periphery of each narrowband pixel 51B is surrounded by the antireflective film 421.

Therefore, in the example layout in FIG. 56A, the sensitivity of each narrowband pixel 51B becomes higher, but the effect to reduce reflected light becomes smaller than in the example layout in FIG. 56B. Conversely, in the example layout in FIG. 56B, the effect to reduce reflected light becomes greater, but the sensitivity of each narrowband pixel 51B becomes lower than in the example layout in FIG. 56A.

Figure 57A:
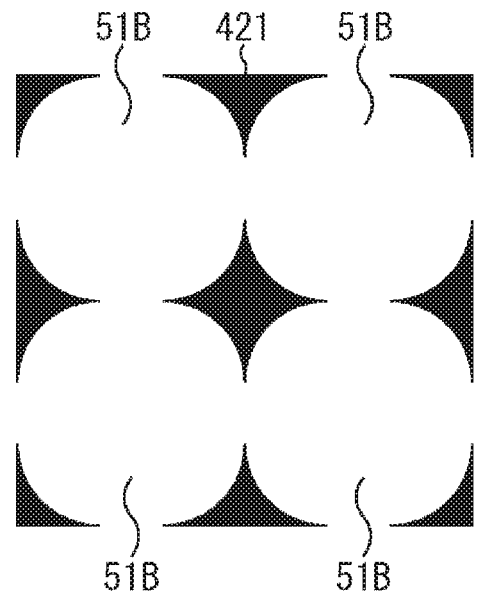
FIGS. 57A and 57B are diagrams showing example layouts of antireflective films.

In the example layout in FIG. 57A, a four-vertex star-shaped portion of the antireflective film 421 is disposed at the portion where four narrowband pixels 51B are adjacent to one another, as in the example layout in FIG. 56A. However, this example differs from the example layout in FIG. 56A in that each vertex of the star-shaped portion is connected by a side on a circular arc. Further, the antireflective film 421 is not formed at the boundary portions other than the four corner portions of each narrowband pixel 51B.

Figure 57B:
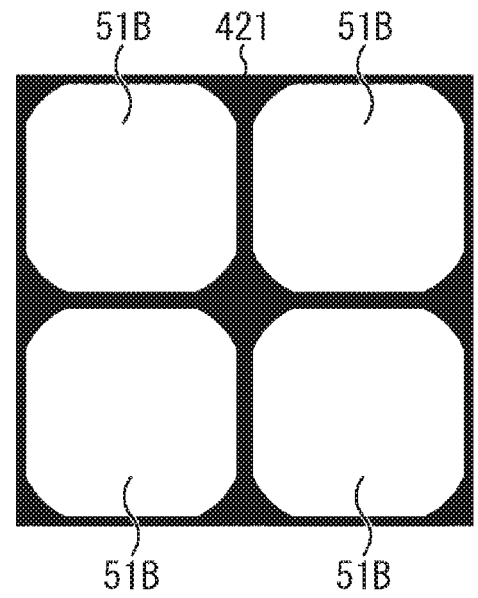

The example layout in FIG. 57B is a combination of the example layout in FIG. 54 and the example layout in FIG. 57A. That is, this example differs from the example layout in FIG. 57A in that the antireflective film 421 is also disposed at the boundary portions other than the four corner portions of each narrowband pixel 51B, and the periphery of each narrowband pixel 51B is surrounded by the antireflective film 421.

Therefore, in the example layout in FIG. 57A, the sensitivity of each narrowband pixel 51B becomes higher, but the effect to reduce reflected light becomes smaller than in the example layout in FIG. 57B. Conversely, in the example layout in FIG. 57B, the effect to reduce reflected light becomes greater, but the sensitivity of each narrowband pixel 51B becomes lower than in the example layout in FIG. 57A.

Note that the antireflective film 421 may be formed for each set of plural narrowband pixels 51B, such as each two pixels in the vertical direction and each one pixel in the horizontal direction, each one pixel in the vertical direction and each two pixels in the horizontal direction, each two pixels in the vertical direction and each two pixels in the horizontal direction, or each three pixels in the vertical direction and each three pixels in the horizontal direction. In this case, the antireflective film 421 is not necessarily formed on all the narrowband pixels 51B.

8. Modifications of the Filters of Normal Pixels 51A and Narrowband Pixels 51B Next, modifications of the filters of normal pixels 51A and narrowband pixels 51B are described.

A combination of the non-metallic filter included in a normal pixel 51A and the narrowband filter NB (a metallic filter) included in a narrowband pixel 51B is not limited to the example described above, but may be changed as appropriate. For example, metallic filters other than the plasmon filters described above can be used as the narrowband filters NB.

Figure 58:
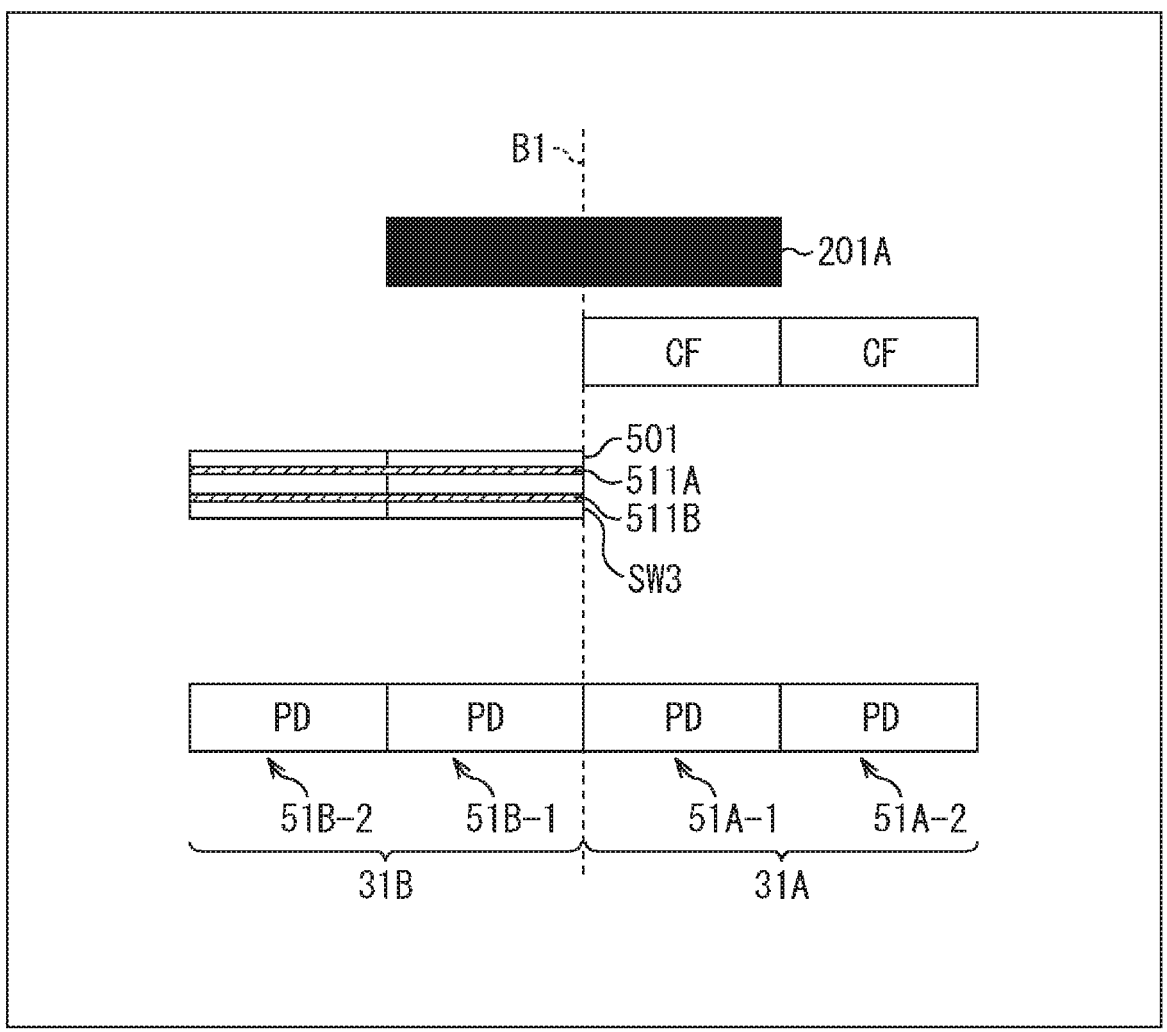
FIG. 58 is a diagram showing an example in which a Fabry-Perot is used as the reflected light reduction unit.

For example, FIG. 58 shows an example in which a Fabry-Perot 501 is used as the narrowband filter NB shown in FIG. 20B.

The Fabry-Perot 501 is also called a Fabry-Perot interferometer or an etalon, and a semitransparent film 511A and a semitransparent film 511B that are parallel to the light incident surface are disposed at a predetermined interval therein. When light is reflected multiple times between the semitransparent film 511A and the semitransparent film 511B, waves having the same phase then reinforce each other, and waves having different phases cancel each other. As a result, of the incident light, light of a particular wavelength is intensified, light of the other wavelengths is weakened, and the light of the particular wavelength is output.

Further, any non-metallic filter is not necessarily provided in the normal pixels 51A, as described above.

9. Image Processing in the Imaging Apparatus 10

Next, image processing in the imaging apparatus 10 is described.

For example, imaging modes may be set in the imaging apparatus 10, so that types of images to be output by the imaging device 12 can be switched. For example, in a case where a mode A is set, the imaging device 12 outputs only normal images. In a case where a mode B is set, the imaging device 12 outputs only multispectral images. In a case where a mode C is set, the imaging device 12 outputs both normal images and multispectral images.

For example, the user then selects an appropriate imaging mode in accordance with the scene, or the imaging apparatus 10 automatically selects an appropriate imaging mode in accordance with the scene.

For example, an imaging mode is selected in accordance with the object distance. In a case where the object distance is several meters, for example, the mode A is set, and normal images are captured and output. Also, in a case where the object distance is several centimeters to several tens of centimeters, for example, the mode B is set, and multispectral images are captured and output. Further, in a case where the mode C is set, for example, both normal images and multispectral images are captured and output for objects at the same object distance.

Meanwhile, in a multispectral image, wavelength resolution and spatial resolution are in a trade-off relationship. This is because the number of pixels per wavelength or the pixel area decreases when the spatial resolution is increased.

Therefore, a two-dimensional multispectral image, a one-dimensional multispectral image, or a zero-dimensional multispectral image may be selectively used depending on the purpose of use.

Here, a two-dimensional multispectral image is an image that expresses an object with two-dimensionally arranged pixels. A one-dimensional multispectral image is an image that expresses an object with one-dimensionally arranged pixels. A zero-dimensional multispectral image is an image that shows the spectral characteristics (spectroscopic spectrum, for example) of an object.

A two-dimensional multispectral image has a high spatial resolution and allows an object to be visually recognized, but has a low wavelength resolution. On the other hand, a zero-dimensional multispectral image has a low spatial resolution and does not allow an object to be visually recognized, but has a high wavelength resolution.

Here, an example of a method for calculating the spectral characteristics of an object is described.

Where the matrix indicating observation data (the pixel value of each narrowband pixel 51B) is represented by b, the matrix indicating the spectral characteristics of each narrowband pixel 51B is represented by A, and the matrix indicating the spectral characteristics of the object (hereinafter, referred to as the object spectrum) is represented by x, the relationship among the observation data b, the spectral characteristics A, and the object spectrum x is expressed by Equation (12) shown below.

$$b = Ax \tag{12}$$

The inverse problem of Equation (12) is then solved according to Equation (13), to determine the object spectrum x.

$$x = A^{-1}b \tag{13}$$

Here, the least absolute shrinkage and selection operators n(LASSO) estimation technique using a first-order norm may be used as a useful technique for solving the inverse problem of Equation (13), for example.

For example, where the LASSO estimation technique is used, Equation (14) shown below is established on the basis of Equation (12) described above.

[Mathematical Formula 6]

$$\hat{A}_{LASSO} = \operatorname{argmin}_x \{\|Ax - b\|^2 + \lambda \|Lx\|\} \tag{14}$$

Here, the second term on the right-hand side is called a regularization term or a penalty term, $\lambda$ represents the regularization parameter, and L represents the regularization matrix.

Equation (15) shown below is then derived from Equation (14), so that the object spectrum x can be determined.

[Mathematical Formula 7]

$$\hat{x} = \hat{A}_{LASSO} b \qquad (15)$$

Note that, on the right-hand side of Equation (14), regularization terms may be increased, like the third term, the fourth term, . . . , and the nth term, for example.

Further, another useful technique for solving the inverse problem of Equation (13) is ridge regression using a second-order norm, for example.

Where ridge regression is used, for example, Equation (16) shown below is established on the basis of Equation (12) described above.

[Mathematical Formula 9]

$$\hat{A}_{ridge} = \mathrm{argmin}_x\{\|Ax-b\|^2 + \lambda^2 \|Lx\|^2\} \qquad (16)$$

Here, the second term on the right-hand side is called a regularization term or a penalty term, λ represents the regularization parameter, and L represents the regularization matrix.

Equation (17) shown below is then derived from Equation (16), so that the object spectrum x can be determined.

[Mathematical Formula 9]

$$x = \hat{A}_{ridge} b \qquad (17)$$

Note that, on the right-hand side of Equation (16), regularization terms may be increased, like the third term, the fourth term, . . . , and the nth term, for example.

10. Example Applications

Next, example applications of the present technology are described.

<Example Applications of the Present Technology>

Figure 59:
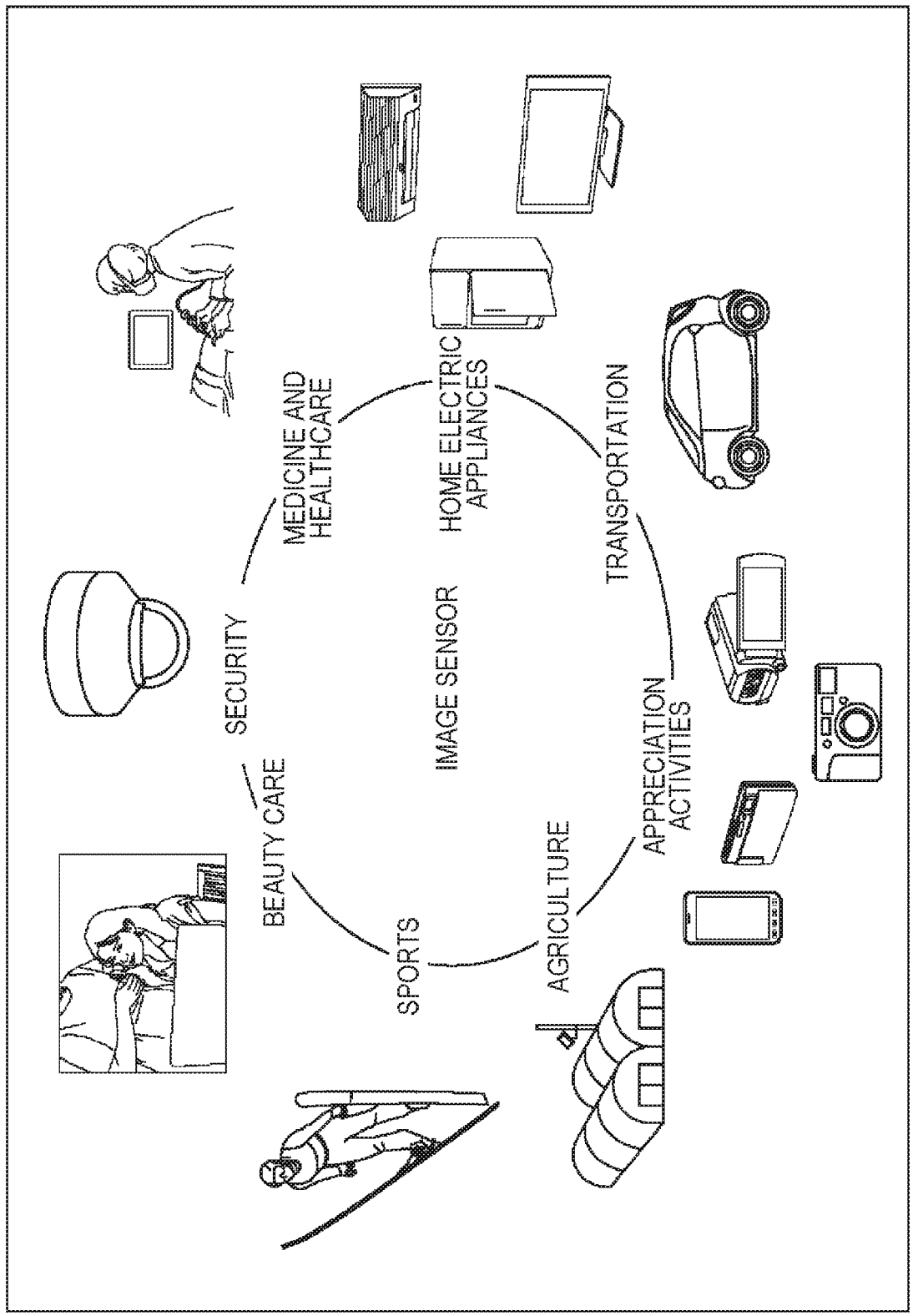
FIG. 59 is a diagram showing example applications of the present technology.

For example, the present technology can be applied in various cases where light such as visible light, infrared light, ultraviolet light, or an X-ray is sensed, as shown in FIG. 59.

Devices that take images for appreciation activities, such as digital cameras and portable devices with camera functions.

Devices for transportation use, such as vehicle-mounted sensors that take images of the front, the back, the surroundings, the inside, and the like of an automobile to perform safe driving such as an automatic stop or recognize a driver's condition and the like, surveillance cameras for monitoring running vehicles and roads, and ranging sensors for measuring distances between vehicles or the like.

Devices to be used in conjunction with home electric appliances, such as television sets, refrigerators, and air conditioners, to take images of gestures of users and operate the appliances in accordance with the gestures.

Devices for medical care use and health care use, such as endoscopes and devices for receiving infrared light for angiography.

Devices for security use, such as surveillance cameras for crime prevention and cameras for personal authentication.

Devices for beauty care use, such as skin measurement devices that image the skin, and microscopes that image the scalp.

Devices for sporting use, such as action cameras and wearable cameras for sports and the like.

Devices for agricultural use, such as cameras for monitoring conditions of fields and crops.

In the description below, more specific example applications are described.

For example, the transmission band of the narrowband filter NB of each narrowband pixel 51B of the imaging apparatus 10 shown in FIG. 1 is adjusted, so that the wavelength band of light to be detected by each narrowband pixel 51B of the imaging apparatus 10 (this wavelength band will be hereinafter referred to as the detection band) can be adjusted. The detection band of each narrowband pixel 51B is then set as appropriate, or a plurality of multispectral images is then used, so that the imaging apparatus 10 can be used for various purposes.

For example, the imaging apparatus 10 can be used for detecting a particular index. Typical examples of such indices include the normalized difference vegetation index (NDVI), SPAD values, the photochemical reflectance index (PRI), the palmer drought severity index (SDVI), the normalized difference soil moisture index (NDSMI), the leaf-color verified index (LVI), DDVI, and the like. Such examples also include simple ratios (SR), the global environment monitoring index (GEMI), the soil adjusted vegetation index (SAVI), the enhanced vegetation index (EVI), the perpendicular vegetation index (PVI), the structure insensitive pigment index (SIPI), the plant senescing reflectance index (PSRI), the chlorophyll index (CI), modified simple ratios (mSR), modified normalized differences (mND), the canopy chlorophyll index (CCI), the water index (WI), the normalized difference water index (NDWI), the cellulose absorption index (CAI), and the like.

For example, it is possible to determine the NDVI according to Equation (18) shown below, using a near-infrared (NIR) image and a red (RED) image.

$$\mathrm{NDVI} = (NIR\text{-}RED)/(NIR\text{+}RED) \qquad (18)$$

Further, FIG. 60 shows examples of the detection band in a case where the flavor and the degree of freshness of food are detected, for example.

For example, in a case where myoglobin indicating the flavor component of tuna, beef, or the like is detected, the peak wavelength of the detection band is in the range of 580 to 630 nm, and the half width is in the range of 30 to 50 nm. In a case where oleic acid indicating the degree of freshness of tuna, beef, or the like is detected, the peak wavelength of the detection band is 980 nm, and the half width is in the range of 50 to 100 nm. In a case where chlorophyll indicating the degree of freshness of a leafy vegetable such as "komatsuna" is detected, the peak wavelength of the detection band is in the range of 650 to 700 nm, and the half width is in the range of 50 to 100 nm.

FIG. 61 shows examples of the detection band in a case where the sugar content and the water content of a fruit are detected.

For example, in a case where a flesh light path length indicating the sugar content of "raiden", which is a kind of melon, is detected, the peak wavelength of the detection band is 880 nm, and the half width is in the range of 20 to 30 nm. In a case where sucrose indicating the sugar content of "raiden" is detected, the peak wavelength of the detection band is 910 nm, and the half width is in the range of 40 to 50 nm. In a case where sucrose indicating the sugar content of "raiden red", which is another kind of melon, is detected, the peak wavelength of the detection band is 915 nm, and the half width is in the range of 40 to 50 nm. In a case where water content indicating the sugar content of "raiden red" is detected, the peak wavelength of the detection band is 955 nm, and the half width is in the range of 20 to 30 nm.

In a case where sucrose indicating the sugar content of an apple is detected, the peak wavelength of the detection band is 912 nm, and the half width is in the range of 40 to 50 nm. In a case where water indicating the water content of an orange is detected, the peak wavelength of the detection band is 844 nm, and the half width is 30 nm. In a case where sucrose indicating the sugar content of an orange is detected, the peak wavelength of the detection band is 914 nm, and the half width is in the range of 40 to 50 nm.

FIG. 62 shows examples of the detection band in a case where plastics are separated.

For example, in a case where polyethylene terephthalate (PET) is detected, the peak wavelength of the detection band is 1669 nm, and the half width is in the range of 30 to 50 nm. In a case where polystyrene (PS) is detected, the peak wavelength of the detection band is 1688 nm, and the half width is in the range of 30 to 50 nm. In a case where polyethylene (PE) is detected, the peak wavelength of the detection band is 1735 nm, and the half width is in the range of 30 to 50 nm. In a case where polyvinyl chloride (PVC) is detected, the peak wavelength of the detection band is in the range of 1716 to 1726 nm, and the half width is in the range of 30 to 50 nm. In a case where polypropylene (PP) is detected, the peak wavelength of the detection band is in the range of 1716 to 1735 nm, and the half width is in the range of 30 to 50 nm.

The present technology can also be applied to freshness management for cut flowers, for example.

Further, the present technology can be applied to checking for foreign substances in foods, for example. For example, the present technology can be applied to detection of foreign substances such as skins, shells, stones, leaves, branches, and wood chips mixed in nuts and fruits such as almonds, blueberries, and walnuts. The present technology can also be applied to detection of foreign substances such as plastic pieces mixed in processed foods, beverages, and the like, for example.

Further, the present technology can be applied to detection of the normalized difference vegetation index (NDVI), which is a vegetation index, for example.

The present technology can also be applied to human detection, on the basis of a spectral shape in the neighborhood of a wavelength of 580 nm derived from hemoglobin of human skin, and/or a spectral shape in the neighborhood of a wavelength of 960 nm derived from melanin pigment contained in human skin, for example.

Further, the present technology can be applied to biometric detection (biometric authentication), user interfaces, prevention and monitoring of forgery of signatures and the like, and the like, for example.

<Example Application to an Electronic Apparatus>

Figure 63:
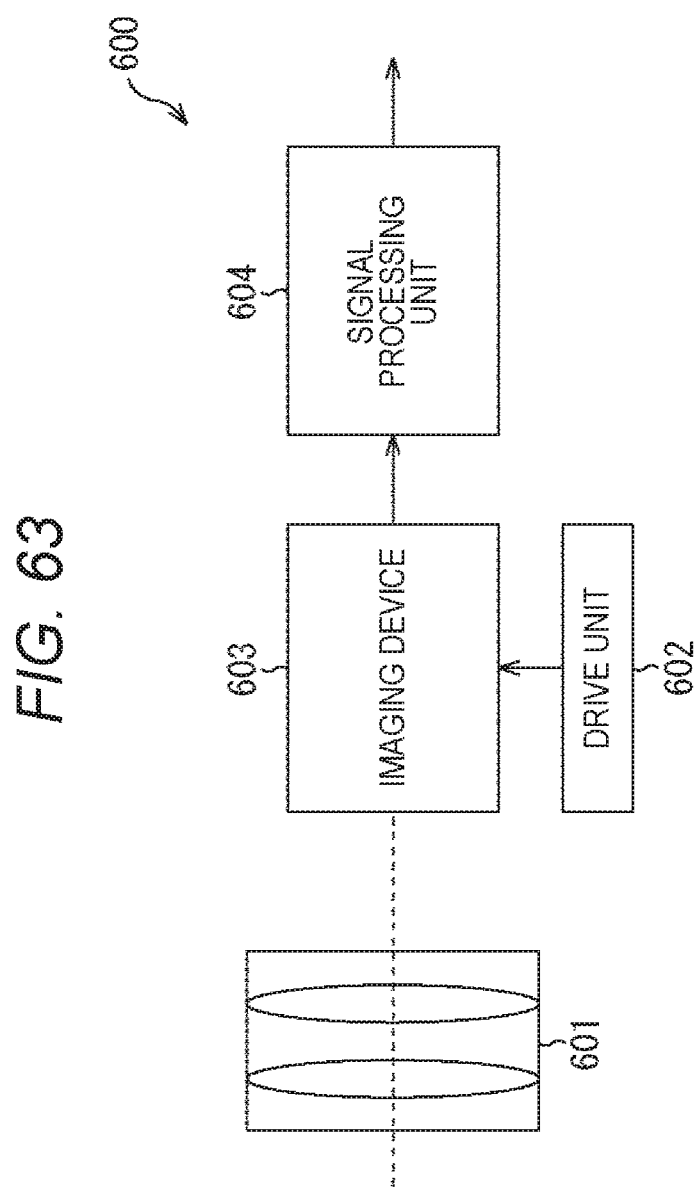
FIG. 63 is a block diagram showing an example configuration of an electronic apparatus.

FIG. 63 is a diagram showing an example configuration of an electronic apparatus to which the present technology is applied.

An electronic apparatus 600 includes an optical system configuration unit 601, a drive unit 602, an imaging device 603, and a signal processing unit 604.

The optical system configuration unit 601 includes an optical lens and the like, and causes an optical image of an object to enter the imaging device 603. The drive unit 602 controls the driving of the imaging device 603 by generating and outputting various kinds of timing signals related to the driving inside the imaging device 603. The signal processing unit 604 performs predetermined signal processing on an image signal output from the imaging device 603, and performs a process in accordance with the signal processing result. The signal processing unit 604 also outputs an image signal as the signal processing result to a subsequent stage, to record the image signal on a recording medium such as a solid-state memory, or transfer the image signal to a predetermined server via a predetermined network, for example.

Here, the imaging device 12 described above is used as the imaging device 603. Thus, it is possible to capture an image with a higher image quality, and increase the accuracy in detecting spectral characteristics.

<Example Application to an Imaging Module>

The present technology can also be applied to an imaging module that is used for various kinds of electronic apparatuses such as an imaging apparatus, for example. An imaging module includes the imaging device 12, an optical system (a lens or the like, for example) that causes the imaging device 12 to form an image of an object, and a signal processing unit (a DSP, for example) that processes a signal output from the imaging device 12, for example.

<Example Application to an Endoscopic Surgery System>

The technology according to the present disclosure may also be applied to an endoscopic surgery system, for example.

Figure 64:
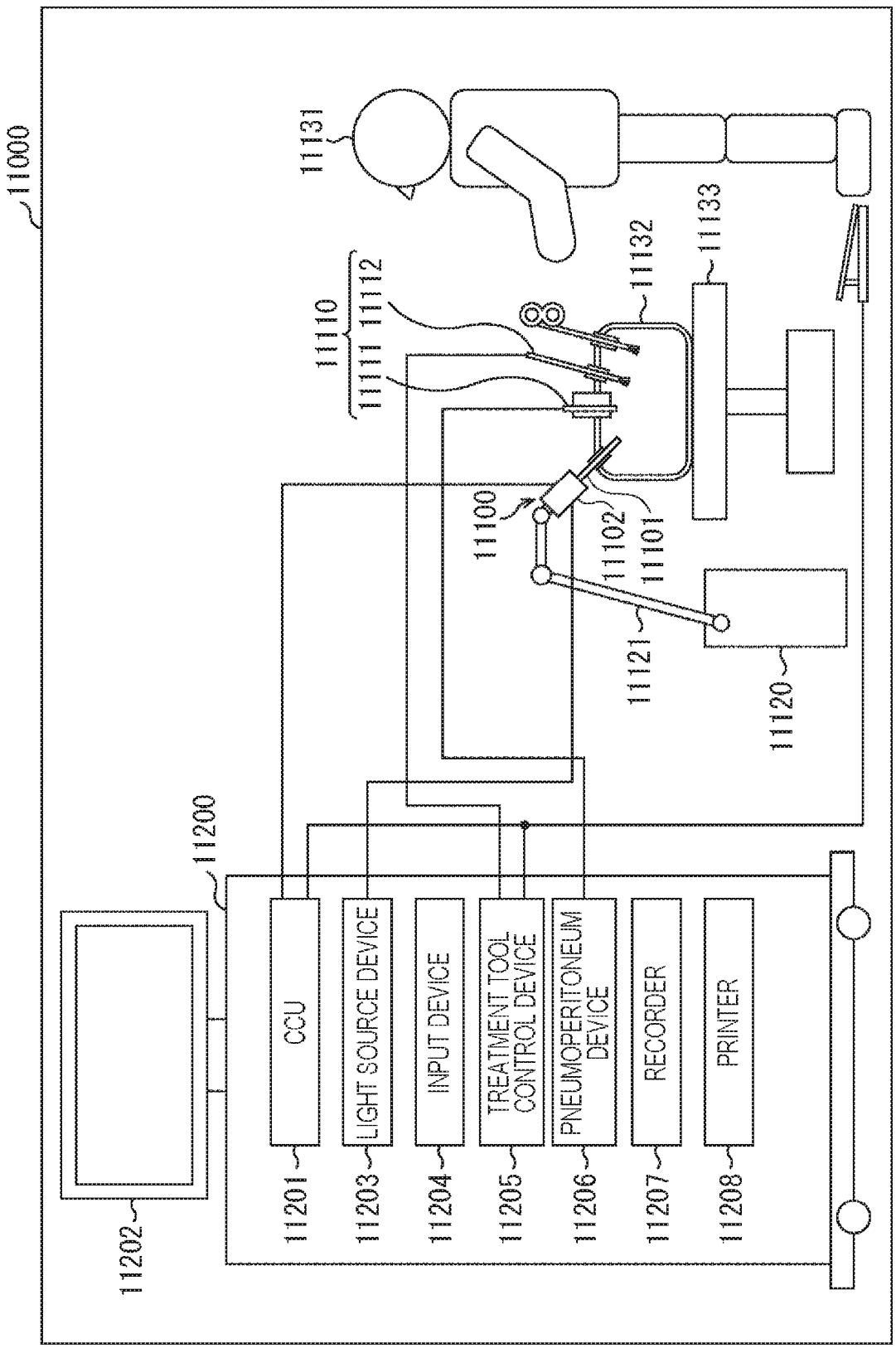
FIG. 64 is a diagram schematically showing an example configuration of an endoscopic surgery system.

FIG. 64 is a diagram schematically showing an example configuration of an endoscopic surgery system to which the technology (the present technology) according to the present disclosure may be applied.

FIG. 64 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is designed as a so-called rigid scope having a rigid lens barrel 11101. However, the endoscope 11100 may be designed as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (a demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrowband light observation (narrowband imaging) is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

Figure 65:
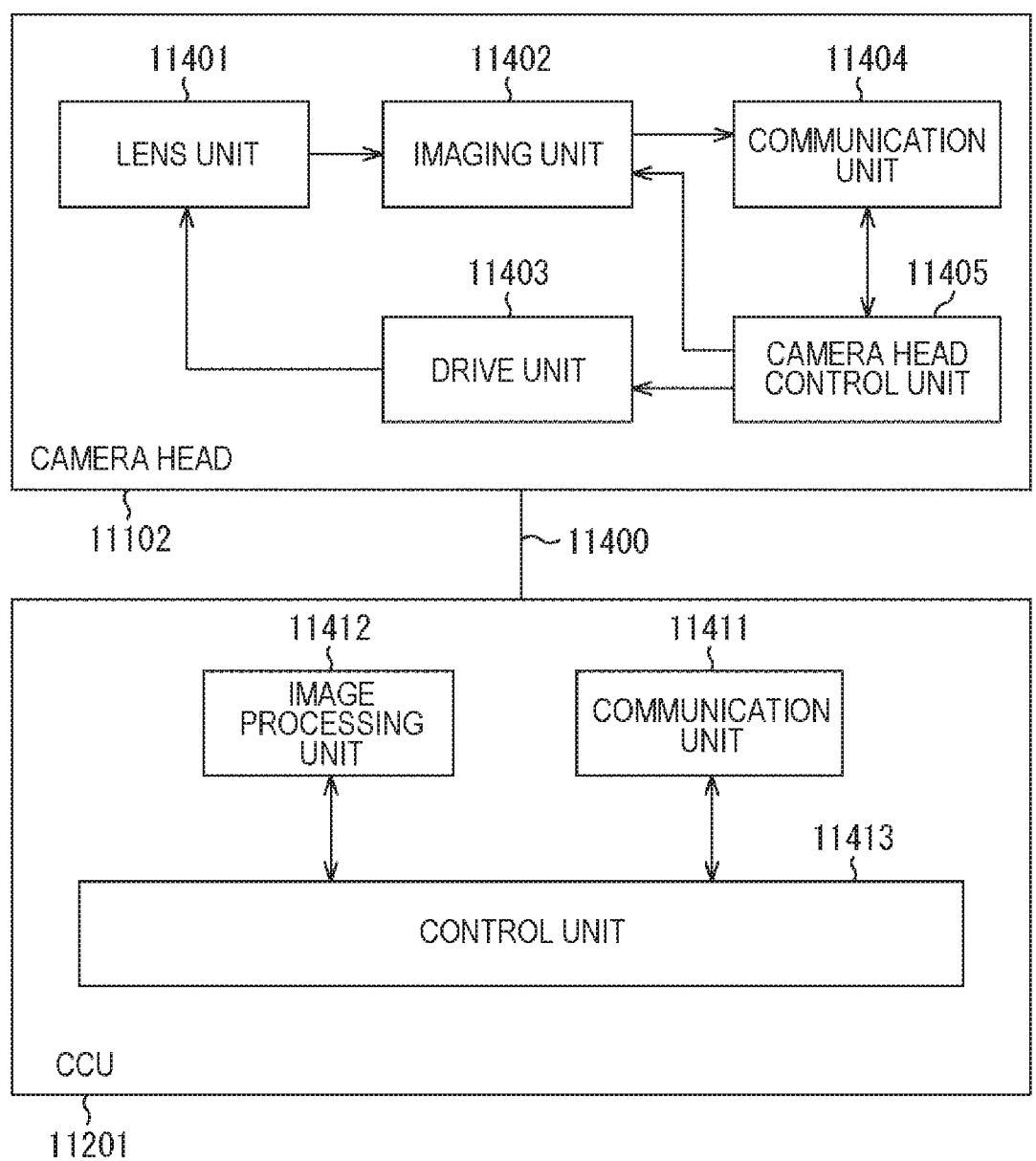
FIG. 65 is a block diagram showing an example of the functional configurations of a camera head and a CCU.

FIG. 65 is a block diagram showing an example of the functional configurations of the camera head 11102 and the CCU 11201 shown in FIG. 64.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the portion connecting to the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 is provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit

11401 by a predetermined distance along the optical axis. With this arrangement, the magnification and the focal point of the image captured by the imaging unit 11402 can be adjusted as appropriate.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

The communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

The communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical site or the like. For example, the control unit 11413 generates a control signal for controlling the driving of the camera head 11102.

The control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

An example of an endoscopic surgery system to which the technique according to the present disclosure can be applied has been described above. The technology according to the present disclosure may be applied to the imaging unit 11402 of the camera head 11102 among the components described above, for example. Specifically, the imaging device 12 described above can be applied to the imaging unit 10402, for example. This makes it possible to obtain an image of the surgical site with better image quality, and detect various kinds of indications, for example. Thus, the surgeon can check the surgical site in a more reliable manner.

Although an endoscopic surgery system has been described as an example herein, the technology according to the present disclosure may also be applied to a microscopic surgery system or the like, for example.

<Example Applications to Mobile Structures>

Further, the technology according to the present disclosure may be embodied as an apparatus mounted on any type of mobile structure, such as an automobile, an electrical vehicle, a hybrid electrical vehicle, a motorcycle, a bicycle, a personal mobility device, an airplane, a drone, a vessel, or a robot, for example.

Figure 66:
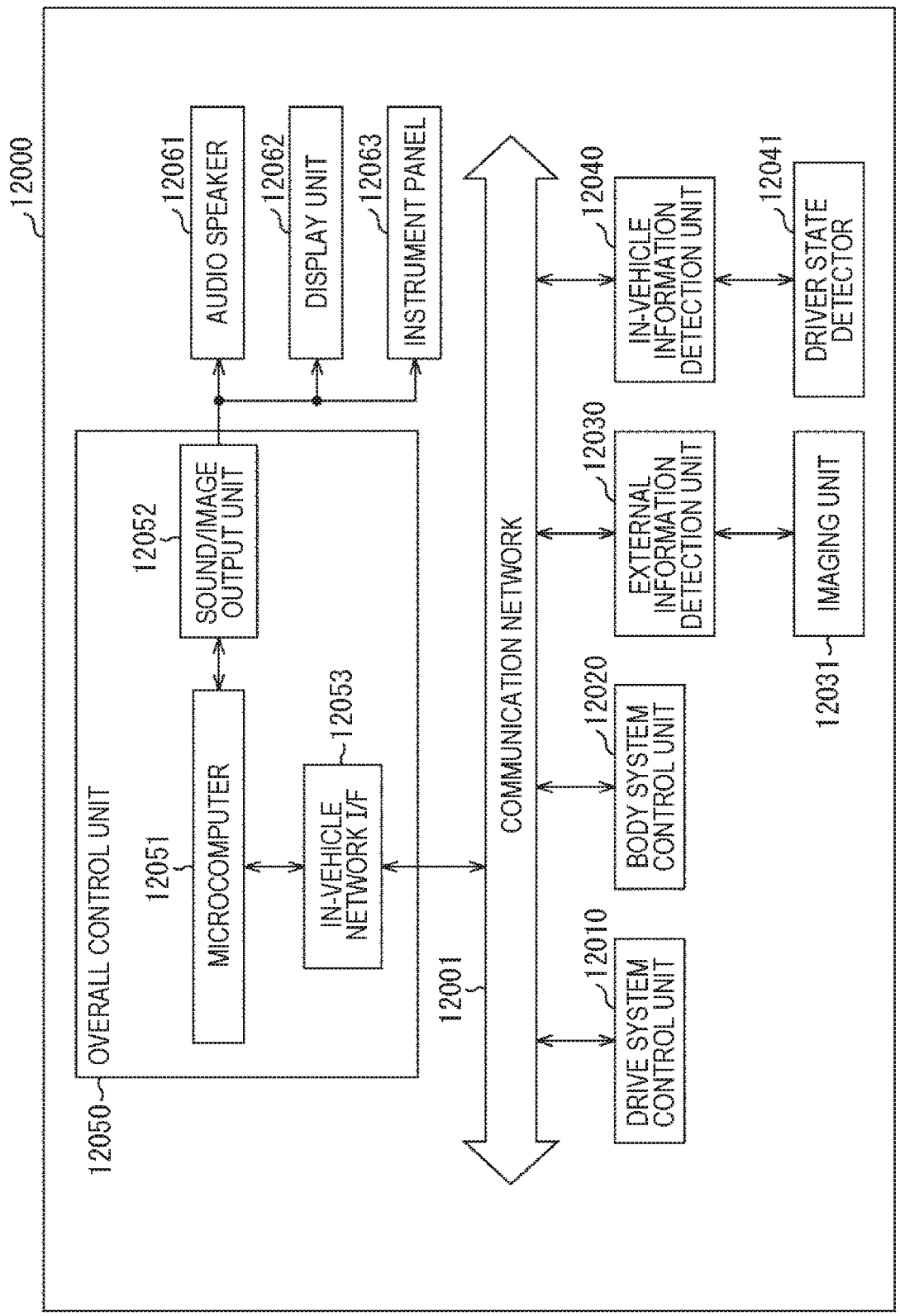
FIG. 66 is a block diagram schematically showing an example configuration of a vehicle control system.

FIG. 66 is a block diagram schematically showing an example configuration of a vehicle control system that is an example of a mobile structure control system to which the technology according to the present disclosure may be applied.

A vehicle control system 12000 includes a plurality of electronic control units connected via a communication network 12001. In the example shown in FIG. 66, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information about the outside of the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether or not the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

The microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

The microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 66, an audio speaker 12061, a display unit 12062, and an instrument panel 12063 are shown as output devices. The display unit 12062 may include an on-board display and/or a head-up display, for example.

Figure 67:
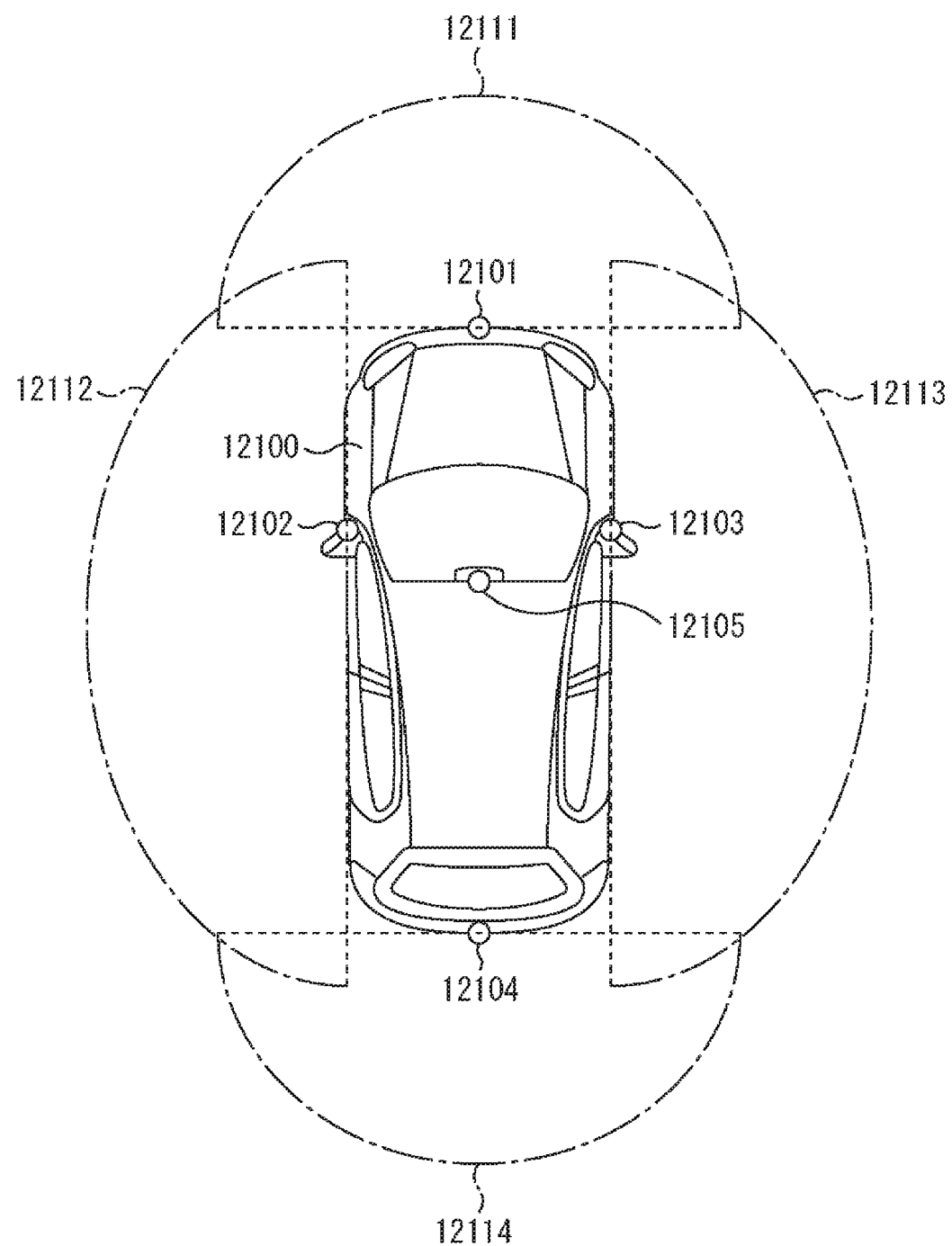
FIG. 67 is an explanatory diagram showing an example of installation positions of external information detectors and imaging units.

FIG. 67 is a diagram showing an example of installation positions of imaging units 12031.

In FIG. 67, a vehicle 12100 includes imaging units 12101, 12102, 12103, 12104, and 12105 as the imaging units 12031.

The imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 67 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. Then, the microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

An example of a vehicle control system to which the technology according to the present disclosure can be applied has been described above. The technology according to the present disclosure can be applied to the imaging units 12031 among the components described above, for example. Specifically, the imaging device 12 described above can be applied to the imaging units 12031, for example. This makes it possible to obtain a captured image with better image quality, and detect various kinds of indications, for example. Thus, the accuracy of detection of the situations outside the vehicle, and the like become higher. Further, the imaging units 12031 can be made smaller in size, for example.

11. Modifications

The following is a description of modifications of the above described embodiments of the present technology.

For example, in the imaging device 12A shown in FIG. 19, the narrowband filters NB may be disposed at higher locations than the color filters CF. In this case, the color filters CF are manufactured before the narrowband filters NB, but the color filters CF have a lower heat resistance than that of the narrowband filters NB. Therefore, the limitations on the manufacturing process, particularly the limitations on the temperature, need to be taken into consideration in conducting the design and manufacture.

The above described embodiments of the present technology can also be combined as appropriate. It is also possible to combine three or more embodiments.

Further, in the first embodiment and the second embodiment, for example, a light absorber that is neither a black filter nor an optical filter in which a red filter and a blue filter are stacked may be used. Such a light absorber preferably absorbs at least light in the wavelength band to be detected by the photodiodes PD, and more preferably absorbs not only visible light but also ultraviolet light and infrared light.

The present technology can also be applied to a semiconductor device in which a pixel including a metallic filter and a pixel not including any metallic filter are adjacent to each other, and to all electronic apparatuses including the semiconductor device. For example, the present technology can be applied not only to the back-illuminated CMOS image sensor described above, but also to a front-illuminated CMOS image sensor, a charge coupled device (CCD) image sensor, an image sensor having a photoconductor structure including an organic photoelectric conversion film and a quantum dot structure, and the like.

The present technology can also be applied to solid-state imaging devices (imaging devices) described below as examples.

<Example Configuration of a Cross-Section of a Solid-State Imaging Device to Which the Technology According to the Present Disclosure Can Be Applied>

Figure 68:
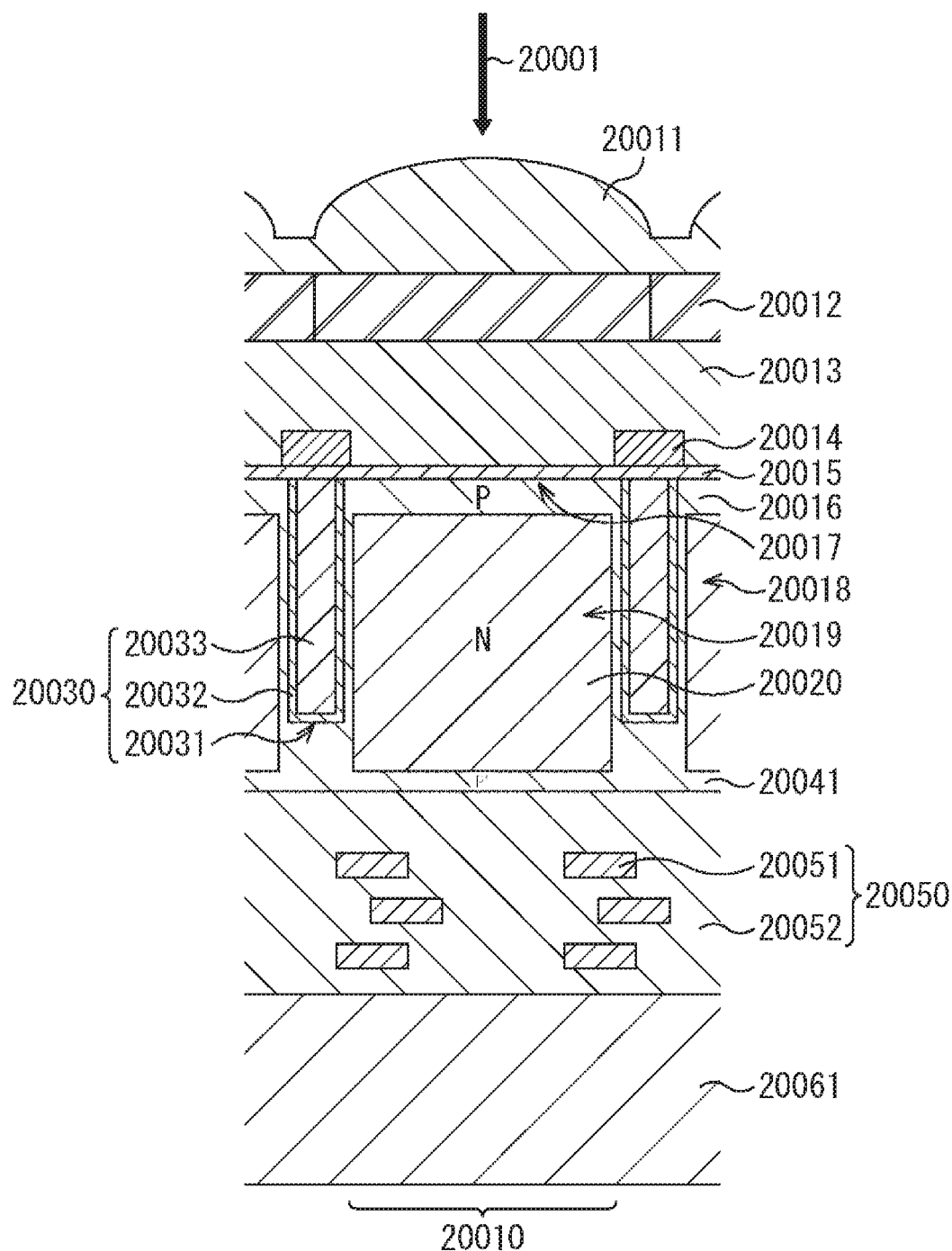
FIG. 68 is a cross-sectional view of an example configuration of a solid-state imaging device to which the technology according to the present disclosure can be applied, and a first example configuration of the pixel separation unit of the solid-state imaging device.

FIG. 68 is a cross-sectional view of an example configuration of a solid-state imaging device to which the technology according to the present disclosure can be applied.

In the solid-state imaging device, a photodiode (PD) 20019 receives incident light 20001 that enters from the back surface (the upper surface in the drawing) side of a semiconductor substrate 20018. Above the PD 20019, a planarizing film 20013, a filter layer 20012, and a microlens 20011 are disposed. The incident light 20001 that has entered and sequentially passed through the respective components is received by a light receiving surface 20017, so that photoelectric conversion is performed.

For example, in the PD 20019, an n-type semiconductor region 20020 is formed as the charge storage region that stores electric charges (electrons). In the PD 20019, the n-type semiconductor region 20020 is formed in p-type semiconductor regions 20016 and 20041 of the semiconductor substrate 20018. On a side of the n-type semiconductor region 20020, which is the front surface (the lower surface) side of the semiconductor substrate 20018, a p-type semiconductor region 20041 having a higher impurity concentration than the back surface (the upper surface) side is disposed. That is, the PD 20019 has a hole-accumulation diode (HAD) structure, and the p-type semiconductor regions 20016 and 20041 are formed so as to reduce generation of dark current in the respective interfaces with the upper surface side and the lower surface side of the n-type semiconductor region 20020.

In the semiconductor substrate 20018, a pixel separation unit 20030 that electrically separates a plurality of pixels 20010 from one another is provided, and the PD 20019 is disposed in a region partitioned by the pixel separation unit 20030. In a case where the solid-state imaging device is viewed from the upper surface side in the drawing, the pixel separation unit 20030 is formed in a grid-like form so as to be interposed between the plurality of pixels 20010, for example, and the PD 20019 is formed in a region partitioned by this pixel separation unit 20030.

In each PD 20019, the anode is grounded. In the solid-state imaging device, signal charges (electrons, for example) stored by the PD 20019 are read out via a transfer Tr (MOSFET) (not shown) or the like, and are output as an electrical signal to a vertical signal line (VSL) (not shown).

A wiring layer 20050 is provided in the front surface (the lower surface) of the semiconductor substrate 20018 on the opposite side from the back surface (the upper surface) in which the respective components such as a light-blocking film 20014, the filter layer 20012, the microlens 20011, and the like are provided.

The wiring layer 20050 includes wiring lines 20051 and an insulating layer 20052, and is designed so that the wiring lines 20051 are electrically connected to each component in the insulating layer 20052. The wiring layer 20050 is a so-called multilayer wiring layer, and is formed by alternately stacking interlayer insulating films constituting the insulating layer 20052 and the wiring lines 20051 a plurality of times. Here, respective wiring lines including a wiring line to a Tr for reading out electric charges from the PD 20019, such as a transfer Tr, a VSL, and the like are stacked as the wiring lines 20051 via the insulating layer 20052.

A support substrate 20061 is provided on the surface of the wiring layer 20050 on the opposite side from the side on which the PD 20019 is provided. For example, a substrate including a silicon semiconductor with a thickness of several hundreds of μm is provided as the support substrate 20061.

The light-blocking film 20014 is disposed on the back surface (the upper surface in the drawing) side of the semiconductor substrate 20018.

The light-blocking film 20014 is designed so as to block part of the incident light 20001 traveling from above the semiconductor substrate 20018 toward the back surface of the semiconductor substrate 20018.

The light-blocking film 20014 is disposed above the pixel separation unit 20030 formed inside the semiconductor substrate 20018. Here, the light-blocking film 20014 is disposed so as to protrude in a convex form from the back surface (the upper surface) of the semiconductor substrate 20018 via an insulating film 20015 such as a silicon oxide film. On the other hand, above the PD 20019 provided inside the semiconductor substrate 20018, the light-blocking film 20014 is not disposed, but the portion is left open so that the incident light 20001 can enter the PD 20019.

That is, in a case where the solid-state imaging device is viewed from the upper surface side in the drawing, the planar shape of the light-blocking film 20014 is a grid-like shape, and an opening through which the incident light 20001 travels to the light receiving surface 20017 is formed.

The light-blocking film 20014 is formed with a light-blocking material that blocks light. For example, a titanium (Ti) film and a tungsten (W) film are stacked in this order, to form the light-blocking film 20014. Alternatively, a titanium nitride (TiN) film and a tungsten (W) film are stacked in this order, to form the light-blocking film 20014, for example.

The light-blocking film 20014 is covered with the planarizing film 20013. The planarizing film 20013 is formed with an insulating material that passes light.

The pixel separation unit 20030 has a groove portion 20031, a fixed charge film 20032, and an insulating film 20033.

The fixed charge film 20032 is formed so as to cover the groove portion 20031 that partitions the plurality of pixels 20010, on the back surface (upper surface) side of the semiconductor substrate 20018.

Specifically, the fixed charge film 20032 is designed to have a constant thickness and cover the inner surface of the groove portion 20031 formed on the back surface (upper surface) side of the semiconductor substrate 20018. The insulating film 20033 is then provided (buried) so as to fill the inside of the groove portion 20031 covered with the fixed charge film 20032.

Here, the fixed charge film 20032 is formed with a high dielectric material having negative fixed charges, so that a positive charge (hole) storage region is formed at the interface with the semiconductor substrate 20018, and generation of dark current is reduced. As the fixed charge film 20032 is formed to have negative fixed charges, an electric field is applied to the interface with the semiconductor substrate 20018 by the negative fixed charges, and thus, a positive charge (hole) storage region is formed.

The fixed charge film 20032 can be formed with a hafnium oxide film (HfO2 film), for example. Alternatively, the fixed charge film 20032 can be formed to include at least one of oxides of hafnium, zirconium, aluminum, tantalum, titanium, magnesium, yttrium, a lanthanoid, or the like, for example.

In the filter layer 20012, a color filter and a narrowband filter made of a metal are provided as described above, for example.

<Example Configuration of a Cross-Section of the Pixel Separation Unit of a Solid-State Imaging Device to Which the Technology According to the Present Disclosure Can Be Applied>

FIG. 68 described above also shows a first example configuration of the pixel separation unit of a solid-state imaging device to which the technology according to the present disclosure can be applied.

Specifically, the pixel separation unit 20030 is formed with an insulating material so as to partition the plurality of pixels 20010, and electrically separates the plurality of pixels 20010 from one another.

The pixel separation unit 20030 includes the groove portion 20031, the fixed charge film 20032, and the insulating film 20033, and is formed so as to be buried in the semiconductor substrate 20018 on the side of the back surface (the upper surface in the drawing) of the semiconductor substrate 20018.

That is, on the back surface (upper surface) side of the semiconductor substrate 20018, the groove portion 20031 is formed so as to partition the n-type semiconductor regions 20020 forming the charge storage regions of the PDs 20019. The inside of the groove portion 20031 is covered with the fixed charge film 20032, and the groove portion 20031 is further filled with the insulating film 20033, to form the pixel separation unit 20030.

In a case where the solid-state imaging device is viewed from the upper surface side in the drawing, the planar shape of the pixel separation unit 20030 is a grid-like shape, and is interposed between the plurality of pixels 20010. The PDs 20019 are then formed in the rectangular regions partitioned by the grid-like pixel separation unit 20030.

For example, a silicon oxide film (SiO), a silicon nitride film (SiN), or the like can be used as the insulating film 20033 of the pixel separation unit 20030. The pixel separation unit 20030 may be formed by shallow trench isolation, for example.

Figure 69:
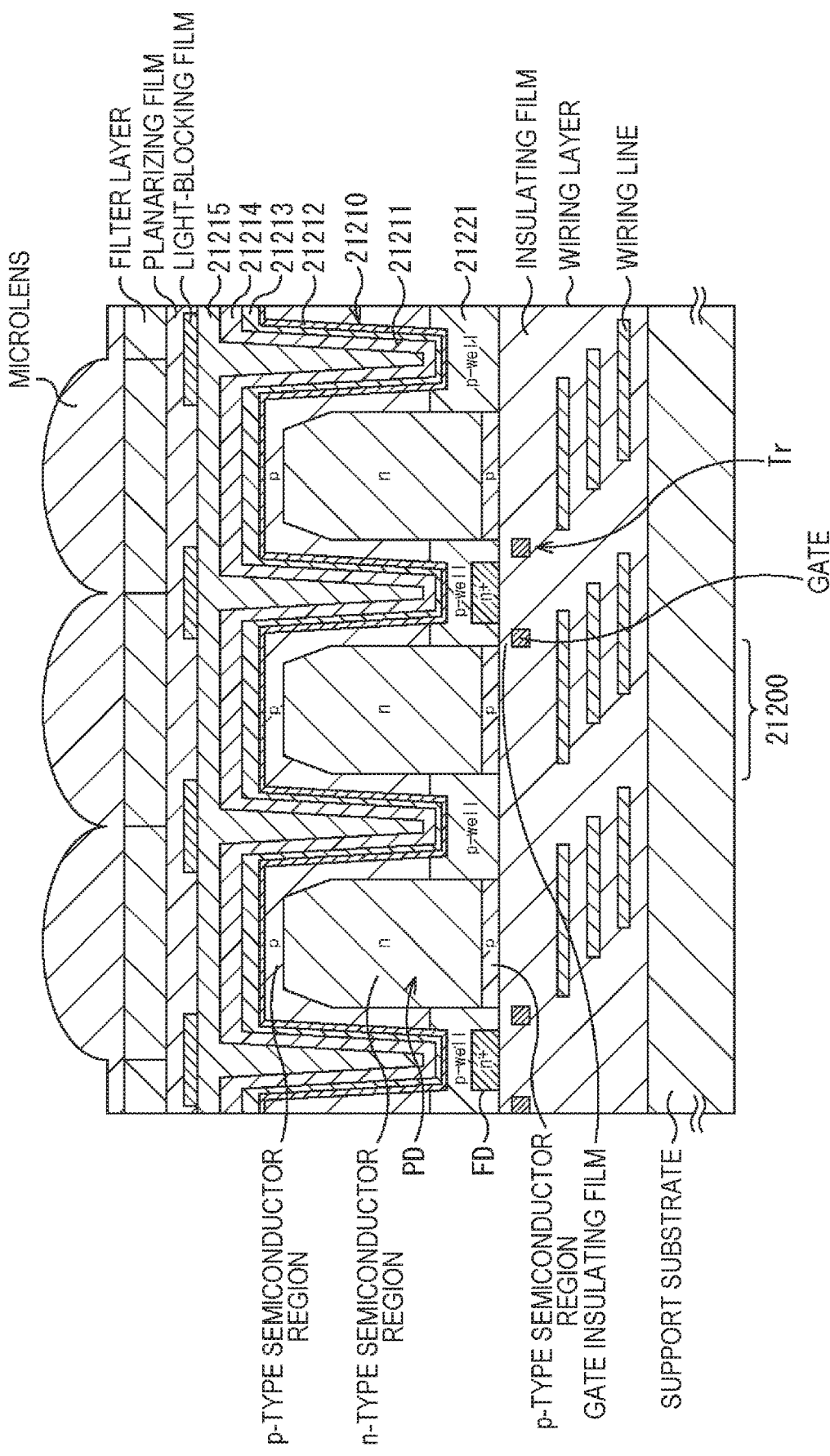
FIG. 69 is a cross-sectional view of a second example configuration of the pixel separation unit of a solid-state imaging device to which the technology according to the present disclosure can be applied.

FIG. 69 is a cross-sectional view of a second example configuration of the pixel separation unit of a solid-state imaging device to which the technology according to the present disclosure can be applied.

In FIG. 69, a first fixed charge film 21212, a second fixed charge film 21213, a first insulating film 21214, and a second insulating film 21215 are buried in this order in a groove portion 21211, to form a pixel separation unit 21210 that separates pixels 21200 from one another. The groove portion 21211 is formed to have a tapered cross-sectional shape so that the aperture diameter becomes smaller in the depth direction of a substrate 21221.

Note that it is possible to form the pixel separation unit 21210 by burying the first fixed charge film 21212, the second fixed charge film 21213, the first insulating film 21214, and the second insulating film 21215 not in this order in the groove portion 21211. For example, it is possible to form the pixel separation unit 21210 by alternately burying insulating films and fixed charge films in the groove portion 21211, such as burying the first insulating film 21214, the first fixed charge film 21212, the second insulating film 21215, and the second fixed charge film 21213 in this order.

Figure 70:
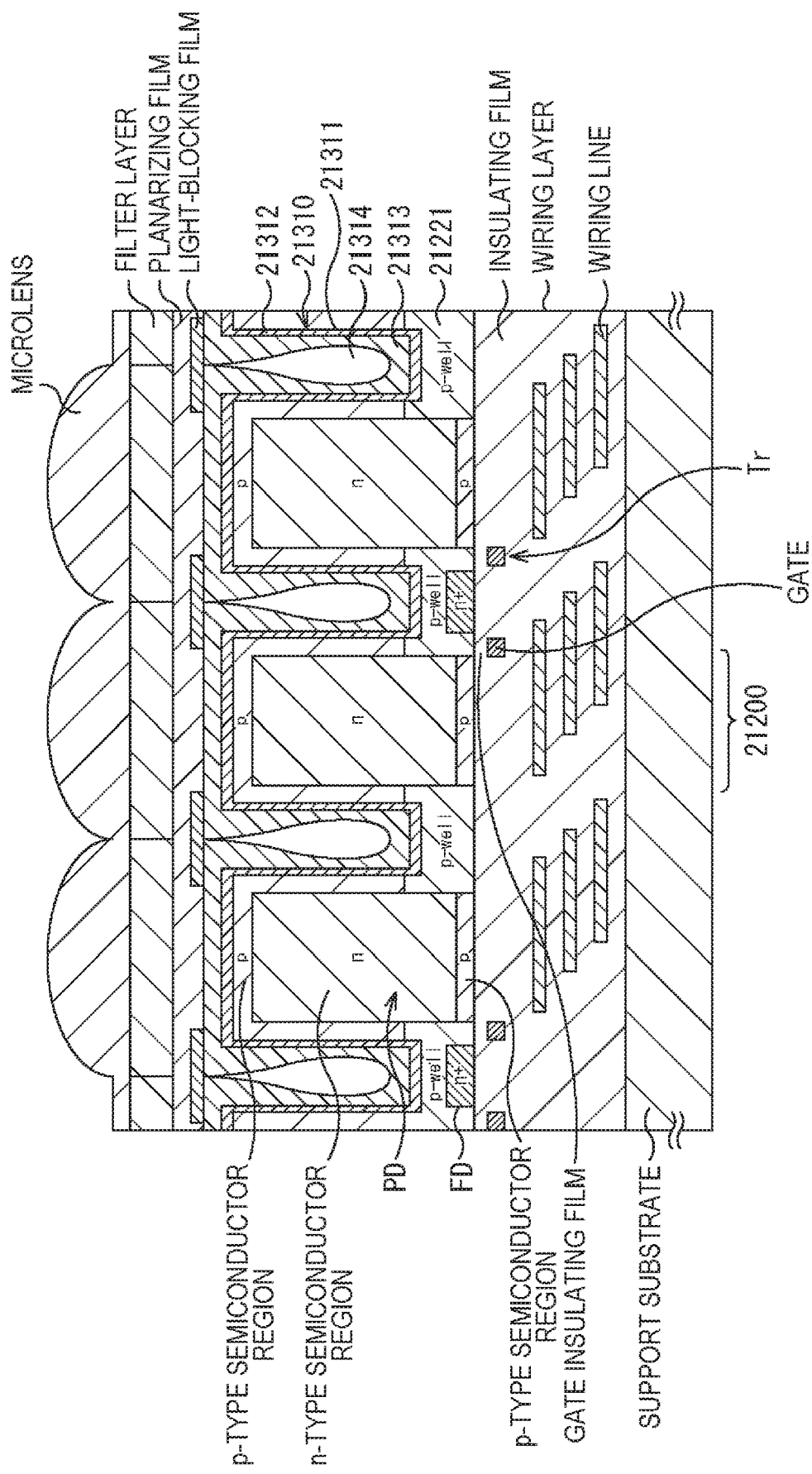
FIG. 70 is a cross-sectional view of a third example configuration of the pixel separation unit of a solid-state imaging device to which the technology according to the present disclosure can be applied.

FIG. 70 is a cross-sectional view of a third example configuration of the pixel separation unit of a solid-state imaging device to which the technology according to the present disclosure can be applied.

In the solid-state imaging device in FIG. 70, a pixel separation unit 21310 that separates the pixels 21200 from one another has a hollow structure. In this aspect, the solid-state imaging device in FIG. 70 differs from the case shown in FIG. 69 where the pixel separation unit 21210 does not have a hollow structure. The solid-state imaging device in FIG. 70 does not have a tapered groove portion 21311. In this aspect, the solid-state imaging device in FIG. 70 also differs from the case shown in FIG. 69 where the groove portion 21211 has a tapered shape. Note that the groove portion 21311 can be formed in a tapered shape like the groove portion 21211 shown in FIG. 69.

The pixel separation unit 21310 is formed by burying a fixed charge film 21312 and an insulating film 21313 in this order in the groove portion 21311 formed in the depth direction from the back surface side (the upper side) of the substrate 21221. A hollow portion (a so-called void) 21314 is formed inside the groove portion 21311.

That is, the fixed charge film 21312 is formed on the inner wall surface of the groove portion 21311 and the back surface side of the substrate 21221, and the insulating film 21313 is formed so as to cover the fixed charge film 21312. Further, to form the hollow portion 21314 in the groove portion 21311, the insulating film 21313 is formed to have such a film thickness that does not completely fill the groove portion 21311 inside the groove portion 21311, and is formed so as to close the groove portion 21311 at the opening end of the groove portion 21311. The insulating film 21313 can be formed with a material such as silicon oxide, silicon nitride, silicon oxynitride, or resin, for example.

<Example Configuration of a Stacked Solid-State Imaging Device to Which the Technology According to the Present Disclosure Can Be Applied>

Figure 71A:
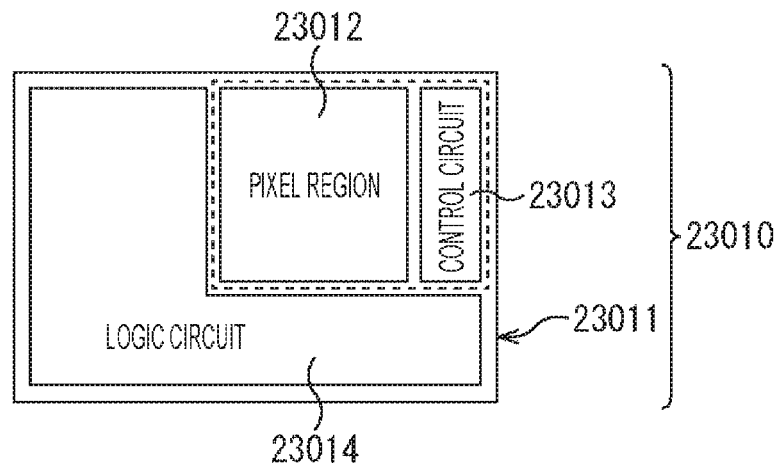
FIGS. 71A, 71B, and 71C are diagrams showing outlines of example configurations of stacked solid-state imaging devices to which the technology according to the present disclosure can be applied.
Figure 71B:
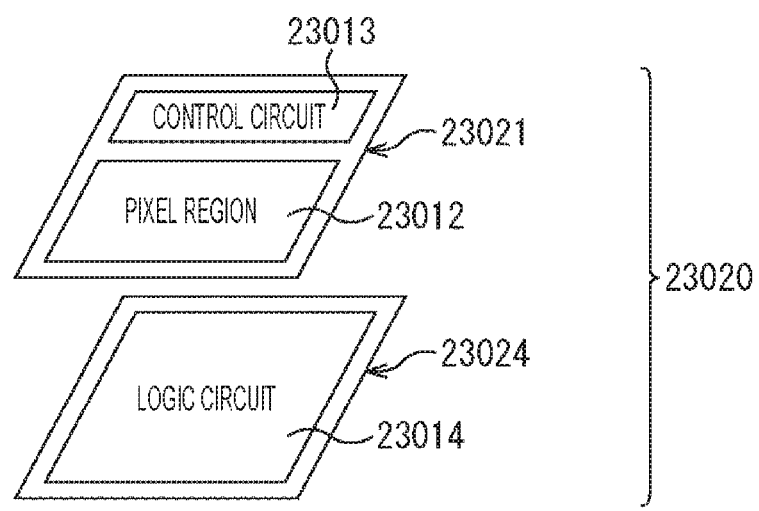
Figure 71C:
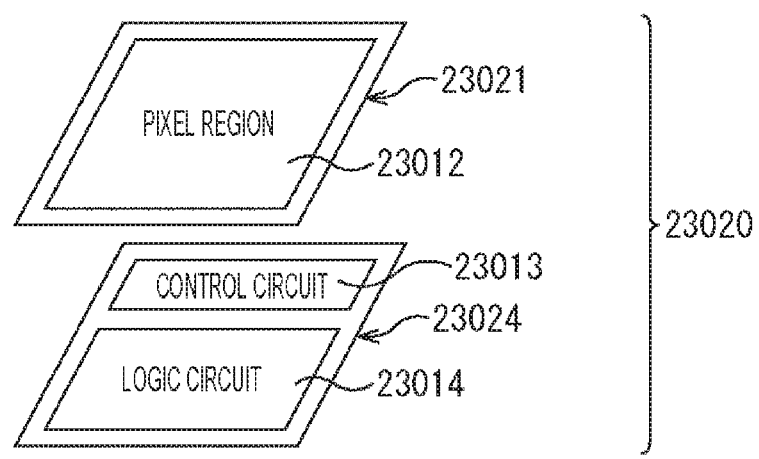

FIGS. 71A, 71B, and 71C are diagrams showing outlines of example configurations of stacked solid-state imaging devices to which the technology according to the present disclosure can be applied.

FIG. 71 shows a schematic example configuration of a non-stacked solid-state imaging device. As shown in FIG. 71A, a solid-state imaging device 23010 has one die (a semiconductor substrate) 23011. A pixel region 23012 in which pixels are arranged in an array, a control circuit 23013 that controls driving of the pixels and performs other various kinds of control, and a logic circuit 23014 for performing signal processing are mounted on the die 23011.

FIGS. 71B and 71C show schematic example configurations of a stacked solid-state imaging device. As shown in FIGS. 71B and 71C, a solid-state imaging device 23020 is designed as a single semiconductor chip in which two dies, which are a sensor die 23021 and a logic die 23024, are stacked and are electrically connected.

In FIG. 71B, the pixel region 23012 and the control circuit 23013 are mounted on the sensor die 23021, and the logic circuit 23014 including a signal processing circuit that performs signal processing is mounted on the logic die 23024.

In FIG. 71C, the pixel region 23012 is mounted on the sensor die 23021, and the control circuit 23013 and the logic circuit 23014 are mounted on the logic die 23024.

Figure 72:
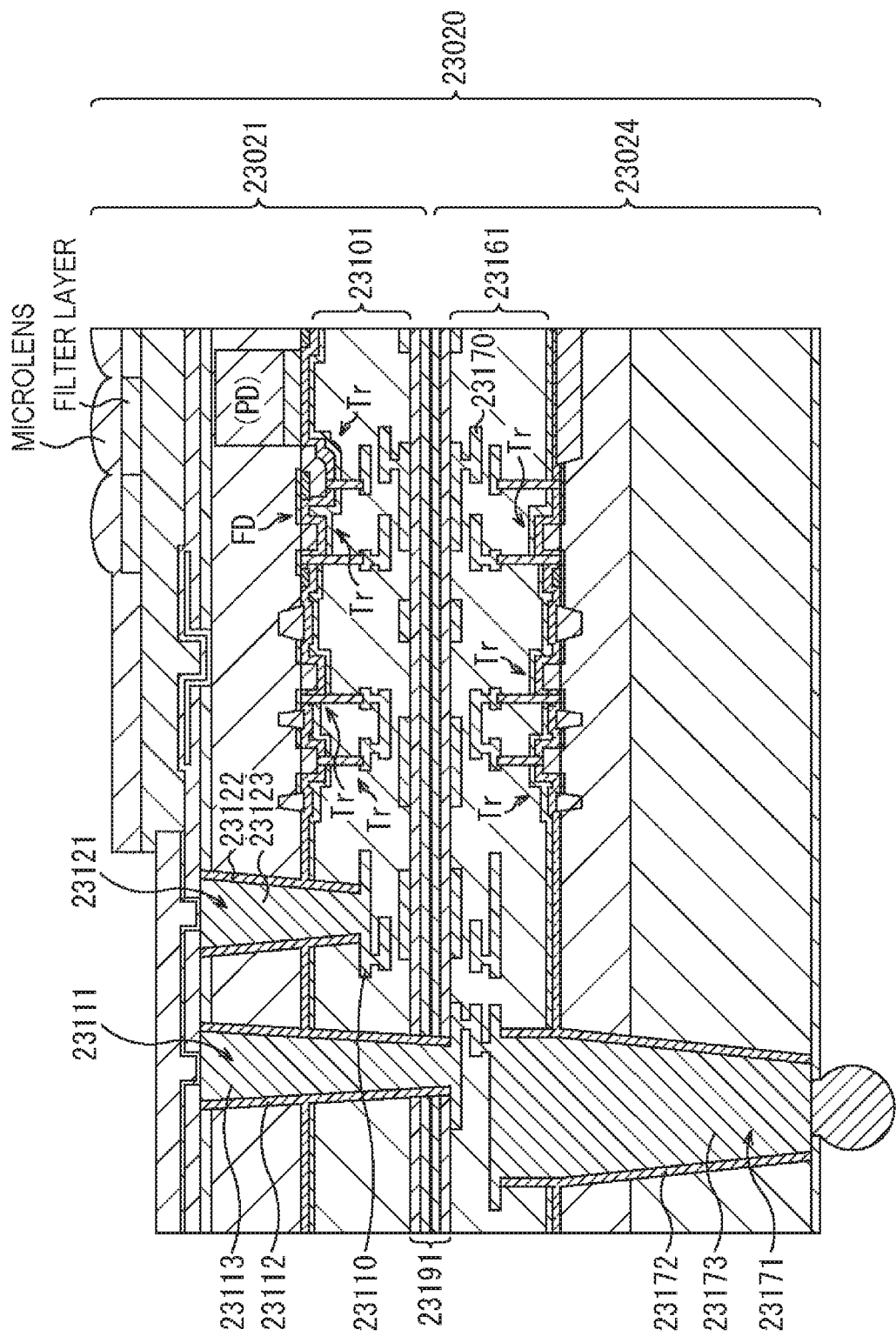

FIG. 72 is a cross-sectional view showing an example configuration of the stacked solid-state imaging device 23020.

In the sensor die 23021, photodiodes (PDs) forming the pixels constituting the pixel region 23012, floating diffusions (FDs), Trs (MOSFETs), Trs serving as the control circuit 23013, and the like are formed. A wiring layer 23101 having a plurality of layers, which are three layers of wiring lines 23110 in this example, is further formed in the sensor die 23021. Note that (the Trs to be) the control circuit 23013 can be formed in the logic die 23024, instead of the sensor die 23021.

In the logic die 23024, Trs constituting the logic circuit 23014 are formed. A wiring layer 23161 having a plurality of layers, which are three layers of wiring lines 23170 in this example, is further formed in the logic die 23024. In the logic die 23024, a connecting hole 23171 having an insulating film 23172 formed on its inner wall surface is also formed, and a connected conductor 23173 connected to the wiring lines 23170 and the like is buried in the connecting hole 23171.

The sensor die 23021 and the logic die 23024 are bonded so that the respective wiring layers 23101 and 23161 face each other. Thus, the stacked solid-state imaging device 23020 in which the sensor die 23021 and the logic die 23024 are stacked is formed. For example, the sensor die 23021 and the logic die 23024 are stacked so that the wiring lines 23110 and 23170 are in direct contact, and heat is then applied while a required load is applied, so that the wiring lines 23110 and 23170 are bonded directly to each other. Thus, the solid-state imaging device 23020 is formed.

In the sensor die 23021, a connecting hole 23111 is formed. The connecting hole 23111 penetrates the sensor die 23021 from the back surface side (the side at which light enters the PDs) (the upper side) of the sensor die 23021, and reaches the wiring lines 23170 in the uppermost layer of the logic die 23024. A connecting hole 23121 that is located in the vicinity of the connecting hole 23111 and reaches the wiring lines 23110 in the first layer from the back surface side of the sensor die 23021 is further formed in the sensor die 23021. An insulating film 23112 is formed on the inner wall surface of the connecting hole 23111, and an insulating film 23122 is formed on the inner wall surface of the connecting hole 23121. Connected conductors 23113 and 23123 are then buried in the connecting holes 23111 and 23121, respectively. The connected conductor 23113 and the connected conductor 23123 are electrically connected on the back surface side of the sensor die 23021. Thus, the sensor die 23021 and the logic die 23024 are electrically connected via the wiring layer 23101, the connecting hole 23121, the connecting hole 23111, and the wiring layer 23161.

Figure 73:
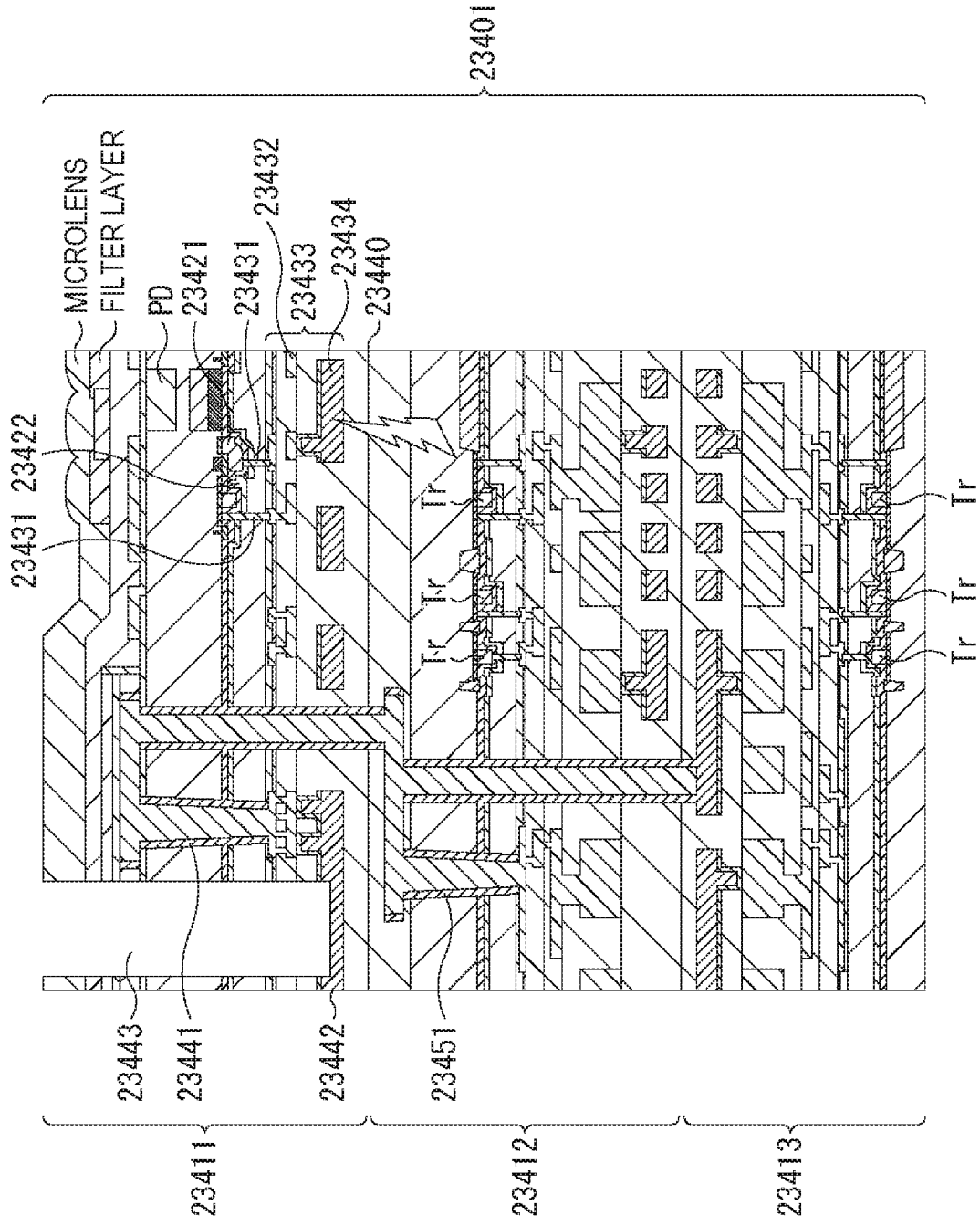

FIG. 73 is a cross-sectional view showing another example configuration of a stacked solid-state imaging device to which the technology according to the present disclosure can be applied.

In FIG. 73, a solid-state imaging device 23401 has a three-layer stack structure in which the three dies of a sensor die 23411, a logic die 23412, and a memory die 23413 are stacked.

The memory die 23413 includes a memory circuit that stores data to be temporarily required in signal processing to be performed in the logic die 23412, for example.

In FIG. 73, the logic die 23412 and the memory die 23413 are stacked in this order under the sensor die 23411. However, the logic die 23412 and the memory die 23413 may be stacked in reverse order. In other words, the memory die 23413 and the logic die 23412 can be stacked in this order under the sensor die 23411.

Note that, in FIG. 73, PDs serving as the photoelectric conversion units of the pixels, and the source/drain regions of the pixels Tr are formed in the sensor die 23411.

A gate electrode is formed around a PD via a gate insulating film, and the gate electrode and a pair of source/drain regions form a pixel Tr 23421 and a pixel Tr 23422.

The pixel Tr 23421 adjacent to the PD is a transfer Tr, and one of the source/drain regions constituting the pixel Tr 23421 is an FD.

Further, an interlayer insulating film is formed in the sensor die 23411, and a connecting hole is formed in the interlayer insulating film. In the connecting hole, a connected conductor 23431 connected to the pixel Tr 23421 and the pixel Tr 23422 is formed.

Further, a wiring layer 23433 having a plurality of layers of wiring lines 23432 connected to each connected conductor 23431 is formed in the sensor die 23411.

Aluminum pads 23434 serving as electrodes for external connection are also formed in the lowermost layer of the wiring layer 23433 in the sensor die 23411. That is, in the sensor die 23411, the aluminum pads 23434 is formed at positions closer to the bonding surface 23440 with the logic die 23412 than the wiring lines 23432. Each aluminum pad 23434 is used as one end of a wiring line related to inputting/outputting of signals from/to the outside.

Further, a contact 23441 to be used for electrical connection with the logic die 23412 is formed in the sensor die 23411. The contact 23441 is connected to a contact 23451 of the logic die 23412, and also to an aluminum pad 23442 of the sensor die 23411.

Further, a pad hole 23443 is formed in the sensor die 23411 so as to reach the aluminum pad 23442 from the back surface side (the upper side) of the sensor die 23411.

<Example Configuration of a Solid-State Imaging Device Sharing a Plurality of Pixels to Which the Technology According to the Present Disclosure Can Be Applied>

Figure 74:
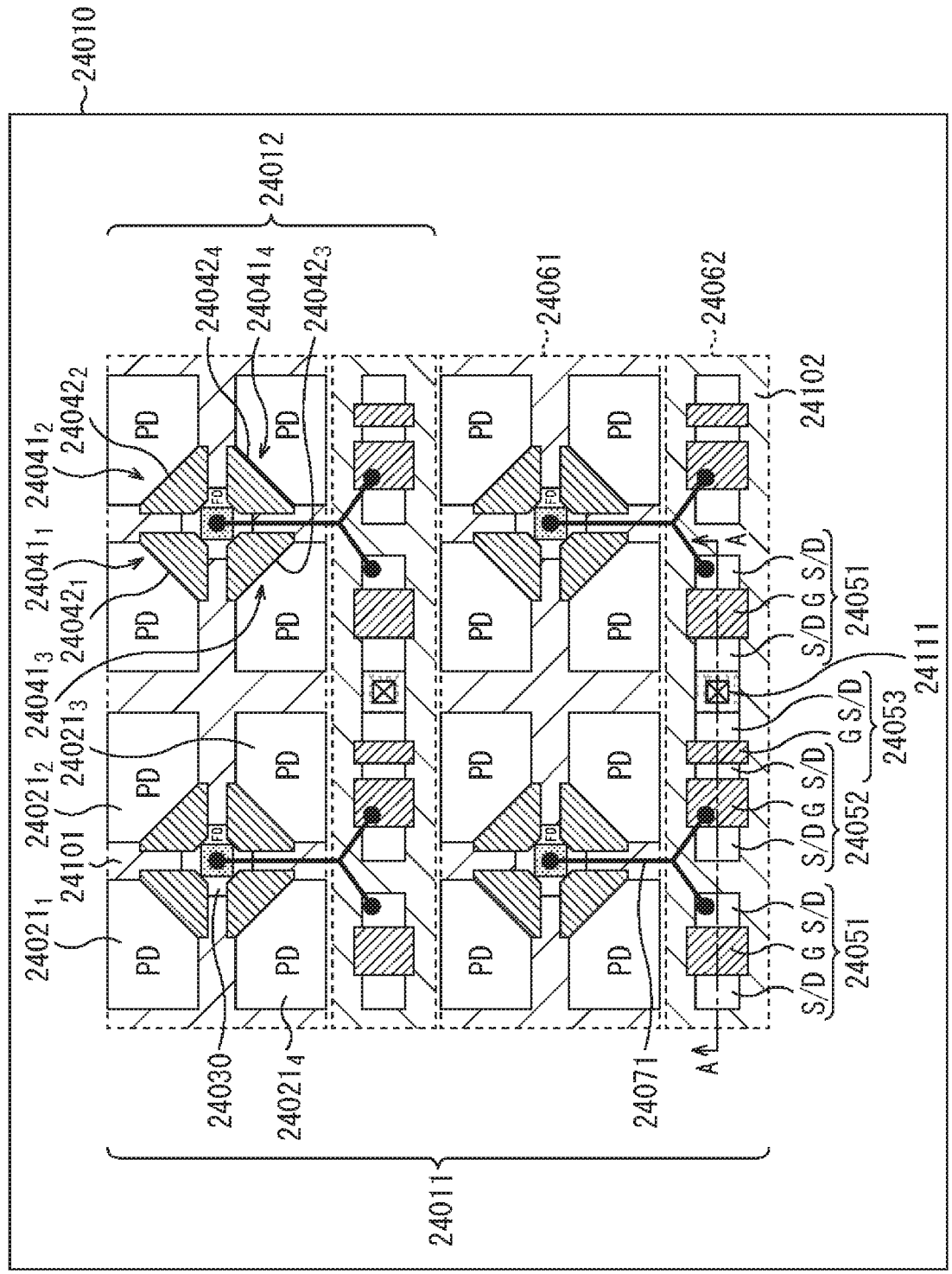
Figure 75:
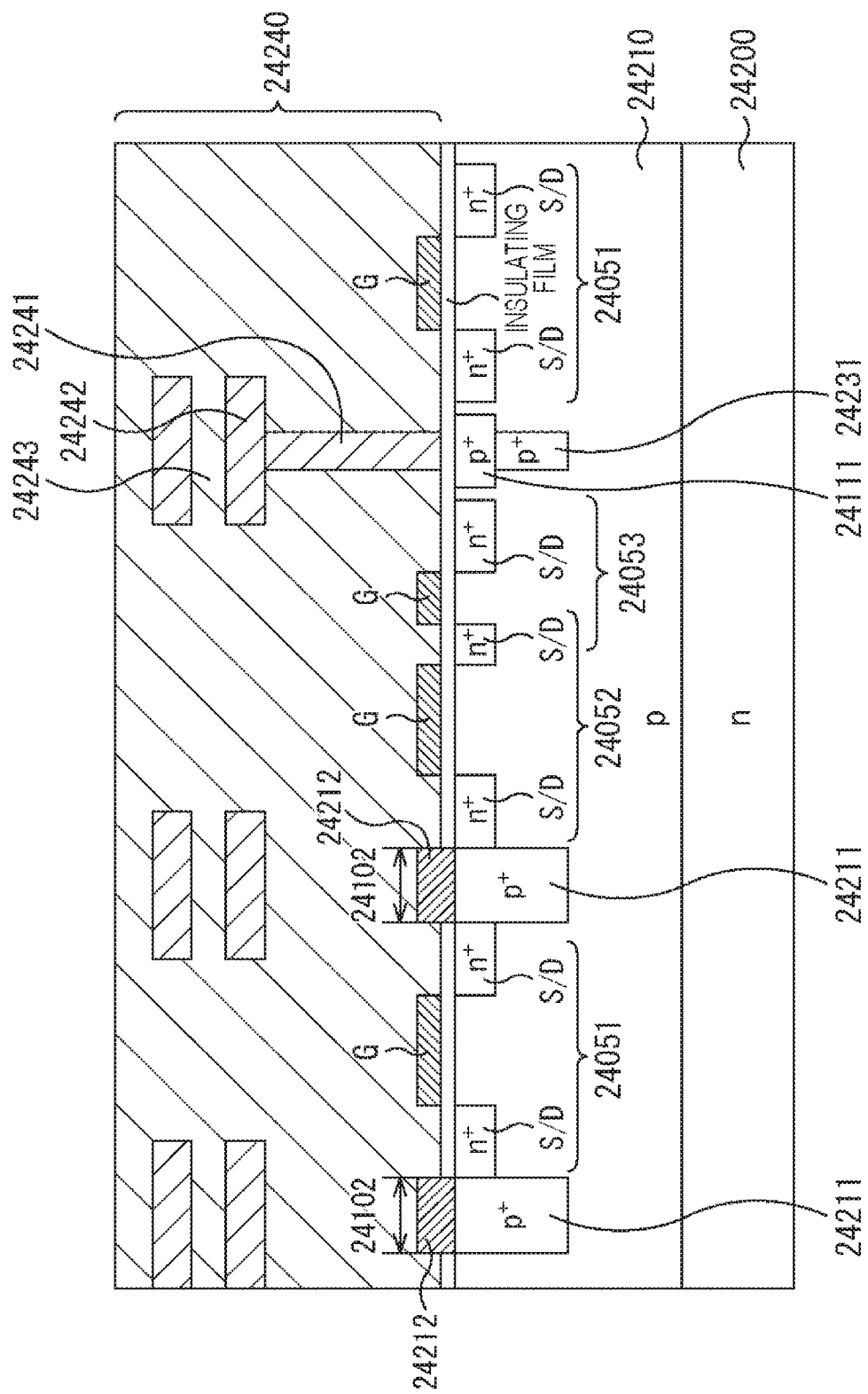

FIG. 74 is a plan view showing an example configuration of a solid-state imaging device that shares a plurality of pixels to which the technology according to the present disclosure can be applied. FIG. 75 is a cross-sectional view taken along the line A-A defined in FIG. 74.

A solid-state imaging device 24010 has a pixel region 24011 in which pixels are arranged in a two-dimensional array. The pixel region 24011 is designed such that a total of four pixels, which are two pixels in the horizontal direction and two pixels in the vertical direction, form a sharing pixel unit 24012 that shares a pixel Tr (MOSFET) and the like, and the sharing pixel units 24012 are arranged in a two-dimensional array.

The four pixels of a 4-pixel-sharing pixel unit 24012 that shares the four pixels, which are two pixels in the horizontal and two pixels in the vertical direction, include photodiodes (PDs) $24021_1$, $24021_2$, $24021_3$, and $24021_4$, respectively, and shares one floating diffusion (FD) 24030. The sharing pixel unit 24012 also includes pixel Trs that are transfer Trs $24041_i$ for the PDs $24021_i$ (i=1, 2, 3, and 4), and shared Trs to be shared by the four pixels, which are a reset Tr 24051, an amplification Tr 24052, and a selection Tr 24053.

The FD 24030 is disposed at the center surrounded by the four PDs $24021_1$ through $24021_4$. The FD 24030 is connected to a source/drain region S/D serving as the drain of the reset Tr 24051 and to the gate G of the amplification Tr 24052 via a wiring line 24071. Each transfer Tr $24041_i$ has a gate $24042_i$ disposed between the PD $24021_i$ for the transfer Tr $24041_i$ and the FD 24030 adjacent to the PD $24021_i$, and operates in accordance with a voltage applied to the gate $24042_i$.

Here, the region including the PDs $24021_1$ through $24021_4$, the FD 24030, and the transfer Trs $24041_1$ through $24041_4$ of the sharing pixel units 24012 for each row is called a PD formation region 24061. Also, the region including the reset Tr 24051, the amplification Tr 24052, and the selection Tr 24053 that are shared by four pixels among the pixel Trs of the sharing pixel units 24012 of each row is called a Tr formation region 24062. The respective Tr formation regions 24062 and the respective PD formation regions 24061 that are continuous in the horizontal direction are alternately disposed in the vertical direction of the pixel region 24011.

The reset Tr 24051, the amplification Tr 24052, and the selection Tr 24053 each include a pair of source/drain regions S/D and a gate G. One of the two source/drain regions S/D functions as a source, and the other functions as a drain.

The PDs $24021_1$ through $24021_4$, the FD 24030, the transfer Trs $24041_1$ through $24041_4$, the reset Tr 24051, the amplification Tr 24052, and the selection Tr 24053 are formed in a p-type semiconductor region (p-well) 24210 formed on an n-type semiconductor substrate 24200, for example, as shown in the cross-sectional view in FIG. 75.

As shown in FIG. 74, a pixel separation unit 24101 is formed in each PD formation region 24061, and a device separation unit 24102 is formed in (the region including) each Tr formation region 24062. As shown in FIG. 75, for example, the device separation unit 24102 includes a p-type semiconductor region 24211 formed in the p-type semiconductor region 24210, and an insulating film (a silicon oxide film, for example) 24212 disposed on the surface of the p-type semiconductor region 24211. Although not shown in the drawings, each pixel separation unit 24101 can have a similar configuration.

In the pixel region 24011, well contacts 24111 for applying a fixed voltage to the p-type semiconductor region 24210 are formed. The well contacts 24111 can be designed as p-type semiconductor regions that are impurity diffusion regions formed on the surfaces of p-type semiconductor regions 24231 formed in the p-type semiconductor region 24210. The well contacts 24111 are p-type semiconductor regions having a higher impurity concentration than the p-type semiconductor regions 24231. The well contacts 24111 (and the p-type semiconductor regions 24231 under the well contacts 24111) also serve as the device separation units 24102, and are formed between the shared Trs (the reset Trs 24051, the amplification Trs 24052, and the selection Trs 24053) of the sharing pixel units 24012 horizontally adjacent to each other. The well contacts 24111 are connected to a predetermined wiring line 24242 in a wiring layer 24240 via conductive vias 24241. A predetermined fixed voltage is applied to the p-type semiconductor region 24210 from the wiring line 24242 through the conductive vias 24241 and the well contacts 24111. A plurality of layers of wiring lines 24242 is disposed via an insulating film 24243, to form the wiring layer 24240. Although not shown in the drawings, narrowband filters, color filters, and microlenses are formed on the wiring layer 24240 via a planarizing film.

Figure 76:
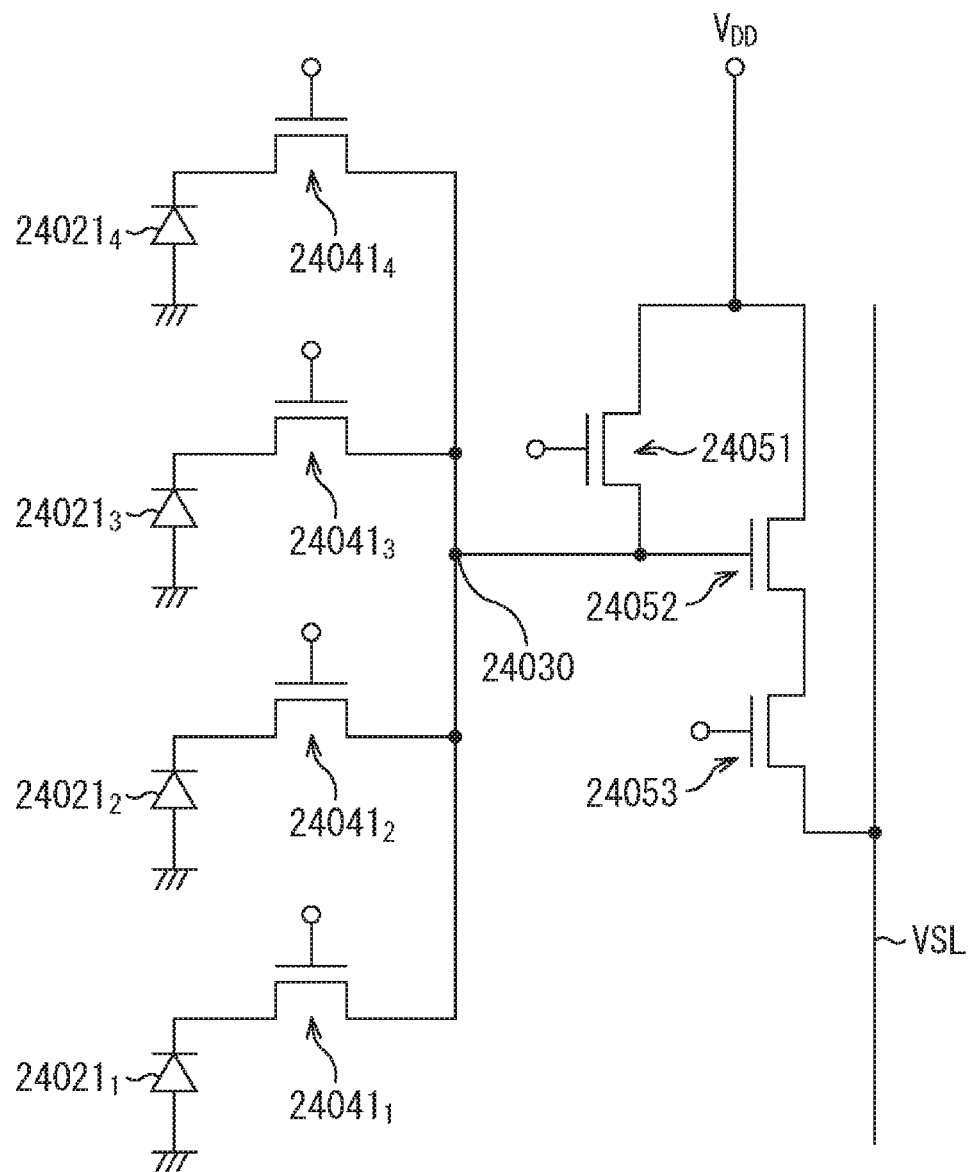

FIG. 76 is a diagram showing an example of an equivalent circuit of a sharing pixel unit 24012 that shares four pixels. In the equivalent circuit of the sharing pixel unit 24012 that shares four pixels, the four PDs $24021_1$ through $24021_4$ are connected to the sources of the corresponding four transfer Trs $24041_1$ through $24041_4$, respectively. The drain of each transfer Tr $24041_i$ is connected to the source of the reset Tr 24051. The drain of each transfer Tr $24041_i$ is the common FD 24030. The FD 24030 is connected to the gate of amplification Tr 24052. The source of the amplification Tr 24052 is connected to the drain of the selection Tr 24053. The drain of the reset Tr 24051 and the drain of the amplification Tr 24052 are connected to a power supply VDD. The source of the selection Tr 24053 is connected to a vertical signal line (VSL).

Note that the technology according to the present disclosure can be applied not only to the examples described above, but also to a solid-state imaging device that shares a plurality of pixels in any appropriate arrangement such as two pixels in the horizontal direction and four pixels in the vertical direction, or one pixel in the horizontal direction and four pixels in the vertical direction, for example.

Further, a plurality of pixels may be shared in the normal pixel region and/or the narrowband pixel region, to reduce the area of the transistors. With this arrangement, the light reception area becomes larger, and thus, a higher image quality and a higher accuracy in detecting spectral characteristics are achieved, for example. Alternatively, the number of pixels may be increased, to achieve a higher resolution.

The technology according to the present disclosure can be applied to the solid-state imaging devices as described above.

Note that, in the filter layers shown in FIGS. 69, 70, 72, and 73, for example, color filters and metallic narrowband filters are provided, as in the filter layer 20012 shown in FIG. 68.

Note that embodiments of the present technology are not limited to the embodiments described above, and various modifications may be made to them without departing from the scope of the present technology.

<Example Combinations of Configurations>

The present technology can also be embodied in the configurations described below, for example.

(1)

A semiconductor device including:

a pixel unit in which a first pixel including a metallic filter and a second pixel not including the metallic filter are disposed adjacent to each other; and a reflected light reduction unit that reduces reflected light on a sidewall of the metallic filter at a boundary portion between the first pixel and the second pixel.

(2)

The semiconductor device according to (1), in which the reflected light reduction unit is disposed at a position closer to a light incident surface of the semiconductor device than the metallic filter, and includes a light absorber that overlaps at least one of the first pixel or the second pixel adjacent to the boundary portion.

(3)

The semiconductor device according to (2), in which the second pixel includes a non-metallic filter, and the light absorber is disposed at a position closer to the light incident surface of the semiconductor device than the metallic filter and the non-metallic filter.

(4)

The semiconductor device according to (3), in which the non-metallic filter is disposed at a position closer to the light incident surface of the semiconductor device than the metallic filter.

(5)

The semiconductor device according to (2) or (3), in which the light absorber is a black filter. (6)

The semiconductor device according to (2) or (3), in which the light absorber is an optical filter in which a red filter and a blue filter are stacked.

(7)

The semiconductor device according to any one of (2) to (6), in which an angle between a plane and the sidewall is not smaller than a maximum incident angle of light incident on the sidewall, the plane connecting a side of a face of the light absorber that is on the opposite side from a light incident surface of the light absorber and is located on a side of the second pixel, to a side of the sidewall that is on the opposite side from a light incident surface of the metallic filter.

(8)

The semiconductor device according to any one of (1) to (7), in which the reflected light reduction unit includes a light absorber that covers at least part of the sidewall.

(9)

The semiconductor device according to (8), in which the light absorber is a black filter.

(10)

The semiconductor device according to (8), in which the light absorber is an optical filter in which a red filter and a blue filter are stacked.

(11)

The semiconductor device according to any one of (1) to (7), in which the reflected light reduction unit includes a low-reflection film that has a lower reflectance than a metal forming the metallic filter and covers at least part of the sidewall.

(12)

The semiconductor device according to any one of (1) to (7), in which the reflected light reduction unit includes the sidewall that is inclined so as to move away from the boundary portion in a direction of the first pixel as a distance from a light incident surface of the metallic filter increases.

(13)

The semiconductor device according to (12), in which
an inclination angle of the sidewall with respect to the light incident surface of the metallic filter is not greater than (90°−the maximum incident angle of light incident on the sidewall).

(14)

The semiconductor device according to any one of (1) to (13), in which
an antireflective film that surrounds at least part of a periphery of the first pixel and reduces reflected light is formed on a light incident surface of the metallic filter.

(15)

The semiconductor device according to (14), in which
the antireflective film is a black filter.

(16)

The semiconductor device according to any one of (1) to (15), in which
the metallic filter is a plasmon filter.

(17)

The semiconductor device according to any one of (1) to (16), in which
the metallic filter is a Fabry-Perot.

(18)

An electronic apparatus including:
a semiconductor device; and
a signal processing unit that processes a signal output from the semiconductor device,
in which the semiconductor device includes:
a pixel unit in which a first pixel including a metallic filter and a second pixel not including the metallic filter are disposed adjacent to each other; and
a reflected light reduction unit that reduces reflected light on a sidewall of the metallic filter at a boundary portion between the first pixel and the second pixel.

Note that the advantageous effects described in this specification are merely examples, and the advantageous effects of the present technology are not limited to them and may include other effects.

REFERENCE SIGNS LIST

10 Imaging apparatus
11 Optical system
12, 12A to 12C Imaging device
14 Signal processing unit
31 Pixel array
31A Normal pixel region
31B Narrowband pixel region
31C Reflected light reduction unit
31D Invalid pixel region
51 Pixel
51A Normal pixel
51B Narrowband pixel
103 Filter layer
105 Photoelectric conversion element layer v121A to 121E,
151, 171 Plasmon filter
201A to 201C Black filter
211 Optical filter
211R Red filter
211B Blue filter
221A to 221C Black filter
231A to 231C Low-reflection film
301 Image circle
402 Semiconductor chip
421 Antireflective film
501 Fabry-Perot 600 Electronic apparatus
603 Imaging device
CF Color filter
NB Narrowband filter
SW1 to SW3 Sidewall
PD Photodiode
B1 Boundary portion

The invention claimed is:

1. A semiconductor device comprising:
a pixel unit in which a first pixel including a metallic filter and a second pixel not including the metallic filter are disposed adjacent to each other; and
a reflected light reduction unit that reduces reflected light on a sidewall of the metallic filter at a boundary portion between the first pixel and the second pixel.

2. The semiconductor device according to claim 1, wherein
the reflected light reduction unit is disposed at a position closer to a light incident surface of the semiconductor device than the metallic filter, and includes a light absorber that overlaps at least one of the first pixel or the second pixel adjacent to the boundary portion.

3. The semiconductor device according to claim 2, wherein
the second pixel includes a non-metallic filter, and
the light absorber is disposed at a position closer to the light incident surface of the semiconductor device than the metallic filter and the non-metallic filter.

4. The semiconductor device according to claim 3, wherein
the non-metallic filter is disposed at a position closer to the light incident surface of the semiconductor device than the metallic filter.

5. The semiconductor device according to claim 2, wherein
the light absorber includes a black filter.

6. The semiconductor device according to claim 2, wherein
the light absorber includes an optical filter in which a red filter and a blue filter are stacked.

7. The semiconductor device according to claim 2, wherein
an angle between a plane and the sidewall is not smaller than a maximum incident angle of light incident on the sidewall, the plane connecting a side of a face of the light absorber that is on the opposite side from a light incident surface of the light absorber and is located on a side of the second pixel, to a side of the sidewall that is on the opposite side from a light incident surface of the metallic filter.

8. The semiconductor device according to claim 1, wherein
the reflected light reduction unit includes a light absorber that covers at least part of the sidewall.

9. The semiconductor device according to claim 8, wherein
the light absorber includes a black filter.

10. The semiconductor device according to claim 8, wherein
the light absorber includes an optical filter in which a red filter and a blue filter are stacked.

11. The semiconductor device according to claim 1, wherein
the reflected light reduction unit includes a low-reflection film that has a lower reflectance than a metal forming the metallic filter and covers at least part of the sidewall.

12. The semiconductor device according to claim 1, wherein
the reflected light reduction unit includes the sidewall that is inclined so as to move away from the boundary portion in a direction of the first pixel as a distance from a light incident surface of the metallic filter increases.

13. The semiconductor device according to claim 12, wherein
an inclination angle of the sidewall with respect to the light incident surface of the metallic filter is not greater than (90°−the maximum incident angle of light incident on the sidewall).

14. The semiconductor device according to claim 1, wherein
an antireflective film that surrounds at least part of a periphery of the first pixel and reduces reflected light is formed on a light incident surface of the metallic filter.

15. The semiconductor device according to claim 14, wherein
the antireflective film includes a black filter.

16. The semiconductor device according to claim 1, wherein
the metallic filter includes a plasmon filter.

17. The semiconductor device according to claim 1, wherein
the metallic filter includes a Fabry-Perot.

18. An electronic apparatus comprising:
a semiconductor device; and
a signal processing unit that processes a signal output from the semiconductor device,
wherein the semiconductor device includes:
a pixel unit in which a first pixel including a metallic filter and a second pixel not including the metallic filter are disposed adjacent to each other; and
a reflected light reduction unit that reduces reflected light on a sidewall of the metallic filter at a boundary portion between the first pixel and the second pixel.

\* \* \* \* \*